United States Patent
Nishikawa et al.

(10) Patent No.: US 10,475,804 B1
(45) Date of Patent: Nov. 12, 2019

(54) THREE-DIMENSIONAL MEMORY DEVICE CONTAINING MULTILEVEL DRAIN SELECT GATE ISOLATION AND METHODS OF MAKING THE SAME

(71) Applicant: SANDISK TECHNOLOGIES LLC, Addison, TX (US)

(72) Inventors: Masatoshi Nishikawa, Yokkaichi (JP); Shinsuke Yada, Yokkaichi (JP); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/019,821

(22) Filed: Jun. 27, 2018

(51) Int. Cl.
*H01L 27/11556* (2017.01)
*H01L 27/11519* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC ......... H01L 27/11556; H01L 27/11565; H01L 27/11582; H01L 27/11524;
(Continued)

(56) References Cited

U.S. PATENT DOCUMENTS 5,915,167 A    6/1999   Leedy
9,922,987 B1   3/2018   Mizutani et al.
(Continued)

FOREIGN PATENT DOCUMENTS

KR    10-1182942 B1      9/2012
KR    10-2016-0120990 A   10/2016

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Galina G Yushina
(74) *Attorney, Agent, or Firm* — The Marbury Law Group, PLLC

(57) ABSTRACT

A three-dimensional memory device includes an alternating stack of insulating layers and word-line-level electrically conductive layers located over a substrate, and a drain-select-level electrically conductive layer located over the alternating stack. Memory stack structures extend through the alternating stack and the drain-select-level electrically conductive layer. Dielectric divider structures including a respective pair of straight sidewalls and drain-select-level isolation structures including a respective pair of sidewalls that include a respective set of concave vertical sidewall segments divide the drain-select-level electrically conductive layer into multiple strips. The drain-select-level electrically conductive layer and the drain-select-level isolation structures are formed by replacement of a drain-select-level sacrificial material layer with a conductive material and by replacement of drain-select-level sacrificial line structures with dielectric material portions.

3 Claims, 55 Drawing Sheets

(51) Int. Cl.
  *H01L 27/11524* (2017.01)
  *H01L 29/423* (2006.01)
  *H01L 27/11582* (2017.01)
  *H01L 27/1157* (2017.01)
  *H01L 27/11565* (2017.01)

(52) U.S. Cl.
  CPC .. *H01L 27/11524* (2013.01); *H01L 27/11565* (2013.01); *H01L 27/11582* (2013.01); *H01L 29/4234* (2013.01); *H01L 29/42324* (2013.01)

(58) Field of Classification Search
  CPC ........... H01L 27/11519; H01L 27/1157; H01L 29/42324; H01L 29/4234; H03K 19/20; G11C 16/02
  See application file for complete search history.

(56) References Cited

U.S. PATENT DOCUMENTS

| | | | |
|---|---|---|---|
| 9,972,640 | B1 | 5/2018 | Kai et al. |
| 9,972,641 | B1 | 5/2018 | Zhang et al. |
| 2016/0111435 | A1 | 4/2016 | Pang et al. |
| 2017/0236896 | A1* | 8/2017 | Lu ........................ H01L 29/0649 257/314 |
| 2017/0278571 | A1* | 9/2017 | Chowdhury ....... G11C 16/0483 |
| 2017/0358593 | A1* | 12/2017 | Yu ........................ H01L 23/5226 |
| 2018/0097009 | A1 | 4/2018 | Zhang et al. |
| 2018/0108671 | A1 | 4/2018 | Yu et al. |
| 2018/0138189 | A1* | 5/2018 | Kai ................... H01L 27/11519 |
| 2018/0138193 | A1* | 5/2018 | Zhang ............... H01L 27/11582 |
| 2018/0138194 | A1 | 5/2018 | Shigemura et al. |

OTHER PUBLICATIONS

U.S. Appl. No. 15/628,495, dated Jun. 20, 2017, SanDisk Technologies.
U.S. Appl. No. 15/685,254, dated Aug. 24, 2017, SanDisk Technologies.
U.S. Appl. No. 15/704,286, dated Sep. 14, 2017, SanDisk Technologies.
U.S. Appl. No. 15/784,549, dated Oct. 16, 2017, SanDisk Technologies.
U.S. Appl. No. 15/818,061, dated Nov. 20, 2017, SanDisk Technologies.
U.S. Appl. No. 15/818,146, dated Nov. 20, 2017, SanDisk Technologies.
U.S. Appl. No. 15/850,073, dated Dec. 21, 2017, SanDisk Technologies.
U.S. Appl. No. 15/865,892, dated Jan. 9, 2018, SanDisk Technologies.
U.S. Appl. No. 15/888,714, dated Feb. 5, 2018, SanDisk Technologies.
U.S. Appl. No. 15/906,109, dated Feb. 27, 2018, SanDisk Technologies.
U.S. Appl. No. 16/019,856, dated Jun. 27, 2018, SanDisk Technologies.
Notification of Transmittal of the International Search Report and Written Opinion of the International Search Authority or International Patent Application No. PCT/US2019/020127, dated Jun. 14, 2019, 10 pages.

* cited by examiner

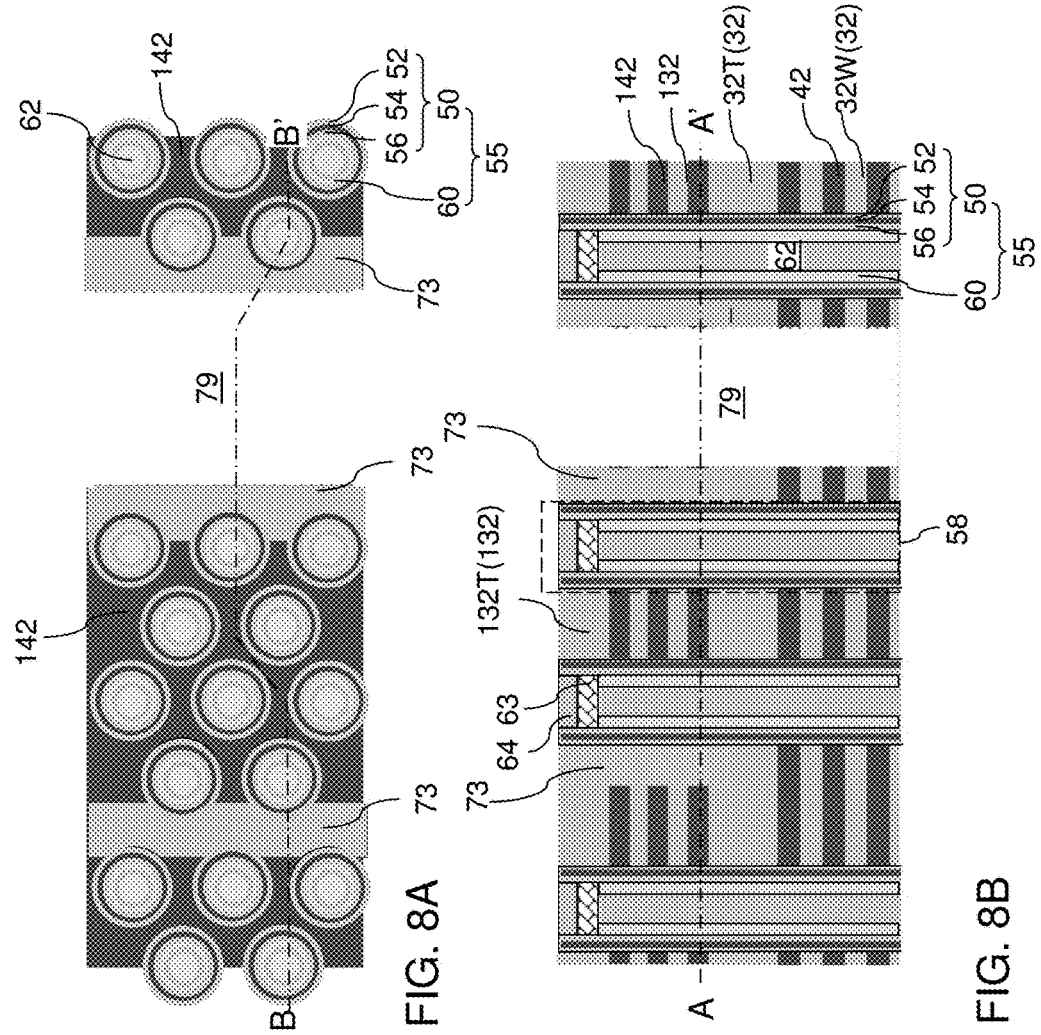

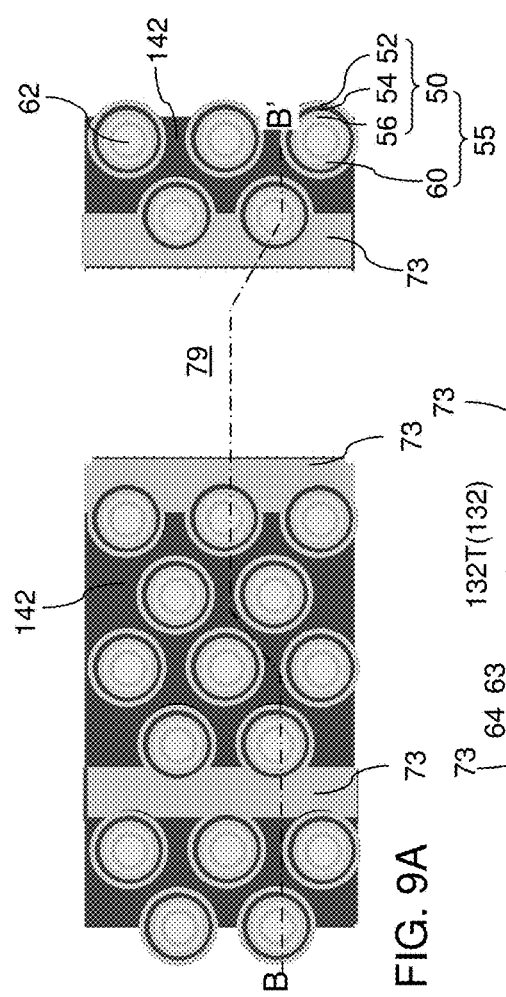
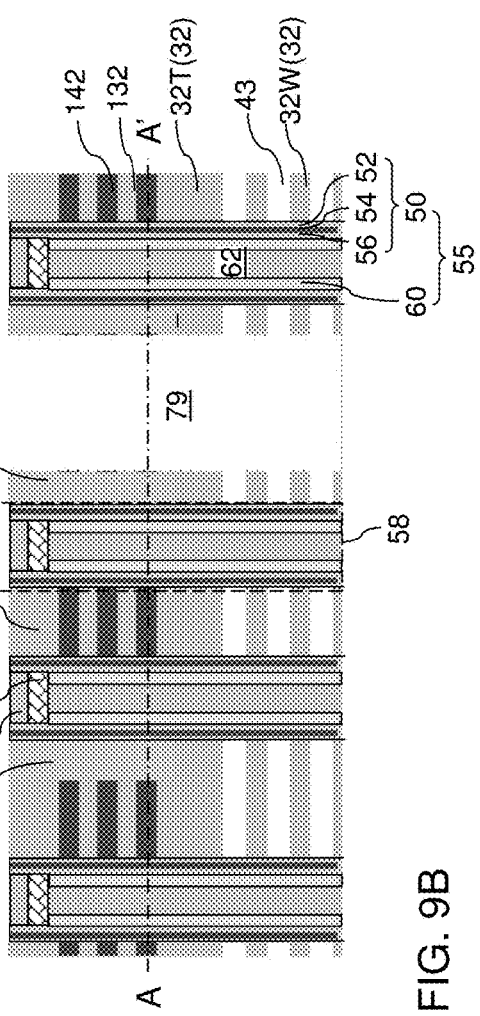
FIG. 9A
FIG. 9B

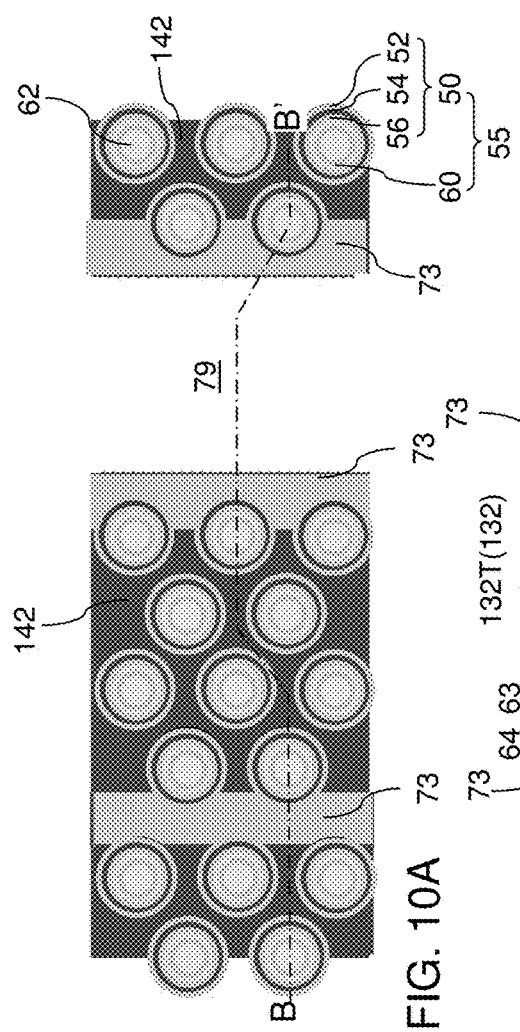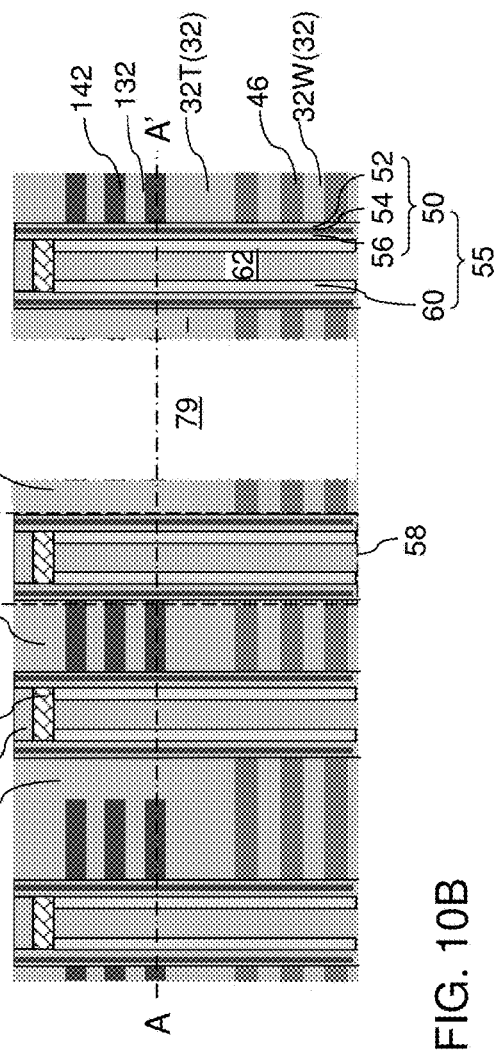

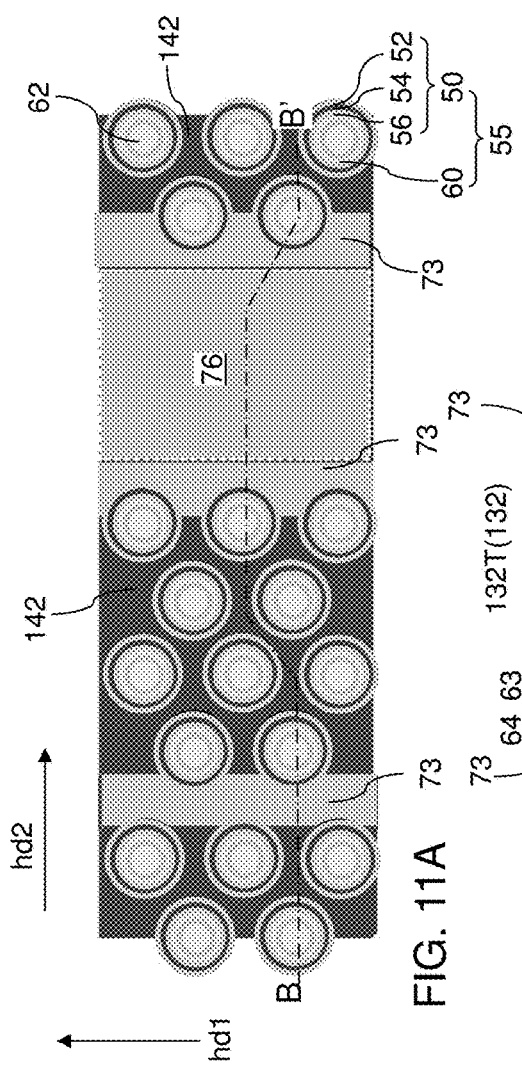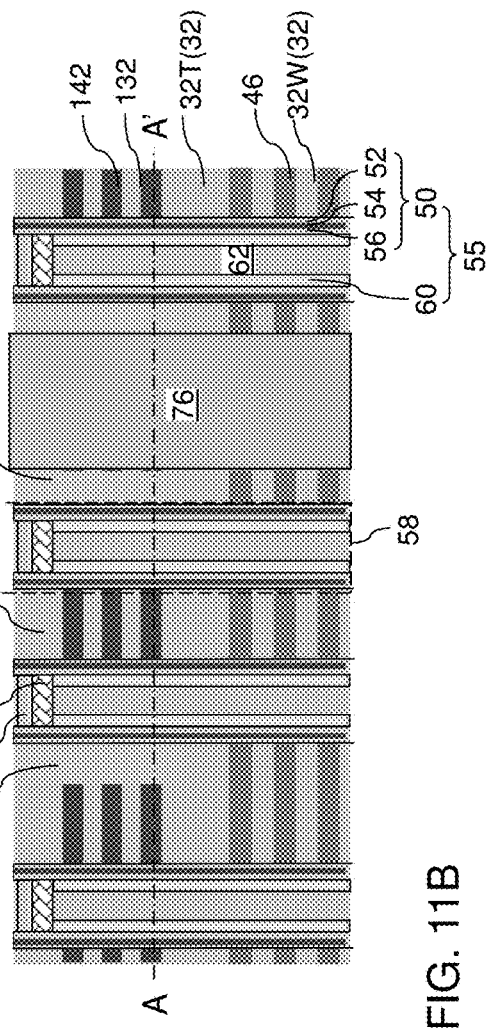
FIG. 11A
FIG. 11B

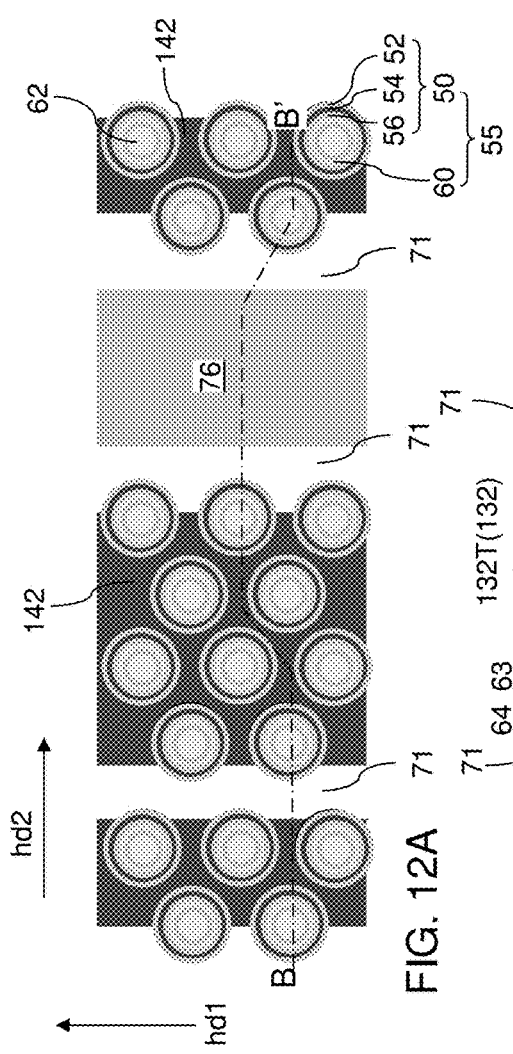
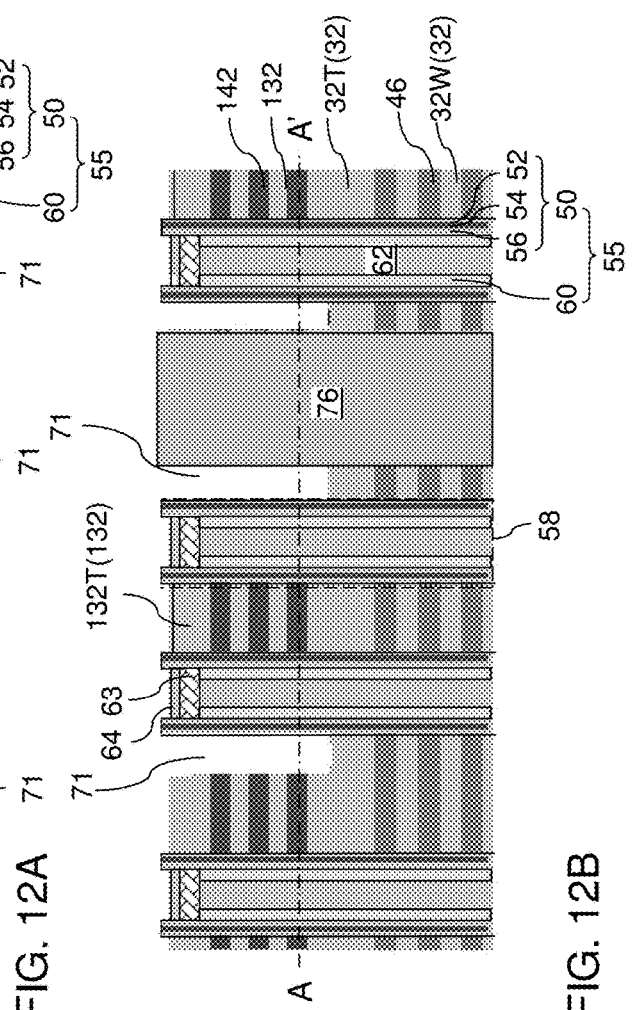
FIG. 12A
FIG. 12B

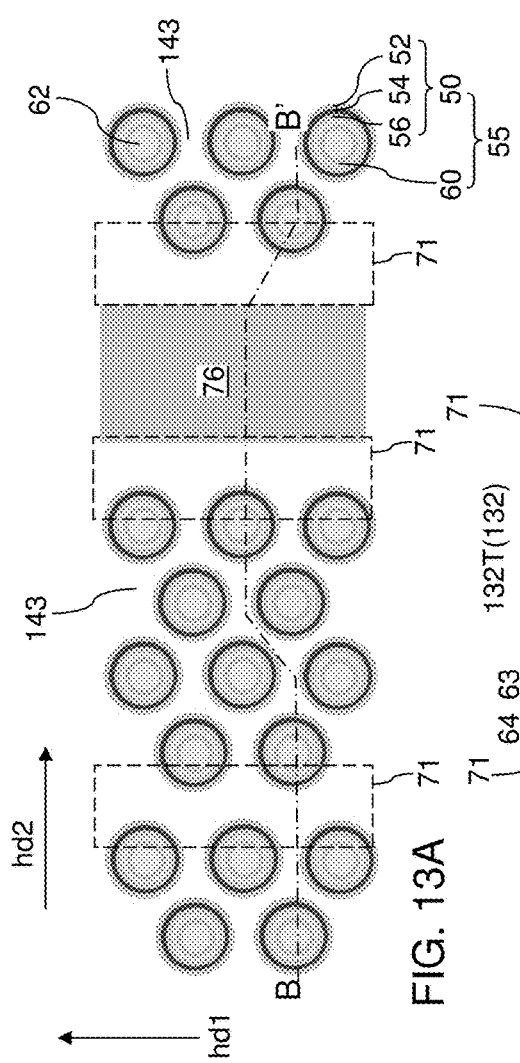
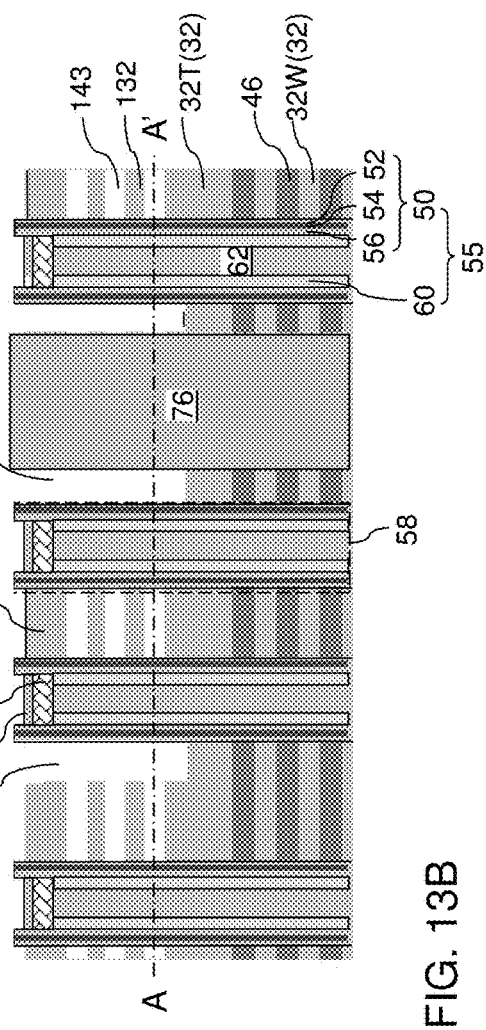
FIG. 13A
FIG. 13B

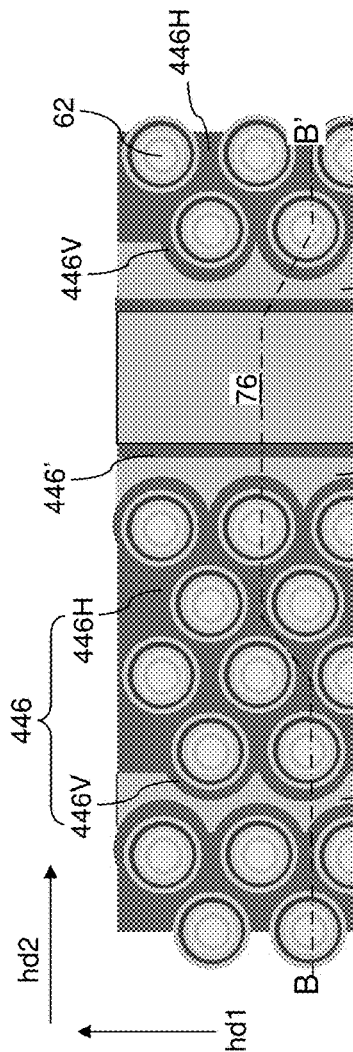
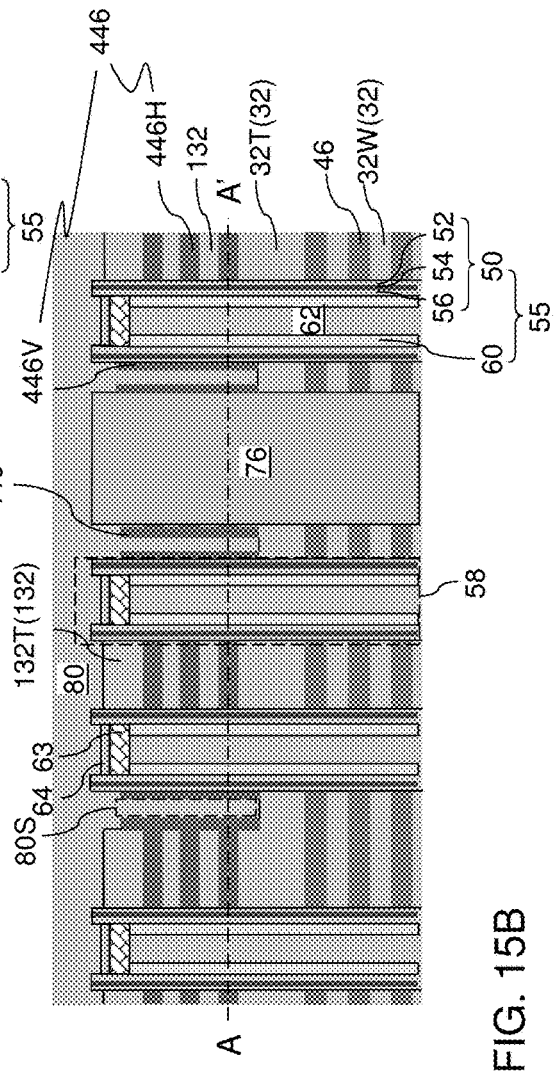
FIG. 15A
FIG. 15B

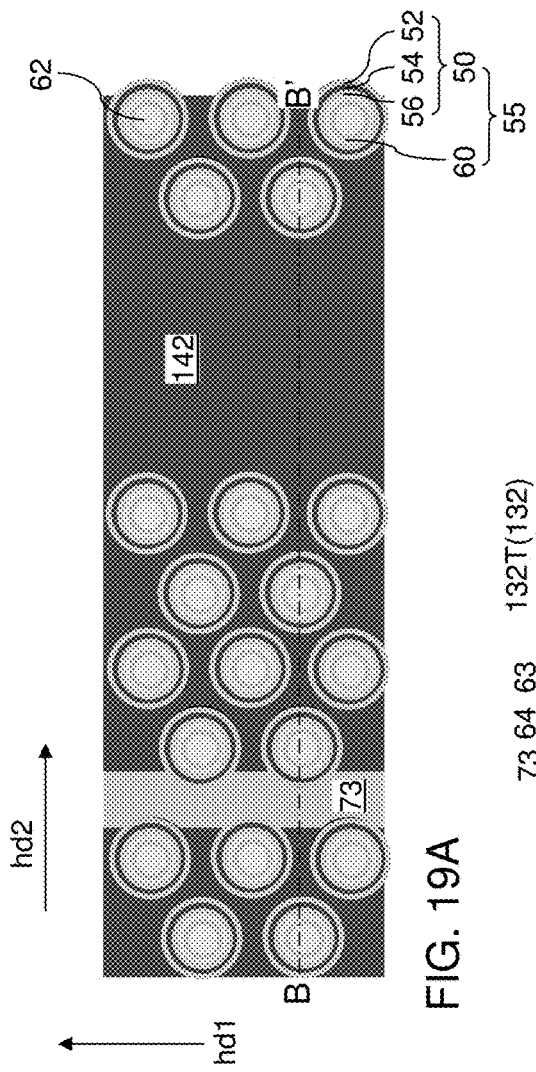
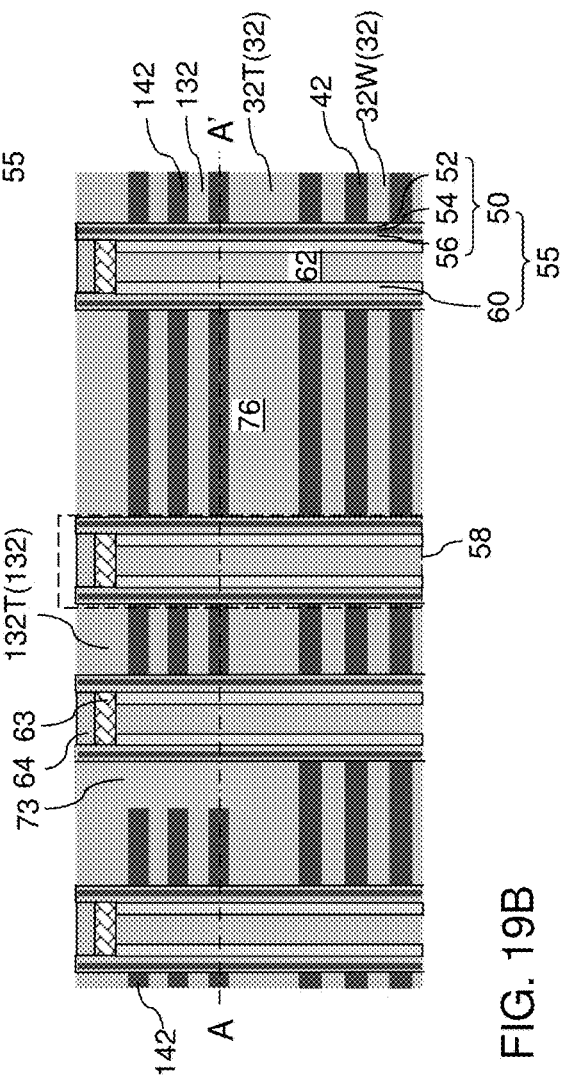
FIG. 19A
FIG. 19B

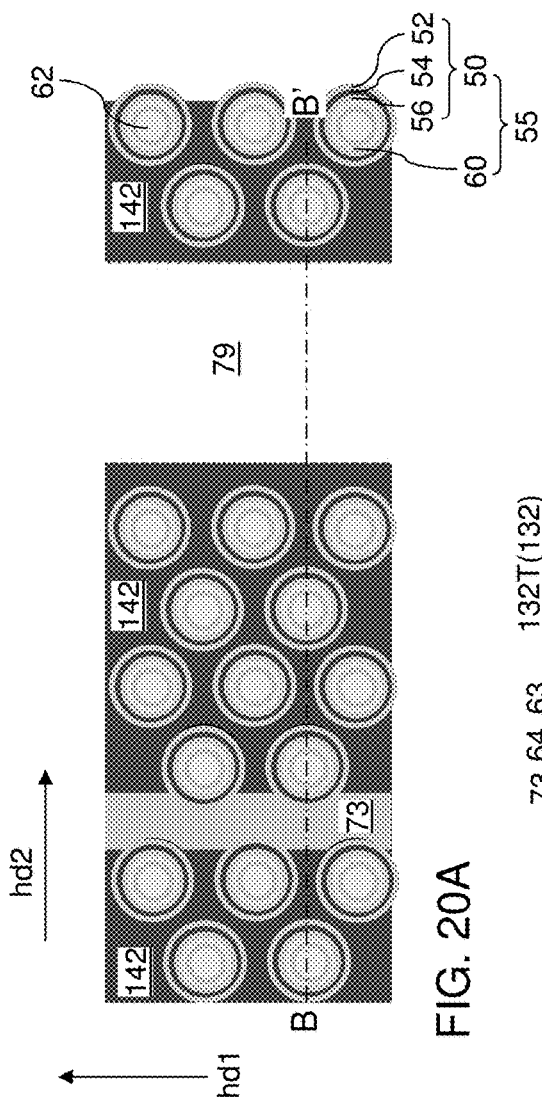
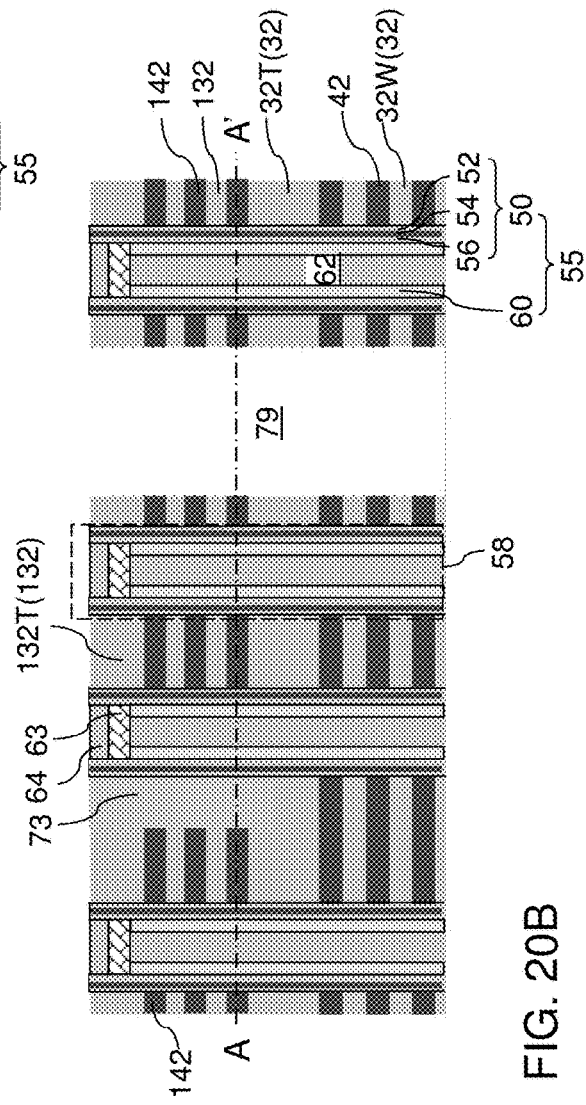
FIG. 20A
FIG. 20B

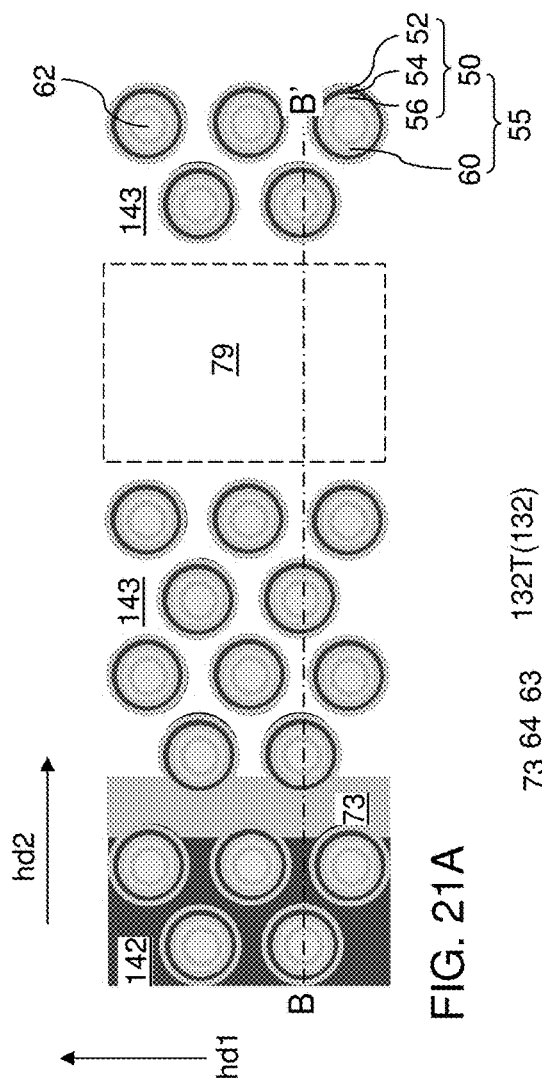
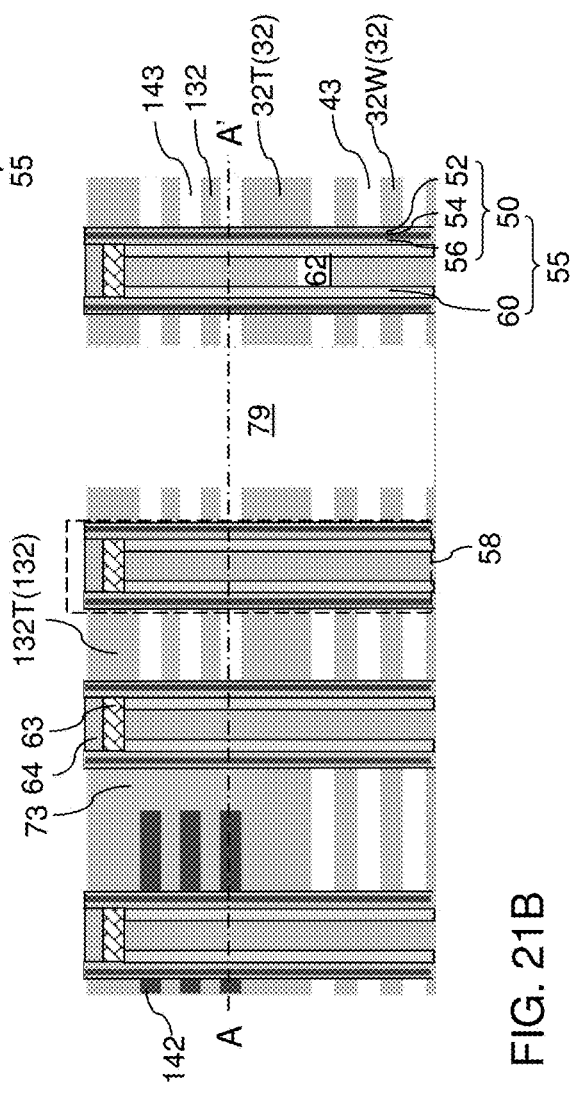
FIG. 21A
FIG. 21B

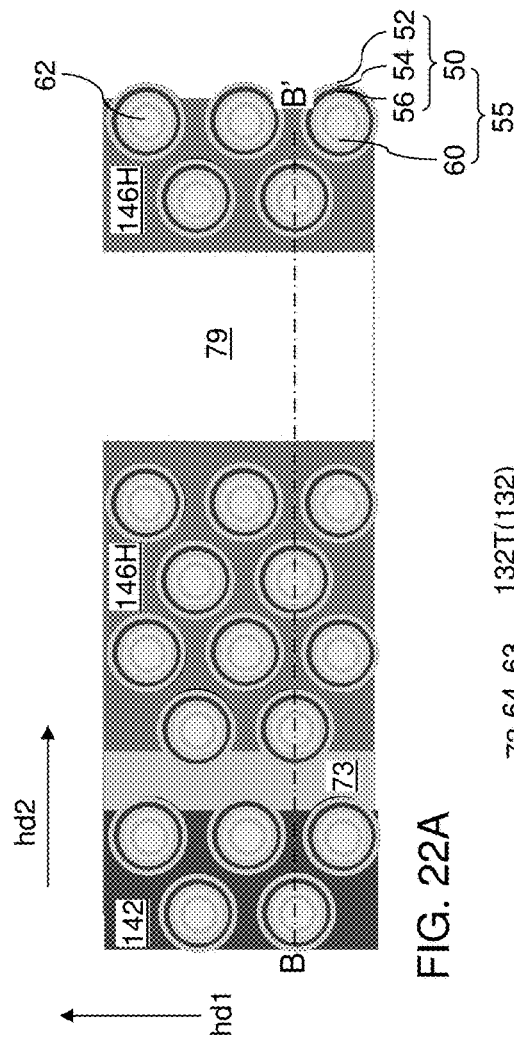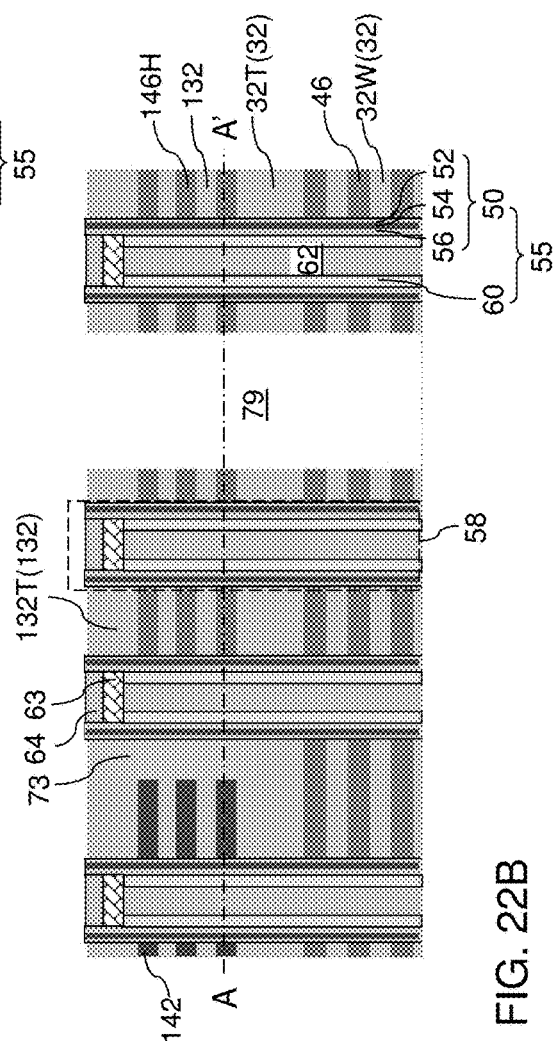
FIG. 22A
FIG. 22B

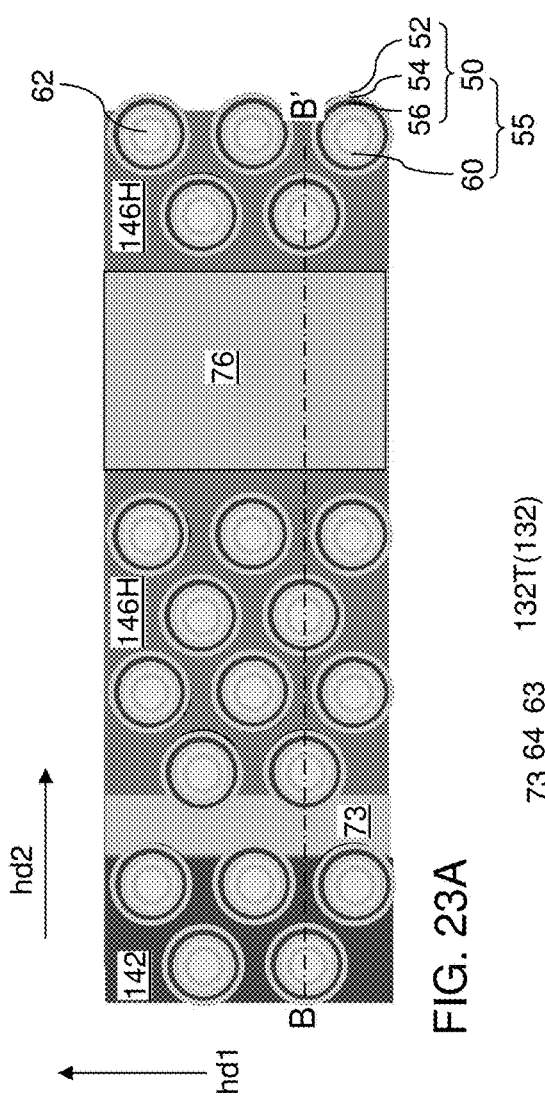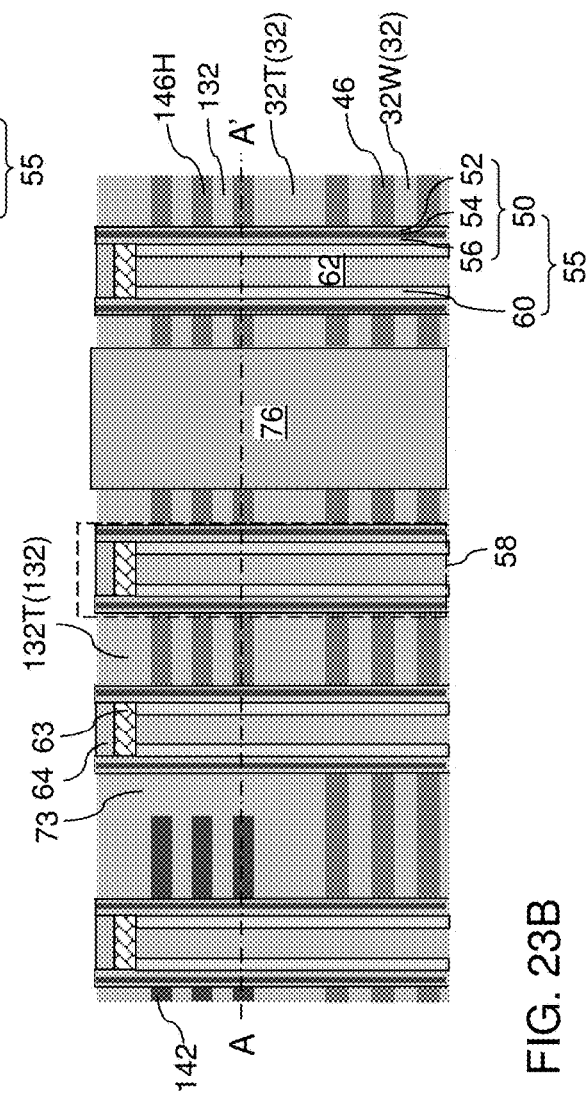
FIG. 23A
FIG. 23B

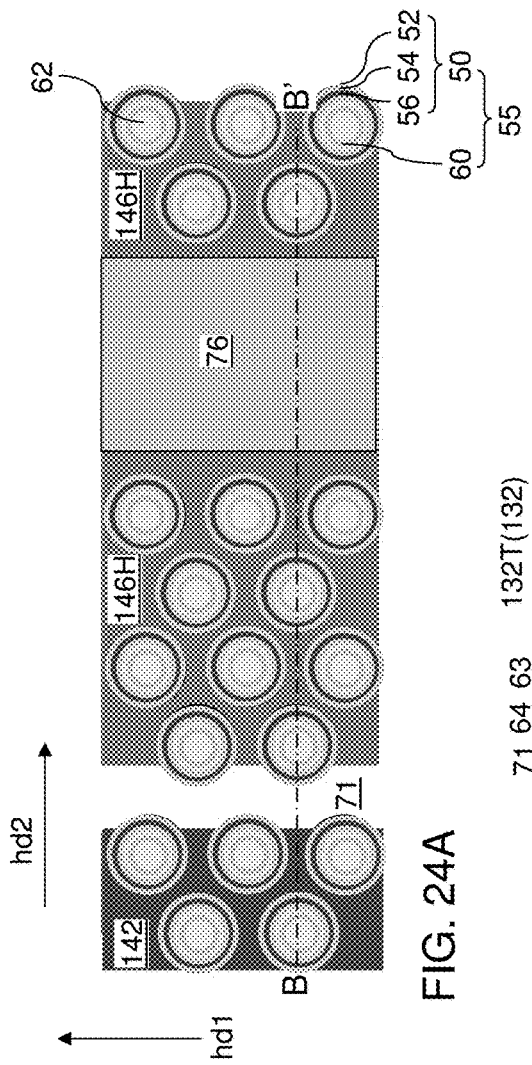
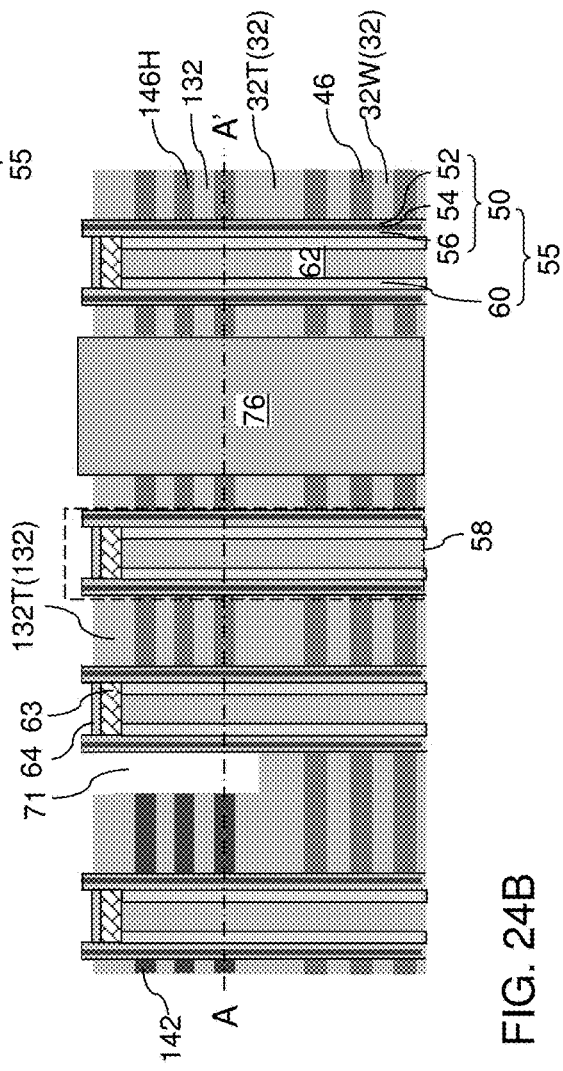
FIG. 24A
FIG. 24B

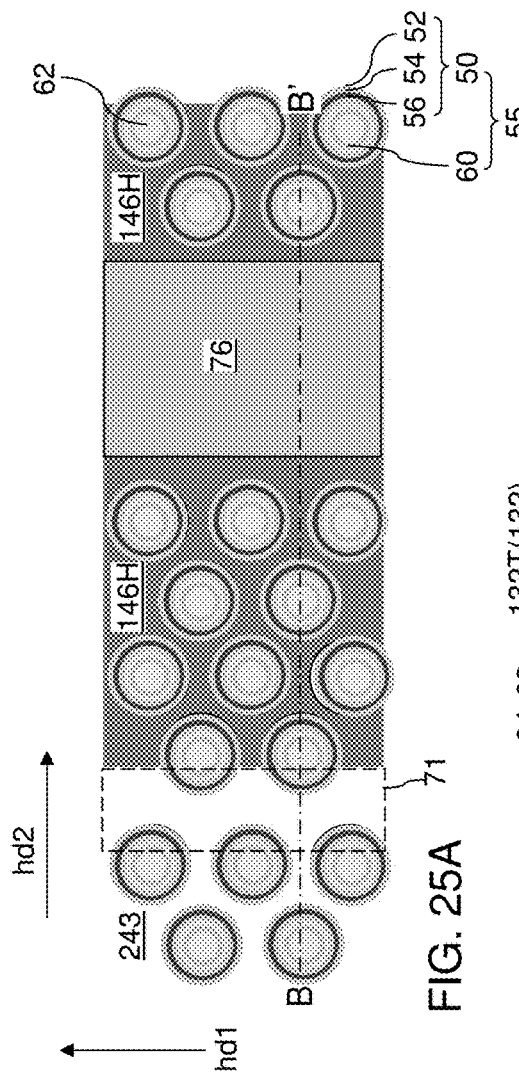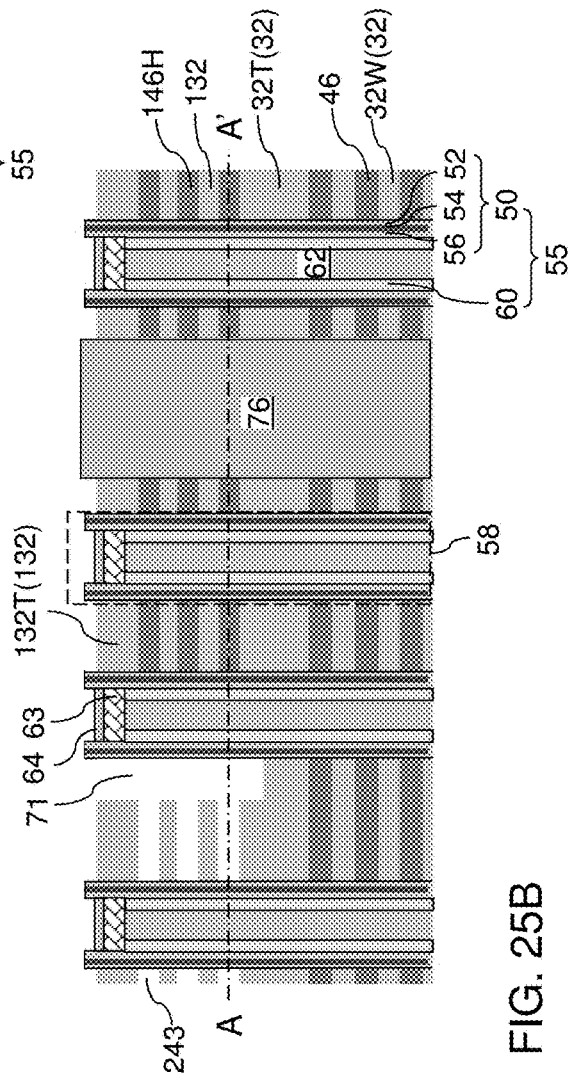
FIG. 25A
FIG. 25B

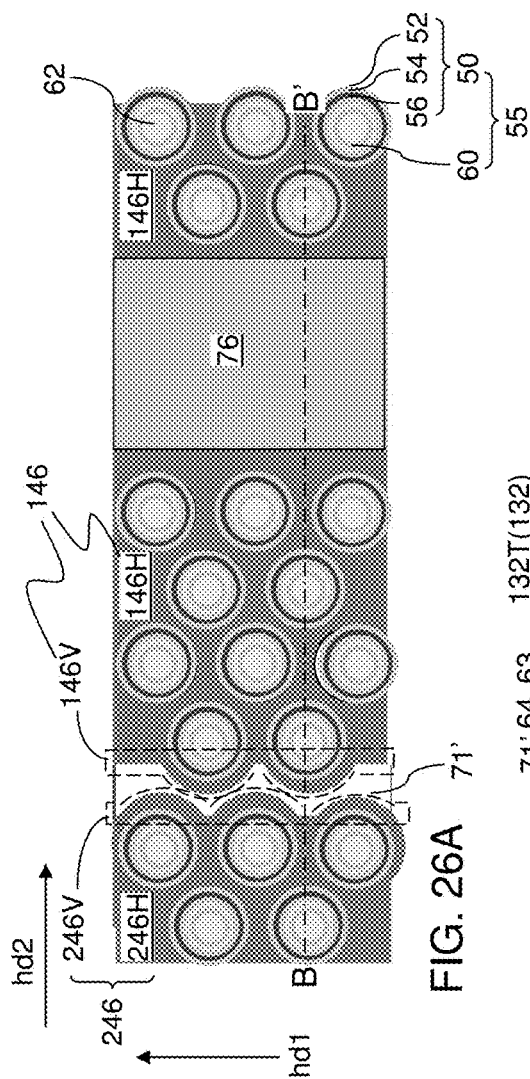
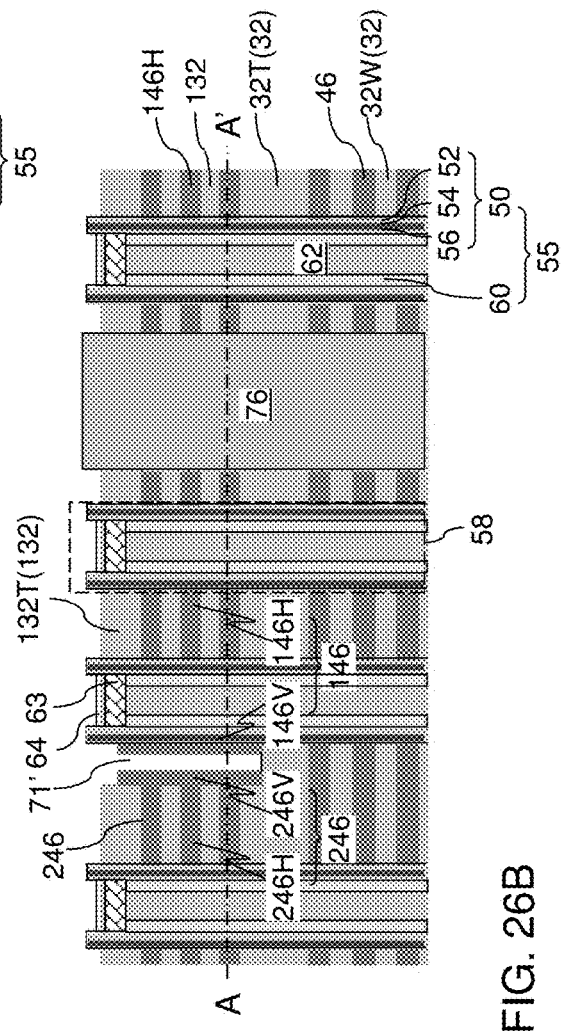

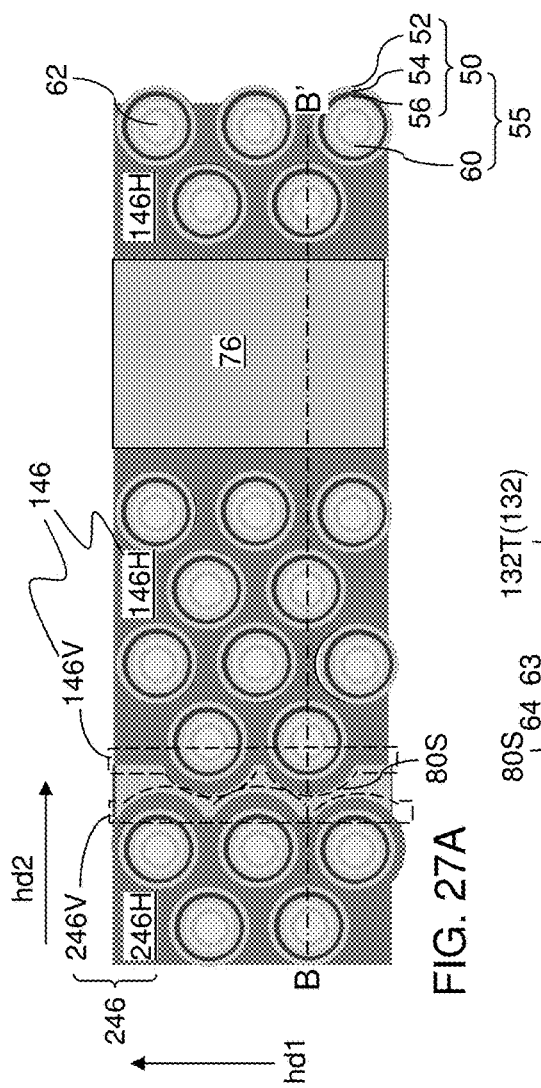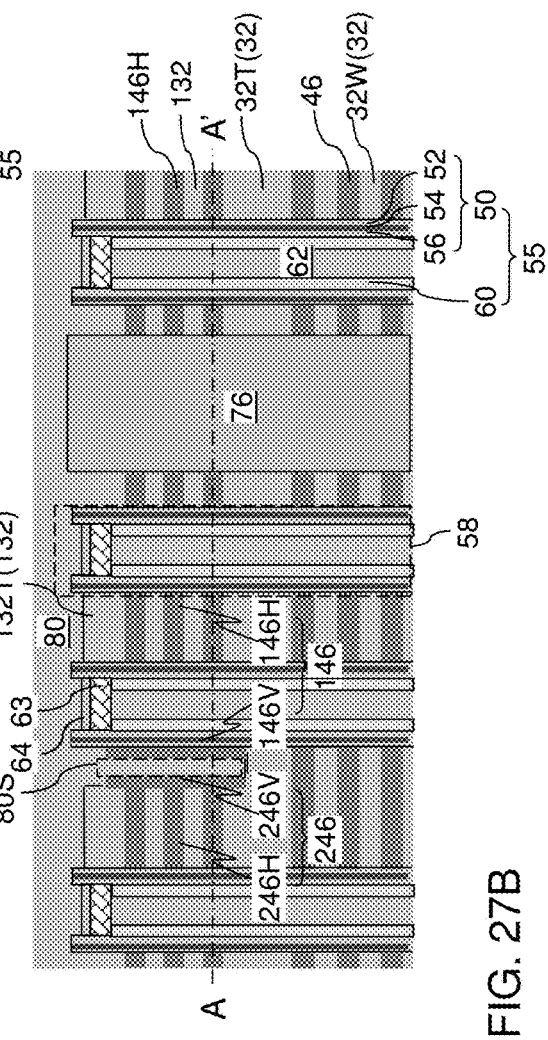
FIG. 27A
FIG. 27B

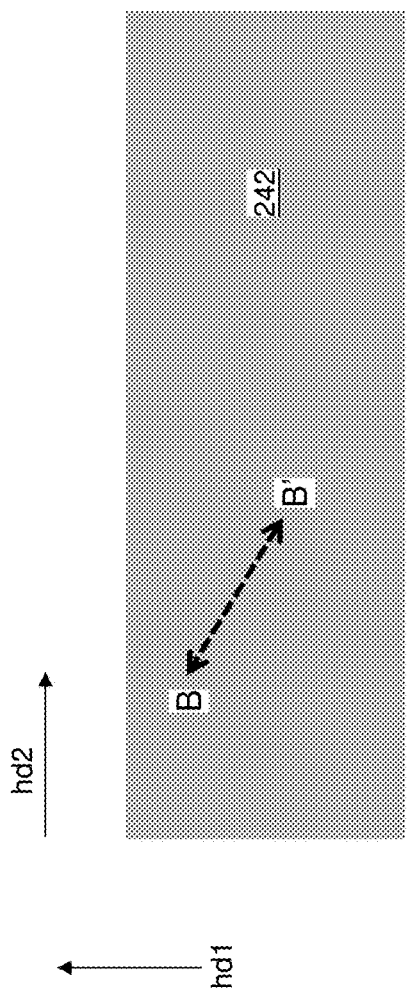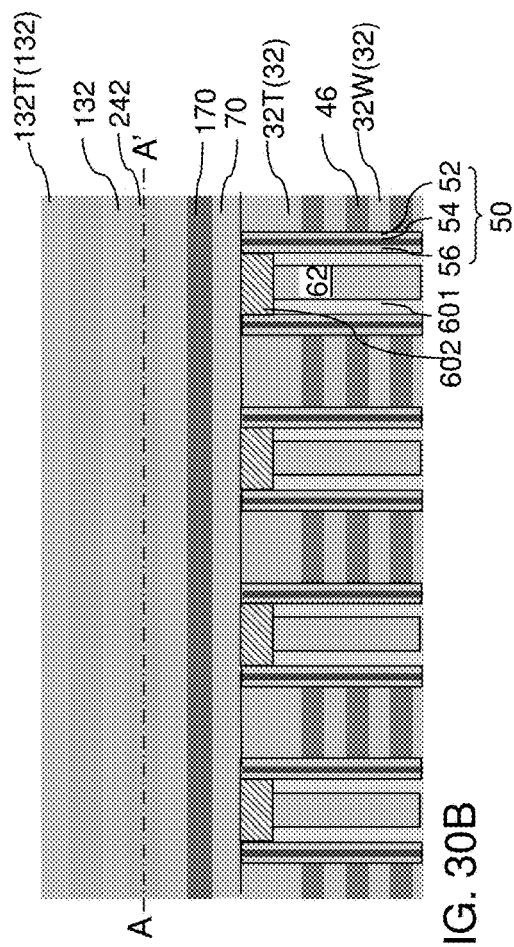
FIG. 30A
FIG. 30B

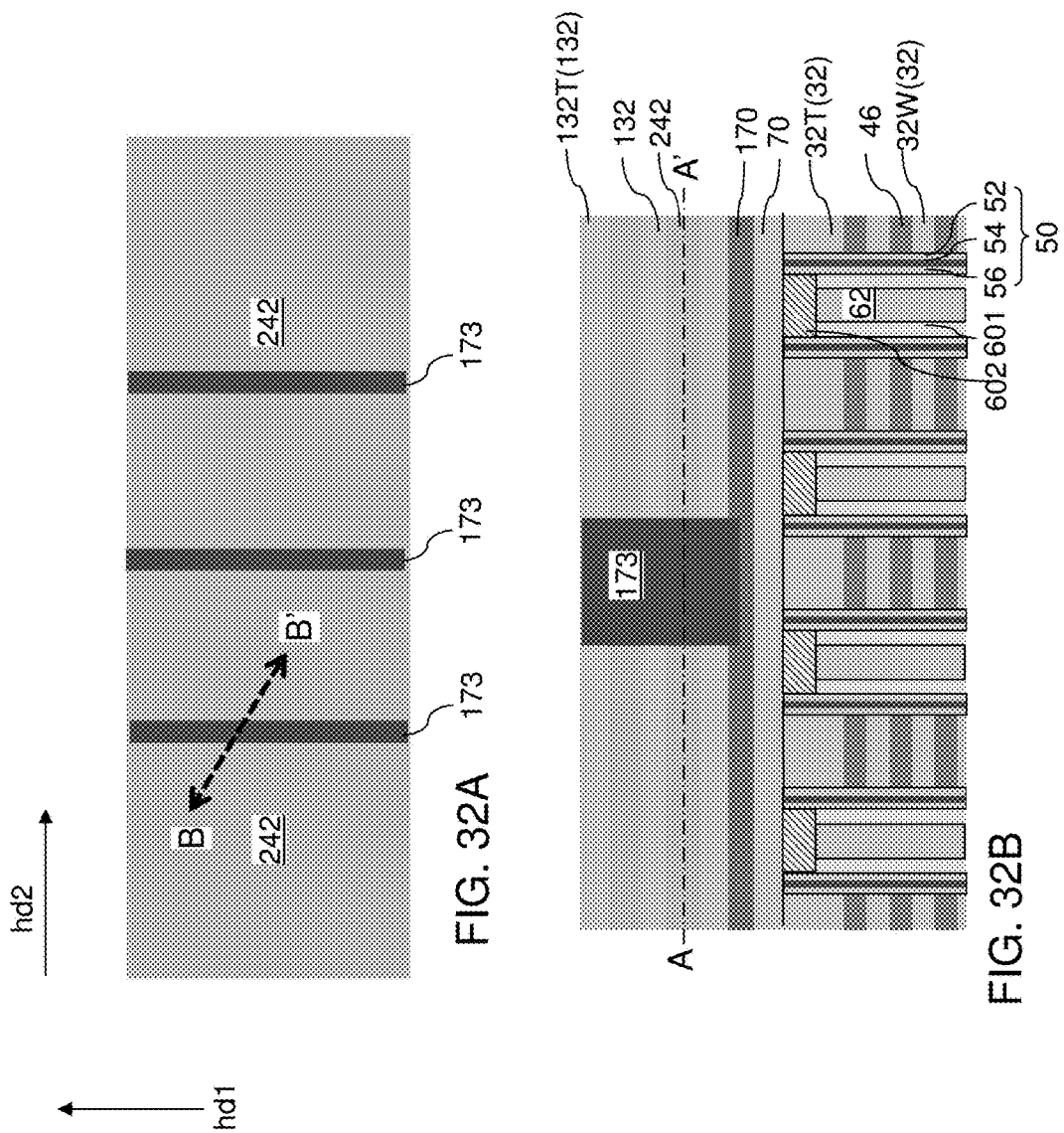

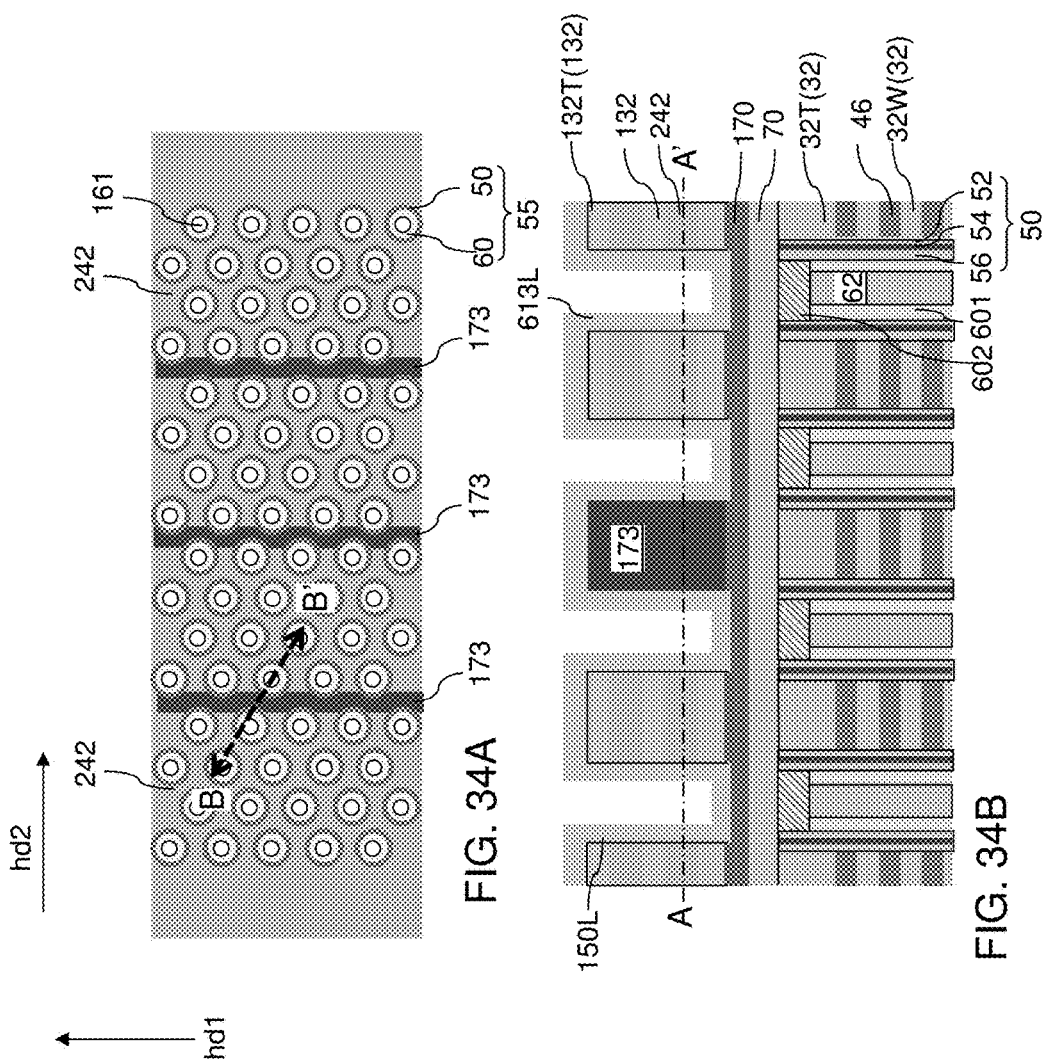

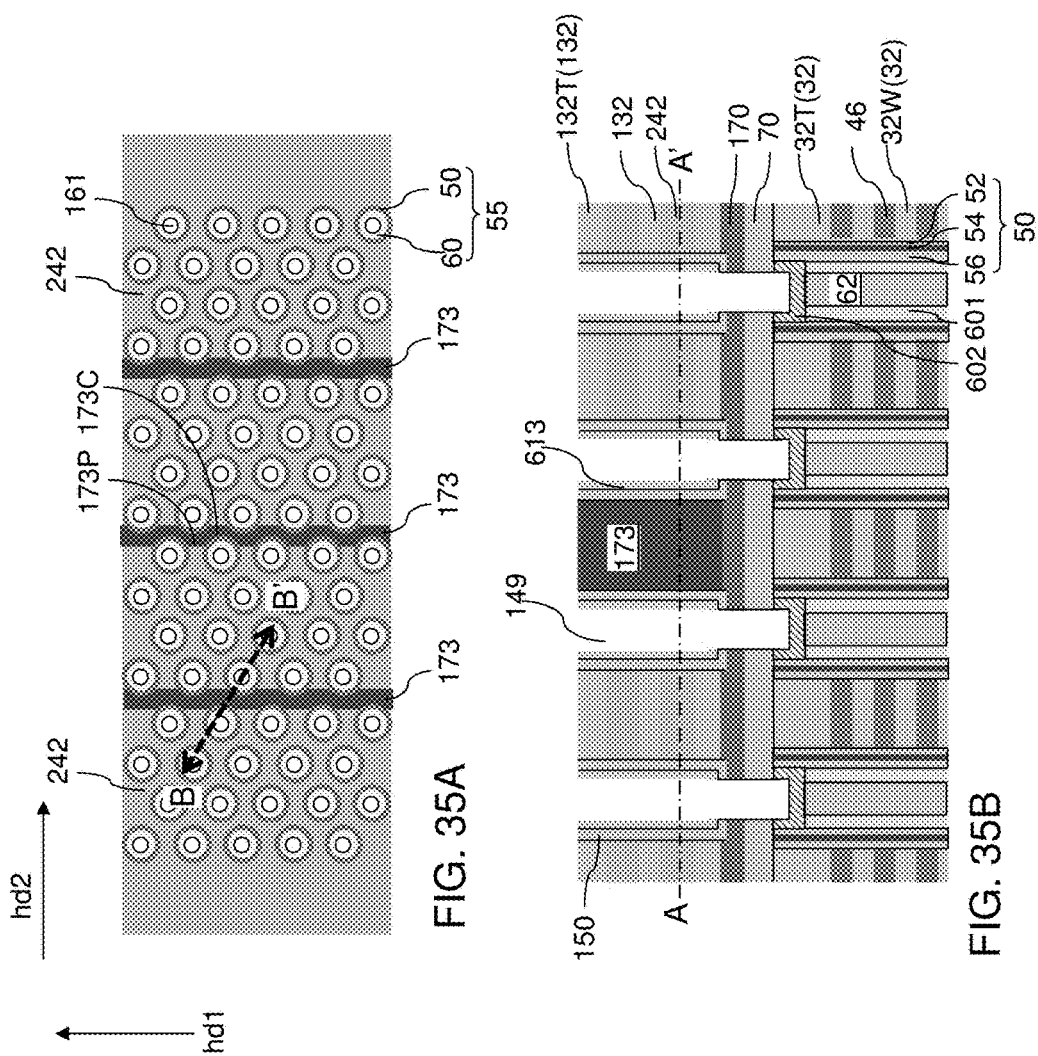

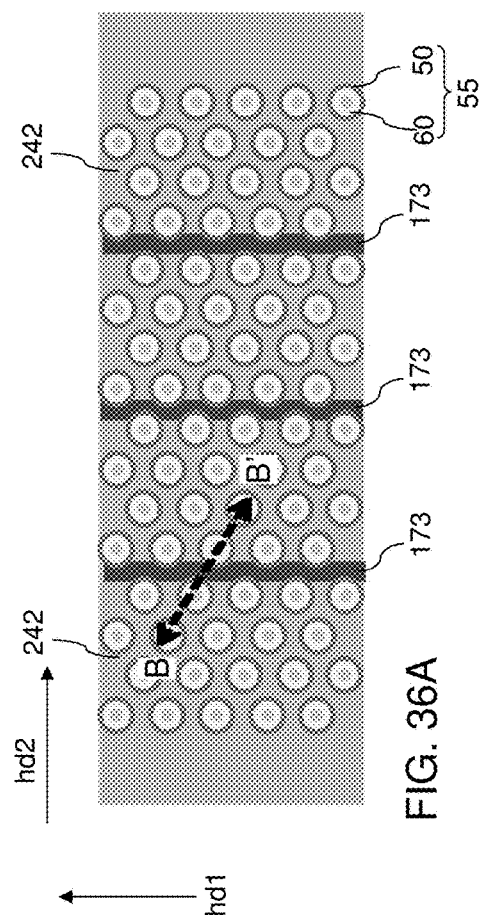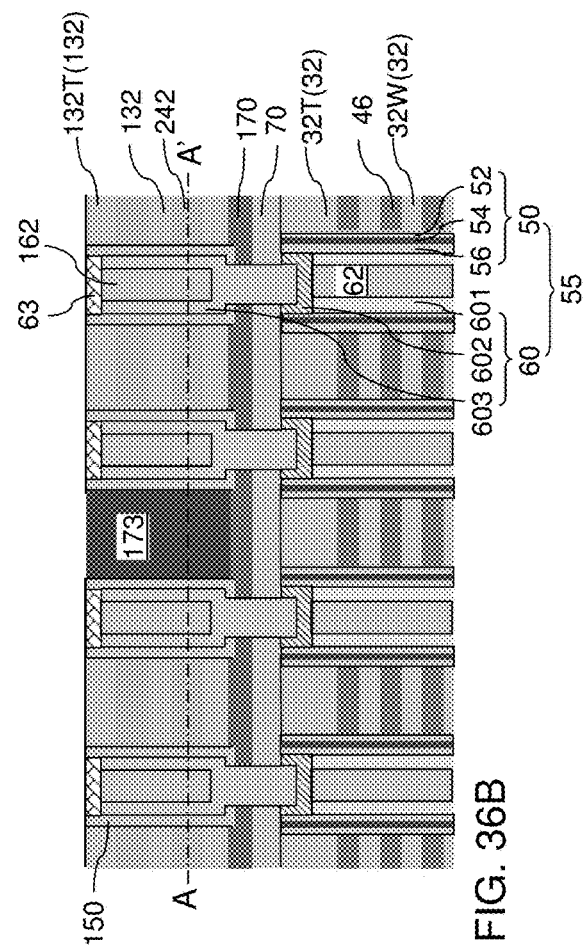

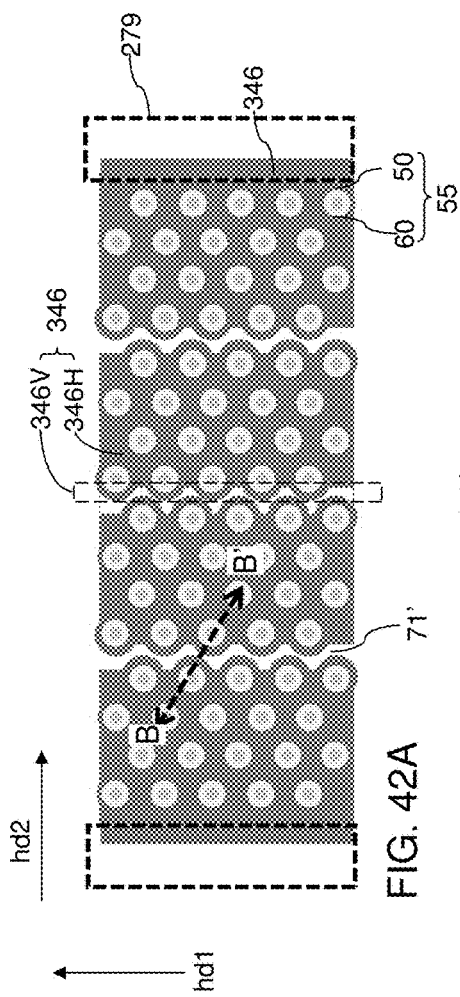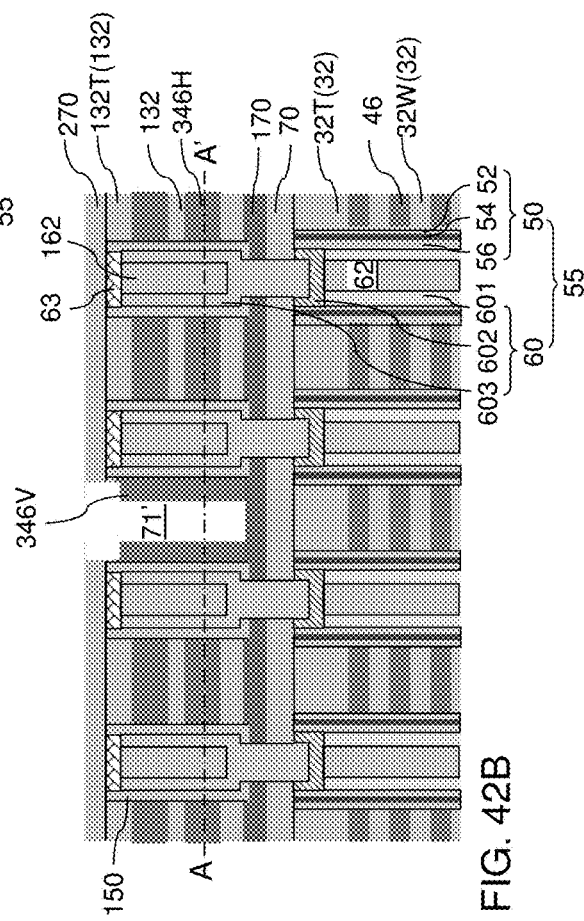

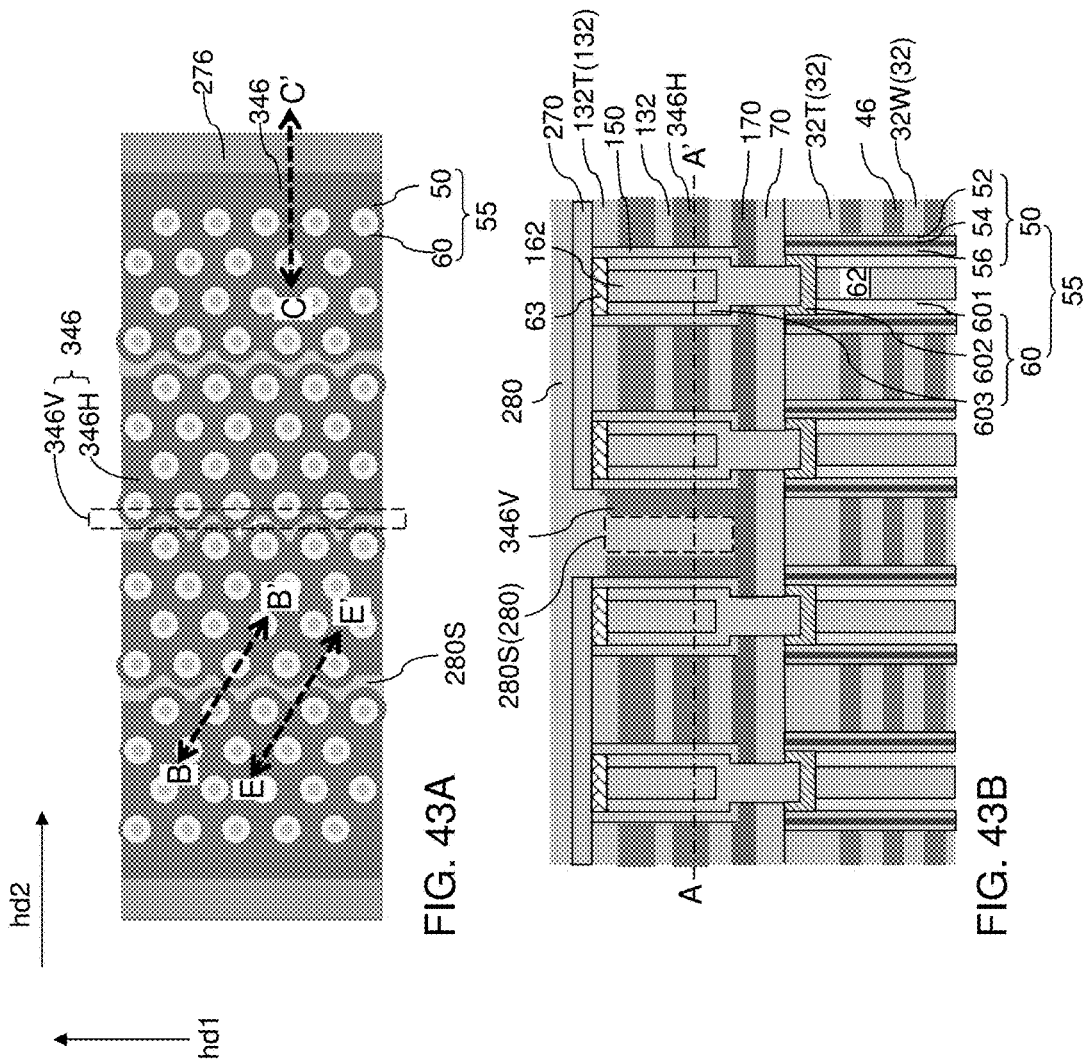

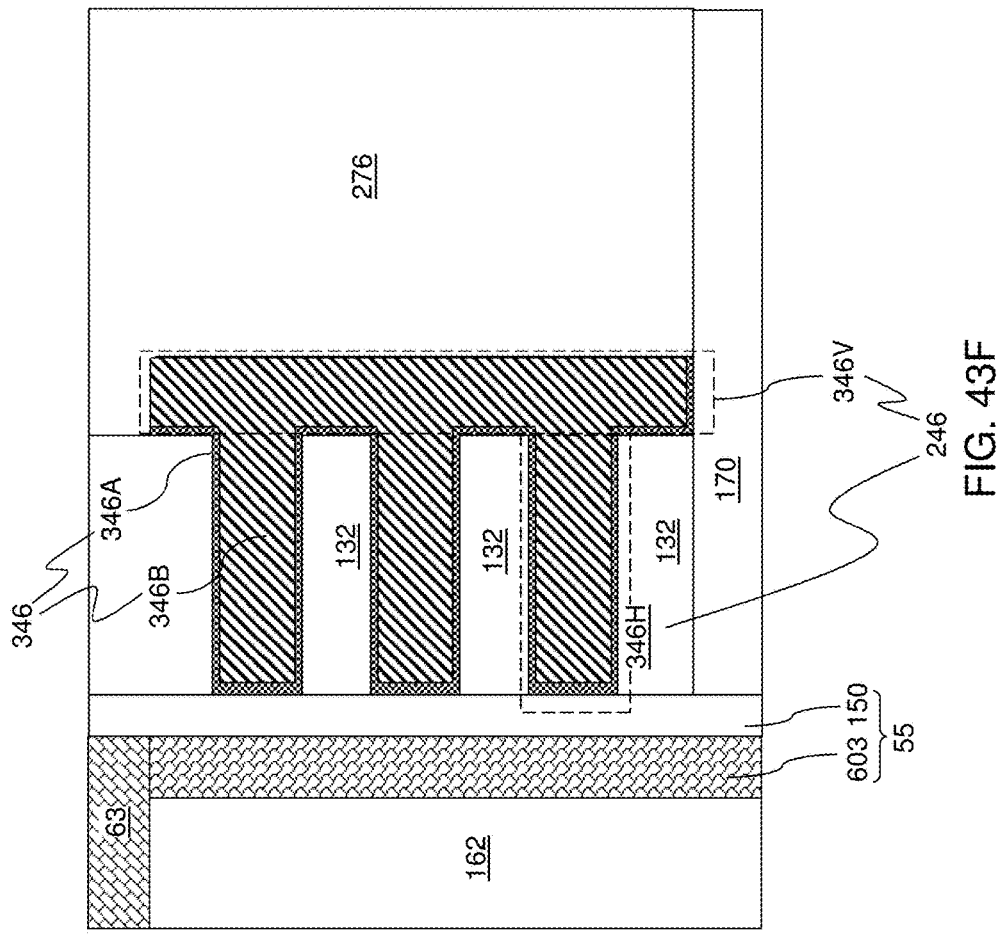

US 10,475,804 B1

THREE-DIMENSIONAL MEMORY DEVICE CONTAINING MULTILEVEL DRAIN SELECT GATE ISOLATION AND METHODS OF MAKING THE SAME

FIELD

The present disclosure relates generally to the field of semiconductor devices, and particular to a three-dimensional memory device including multi-level self-aligned drain select level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a three-dimensional memory device is provided, which comprises: an alternating stack of insulating layers and word-line-level electrically conductive layers located over a substrate; a plurality of multi-level drain select electrodes, each comprising a respective vertical connection portion contacting and electrically connected to a respective set of drain-select-level electrically conductive layers that are vertically spaced apart among one another and located over the alternating stack; memory stack structures comprising a respective vertical semiconductor channel and a respective memory film, wherein each memory film has a respective sidewall that extends through the alternating stack and each level of the multi-level drain select electrodes; and a first drain-select-level isolation structure overlying the alternating stack, laterally extending along a first horizontal direction and located between a neighboring pair of the multi-level drain select electrodes, and including a pair of sidewalls that include a respective set of concave vertical sidewall segments, wherein at least one multi-level drain select electrode of the plurality of the multi-level drain select electrodes contacts a sidewall of the first drain-select-level isolation structure.

According to another aspect of the present disclosure, a method of forming a three-dimensional memory device is provided, which comprises: forming an alternating stack of insulating layers and word-line-level spacer material layers over a substrate, wherein the word-line-level spacer material layers are formed as, or are subsequently replaced with, word-line-level electrically conductive layers; forming drain-select-level sacrificial material layers vertically spaced by drain-select-level insulating layers over the alternating stack; forming drain-select-level sacrificial line structures over the alternating stack and through the drain-select-level sacrificial material layers; forming memory stack structures through the alternating stack, the drain-select-level spacer material layers, and the drain-select-level sacrificial line structures, wherein each memory stack structure comprises a respective vertical semiconductor channel and a respective memory film; forming drain-select-level backside recesses adjoined to drain-select-level isolation trenches by removing remaining portions of the drain-select-level sacrificial line structures and the drain-select-level sacrificial material layers; and forming multi-level drain select electrodes comprising a respective vertical connection portion contacting and electrically connected to a respective set of drain-select-level electrically conductive layers within volumes of the drain-select-level backside recesses and the drain-select-level isolation trenches.

According to yet another aspect of the present disclosure, a three-dimensional memory device is provided, which comprises: an alternating stack of insulating layers and word-line-level electrically conductive layers located over a substrate; multi-level drain select electrodes comprising a respective vertical connection portion adjoined to a respective set of drain-select-level electrically conductive layers that are vertically spaced apart among one another and located over the alternating stack; memory stack structures comprising a respective vertical semiconductor channel laterally surrounded by a respective memory film extending through the alternating stack, and laterally surrounded by a respective gate dielectric extending through a respective one of the plurality of multi-level drain select electrodes; and a drain-select-level isolation structure overlying the alternating stack, laterally extending along a first horizontal direction and located between a neighboring pair of the multi-level drain select electrodes, and including a pair of sidewalls that include a respective set of concave vertical sidewall segments, wherein each of the multi-level drain select electrodes contacts a sidewall of a subset of the gate dielectrics.

According to still another aspect of the present disclosure, a method of forming a three-dimensional memory device is provided, which comprises: forming an alternating stack of insulating layers and word-line-level spacer material layers over a substrate, wherein the word-line-level spacer material layers are formed as, or are subsequently replaced with, word-line-level electrically conductive layers; forming memory stack structures through the alternating stack, wherein each memory stack structure comprises a respective word-line-level semiconductor channel portion and a respective memory film; forming drain-select-level sacrificial material layers spaced apart by drain-select-level insulating layers over the alternating stack; forming drain-select-level sacrificial line structures through the drain-select-level sacrificial material layers and the drain-select-level insulating layers; forming drain-select-level backside recesses adjoined to drain-select-level isolation trenches by removing portions of the drain-select-level sacrificial line structures and the drain-select-level sacrificial material layers; and forming multi-level drain select electrodes comprising a respective vertical connection portion adjoined to respective set of drain-select-level electrically conductive layers within volumes of the drain-select-level backside recesses and the drain-select-level isolation trenches.

BRIEF DESCRIPTION OF THE DRAWINGS

FIG. 8A is a horizontal cross-sectional view of the first exemplary structure after formation of a backside trench according to the first embodiment of the present disclosure.

FIG. 8B is a vertical cross-sectional view of the first exemplary structure along the vertical plane B-B' of FIG. 8A. The horizontal plane B-B' is the plane of the horizontal cross-sectional view of FIG. 8A.

FIG. 9A is a horizontal cross-sectional view of the first exemplary structure after formation of word-line-level backside recesses according to the first embodiment of the present disclosure.

FIG. 9B is a vertical cross-sectional view of the first exemplary structure along the vertical plane B-B' of FIG. 9A. The horizontal plane B-B' is the plane of the horizontal cross-sectional view of FIG. 9A.

FIG. 10A is a horizontal cross-sectional view of the first exemplary structure after formation of word-line-level electrically conductive layers according to the first embodiment of the present disclosure.

FIG. 10B is a vertical cross-sectional view of the first exemplary structure along the vertical plane B-B' of FIG. 10A. The horizontal plane B-B' is the plane of the horizontal cross-sectional view of FIG. 10A.

FIG. 11A is a horizontal cross-sectional view of the first exemplary structure after formation of a dielectric divider structure in the backside trench according to the first embodiment of the present disclosure.

FIG. 11B is a vertical cross-sectional view of the first exemplary structure along the vertical plane B-B' of FIG. 11A. The horizontal plane B-B' is the plane of the horizontal cross-sectional view of FIG. 11A.

FIG. 12A is a horizontal cross-sectional view of the first exemplary structure after removal of the drain-select-level sacrificial line structures according to the first embodiment of the present disclosure.

FIG. 12B is a vertical cross-sectional view of the first exemplary structure along the vertical plane B-B' of FIG. 12A. The horizontal plane B-B' is the plane of the horizontal cross-sectional view of FIG. 12A.

FIG. 13A is a horizontal cross-sectional view of the first exemplary structure after removal of drain-select-level sacrificial material layers according to the first embodiment of the present disclosure.

FIG. 13B is a vertical cross-sectional view of the first exemplary structure along the vertical plane B-B' of FIG. 13A. The horizontal plane B-B' is the plane of the horizontal cross-sectional view of FIG. 13A.

FIG. 15A is a horizontal cross-sectional view of the first exemplary structure after formation of a dielectric cap layer including drain-select-level isolation structures according to the first embodiment of the present disclosure.

FIG. 15B is a vertical cross-sectional view of the first exemplary structure along the vertical plane B-B' of FIG. 15A. The horizontal plane B-B' is the plane of the horizontal cross-sectional view of FIG. 15A.

FIG. 19A is a horizontal cross-sectional view of the second exemplary structure after formation of memory stack structures according to the second embodiment of the present disclosure.

FIG. 19B is a vertical cross-sectional view of the second exemplary structure along the vertical plane B-B' of FIG. 19A. The horizontal plane B-B' is the plane of the horizontal cross-sectional view of FIG. 19A.

FIG. 20A is a horizontal cross-sectional view of the second exemplary structure after formation of a backside trench according to the second embodiment of the present disclosure.

FIG. 20B is a vertical cross-sectional view of the second exemplary structure along the vertical plane B-B' of FIG. 20A. The horizontal plane B-B' is the plane of the horizontal cross-sectional view of FIG. 20A.

FIG. 21A is a horizontal cross-sectional view of the second exemplary structure after formation of word-line-level backside recesses and first drain-select-level backside recesses by removal of first portions of the drain-select-level sacrificial material layers and according to the second embodiment of the present disclosure.

FIG. 21B is a vertical cross-sectional view of the second exemplary structure along the vertical plane B-B' of FIG. 21A. The horizontal plane B-B' is the plane of the horizontal cross-sectional view of FIG. 21A.

FIG. 22A is a horizontal cross-sectional view of the second exemplary structure after formation of word-line-level electrically conductive layers and first segments of a drain-select-level electrically conductive layer according to the second embodiment of the present disclosure.

FIG. 22B is a vertical cross-sectional view of the second exemplary structure along the vertical plane B-B' of FIG. 22A. The horizontal plane B-B' is the plane of the horizontal cross-sectional view of FIG. 22A.

FIG. 23A is a horizontal cross-sectional view of the second exemplary structure after formation of a dielectric divider structure in the backside trench according to the second embodiment of the present disclosure.

FIG. 23B is a vertical cross-sectional view of the second exemplary structure along the vertical plane B-B' of FIG. 23A. The horizontal plane B-B' is the plane of the horizontal cross-sectional view of FIG. 23A.

FIG. 24A is a horizontal cross-sectional view of the second exemplary structure after removal of the drain-select-level sacrificial line structures according to the second embodiment of the present disclosure.

FIG. 24B is a vertical cross-sectional view of the second exemplary structure along the vertical plane B-B' of FIG. 24A. The horizontal plane B-B' is the plane of the horizontal cross-sectional view of FIG. 24A.

FIG. 25A is a horizontal cross-sectional view of the second exemplary structure after removal of second portions of the drain-select-level sacrificial material layers according to the second embodiment of the present disclosure.

FIG. 25B is a vertical cross-sectional view of the second exemplary structure along the vertical plane B-B' of FIG. 25A. The horizontal plane B-B' is the plane of the horizontal cross-sectional view of FIG. 25A.

FIG. 26A is a horizontal cross-sectional view of the second exemplary structure after formation of second segments of the drain-select-level electrically conductive layer according to the second embodiment of the present disclosure.

FIG. 26B is a vertical cross-sectional view of the second exemplary structure along the vertical plane B-B' of FIG. 26A. The horizontal plane B-B' is the plane of the horizontal cross-sectional view of FIG. 26A.

FIG. 27A is a horizontal cross-sectional view of the second exemplary structure after formation of a dielectric cap layer including drain-select-level isolation structures according to the second embodiment of the present disclosure.

FIG. 27B is a vertical cross-sectional view of the second exemplary structure along the vertical plane B-B' of FIG. 27A. The horizontal plane B-B' is the plane of the horizontal cross-sectional view of FIG. 27A.

FIG. 30A is a horizontal cross-sectional view of the third exemplary structure after formation of drain-select-level insulating layers and drain-select-level sacrificial material layers according to the third embodiment of the present disclosure.

FIG. 30B is a vertical cross-sectional view of the third exemplary structure along the vertical plane B-B' of FIG. 30A. The horizontal plane B-B' is the plane of the horizontal cross-sectional view of FIG. 30A.

FIG. 32A is a horizontal cross-sectional view of the third exemplary structure after formation of drain-select-level sacrificial line structures according to the third embodiment of the present disclosure.

FIG. 32B is a vertical cross-sectional view of the third exemplary structure along the vertical plane B-B' of FIG. 32A. The horizontal plane B-B' is the plane of the horizontal cross-sectional view of FIG. 32A.

FIG. 34A is a horizontal cross-sectional view of the third exemplary structure after formation of a drain-select-level gate dielectric layer and a cover material layer according to the third embodiment of the present disclosure.

FIG. 34B is a vertical cross-sectional view of the third exemplary structure along the vertical plane B-B' of FIG. 34A. The horizontal plane B-B' is the plane of the horizontal cross-sectional view of FIG. 34A.

FIG. 35A is a horizontal cross-sectional view of the third exemplary structure after formation of a drain-select-level gate dielectric layer and cover material spacers according to the third embodiment of the present disclosure.

FIG. 35B is a vertical cross-sectional view of the third exemplary structure along the vertical plane B-B' of FIG. 35A. The horizontal plane B-B' is the plane of the horizontal cross-sectional view of FIG. 35A.

FIG. 36A is a horizontal cross-sectional view of the third exemplary structure after formation of drain-select-level semiconductor channel portions, drain-select-level dielectric cores, and drain regions according to the third embodiment of the present disclosure.

FIG. 36B is a vertical cross-sectional view of the third exemplary structure along the vertical plane B-B' of FIG. 36A. The horizontal plane B-B' is the plane of the horizontal cross-sectional view of FIG. 36A.

FIG. 42A is a horizontal cross-sectional view of the third exemplary structure after formation of segments of a drain-select-level electrically conductive layer by an anisotropic etch according to the third embodiment of the present disclosure.

FIG. 42B is a vertical cross-sectional view of the third exemplary structure along the vertical plane B-B' of FIG. 42A. The horizontal plane B-B' is the plane of the horizontal cross-sectional view of FIG. 42A.

FIG. 43A is a horizontal cross-sectional view of the third exemplary structure after formation of a second dielectric cap layer including drain-select-level isolation structures according to the third embodiment of the present disclosure.

FIG. 43B is a vertical cross-sectional view of the third exemplary structure along the vertical plane B-B' of FIG. 43A. The horizontal plane B-B' is the plane of the horizontal cross-sectional view of FIG. 43A.

FIG. 43F is a magnified view of a region of the vertical cross-sectional view of FIG. 43C.

DETAILED DESCRIPTION

Figure 1:
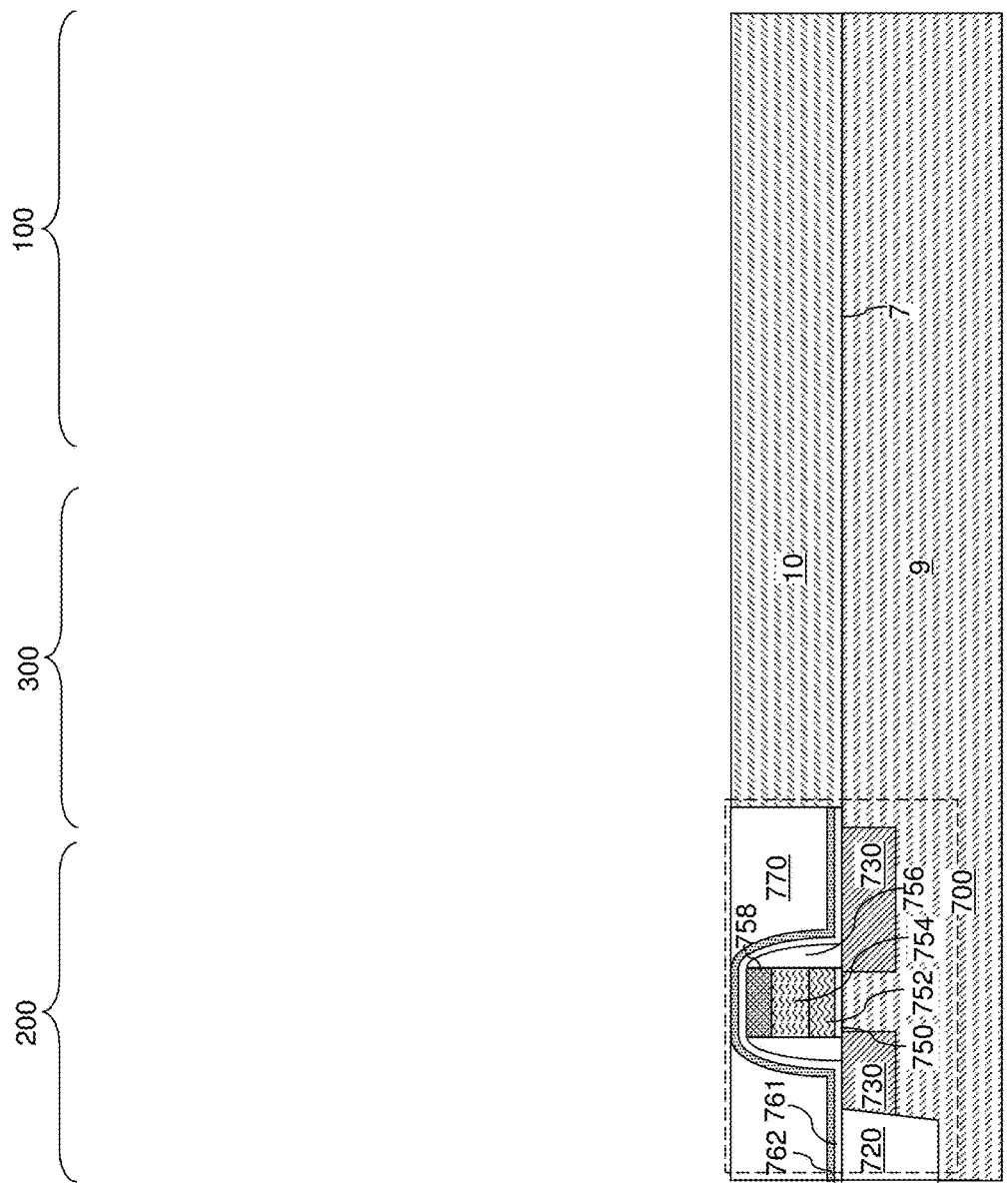
FIG. 1 is a vertical cross-sectional view of a first exemplary structure after formation of at least one peripheral device and a semiconductor material layer according to a first embodiment of the present disclosure.

As discussed above, the present disclosure is directed to a three-dimensional memory device including multi-level self-aligned drain select level isolation structures and methods of manufacturing the same, the various aspects of which are described below. The multi-level self-aligned drain select level isolation structures can provide a compact device layout and reduce a chip size without the need to allocate an extra dedicated area to the drain-select-level isolation structure, as well as providing a simpler self aligned fabrication process. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10.

The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate dielectric cap layer can be formed over the substrate semiconductor layer 9, and can be subsequently patterned to form at least one gate structure (750, 752, 754, 758), each of which can include a gate dielectric 750, a gate electrode (752, 754), and a gate dielectric cap 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
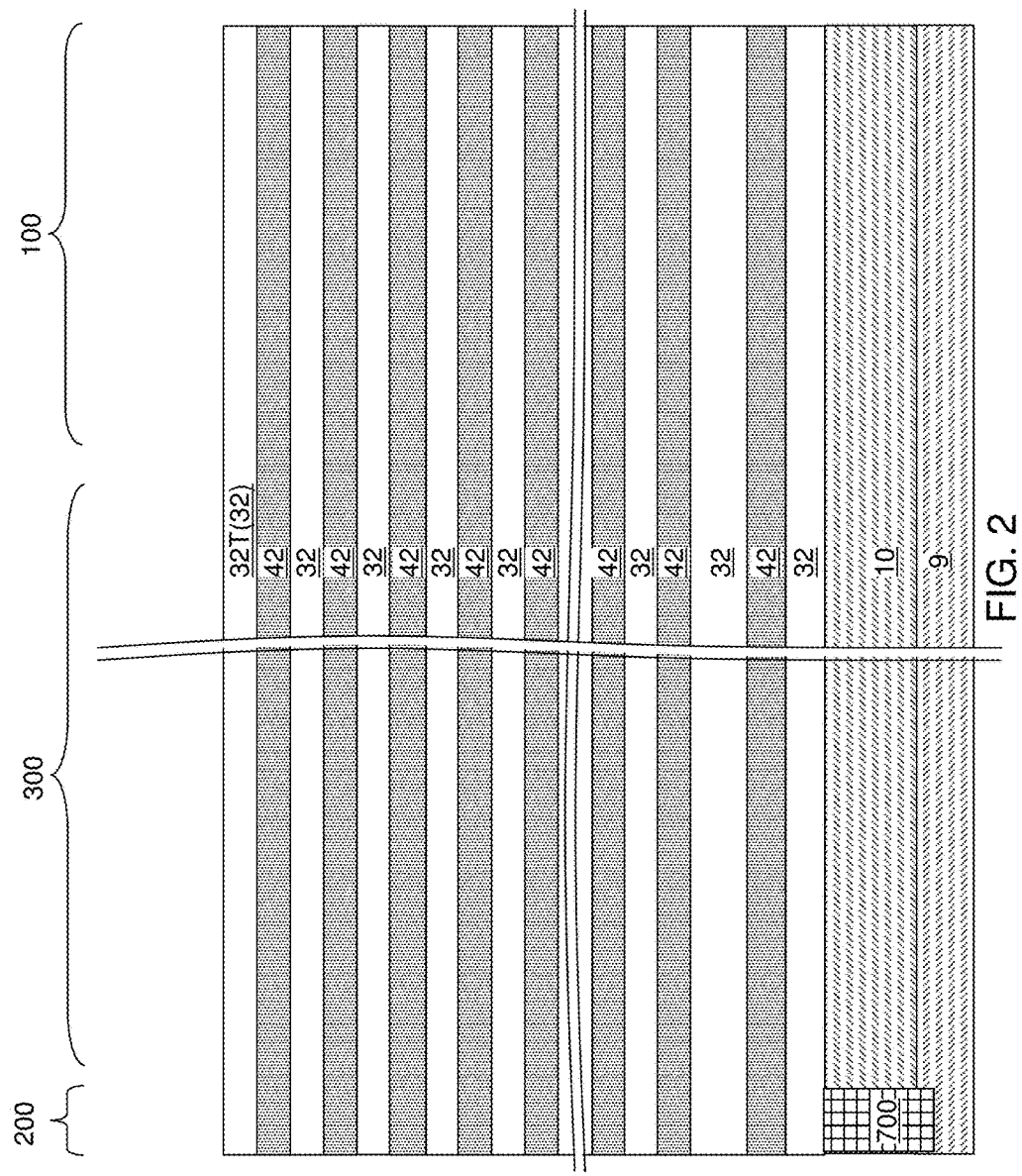
FIG. 2 is a vertical cross-sectional view of the first exemplary structure after formation of an alternating stack of insulating layers and word-line-level sacrificial material layers according to the first embodiment of the present disclosure.

Referring to FIG. 2, a stack of an alternating plurality of first material layers (which can be insulating layers 32) and second material layers (which can be word-line-level sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. As used herein, a "word-line-level" element refers to an element that is formed at, or adjacent to, any of the word line levels, i.e., at any of the levels at which a word line is to be subsequently formed.

Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a word-line-level sacrificial material layer. The insulating layers 32 are formed between word line levels, i.e., levels at which word lines are to be subsequently formed. As such, the insulating layers 32 are also referred to as word-line-level insulating layers 32. In this case, the stack can include an alternating plurality of insulating layers 32 and word-line-level sacrificial material layers 42, and constitutes a prototype stack of alternating layers comprising insulating layers 32 and word-line-level sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and word-line-level sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. The insulating layers 32 include a topmost insulating layer 32T and inter-word-line insulating layers 32W located between a respective vertically neighboring pair of word-line-level sacrificial material layers 42.

The second material of the word-line-level sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The word-line-level sacrificial material layers 42 may comprise an insulating material, a semiconductor material, or a conductive material. The second material of the word-line-level sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the word-line-level sacrificial material layers 42 can be word-line-level spacer material layers that comprise silicon nitride or a semiconductor material including at least one of silicon and germanium.

In one embodiment, the insulating layers 32 can include silicon oxide, and word-line-level sacrificial material layers can include silicon nitride word-line-level sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the word-line-level sacrificial material layers 42 can be formed, for example, CVD or atomic layer deposition (ALD).

The word-line-level sacrificial material layers 42 can be suitably patterned so that conductive material portions to be subsequently formed by replacement of the word-line-level sacrificial material layers 42 can function as electrically conductive electrodes, such as the control gate electrodes of the monolithic three-dimensional NAND string memory devices to be subsequently formed. The word-line-level sacrificial material layers 42 may comprise a portion having a strip shape extending substantially parallel to the major surface 7 of the substrate.

The thicknesses of the insulating layers 32 and the word-line-level sacrificial material layers 42 can be in a range from 20 nm to 50 nm, although lesser and greater thicknesses can be employed for each insulating layer 32 and for each word-line-level sacrificial material layer 42. The topmost insulating layer 32T can have a thickness in a range from 40 nm to 200 nm, although lesser and greater thicknesses can also be employed. The number of repetitions of the pairs of an insulating layer 32 and a word-line-level sacrificial material layer (e.g., a control gate electrode or a word-line-level sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each word-line-level sacrificial material layer 42 in the alternating stack (32, 42) can have a uniform thickness that is substantially invariant within each respective word-line-level sacrificial material layer 42. The topmost layer among the insulating layers 32 is herein referred to as a topmost insulating layer 32T. The alternating stack (32, 42) may terminate with the topmost insulating layer 32.

While the present disclosure is described employing an embodiment in which the word-line-level spacer material layers are word-line-level sacrificial material layers 42 that are subsequently replaced with electrically conductive layers, embodiments are expressly contemplated herein in which the word-line-level sacrificial material layers are formed as electrically conductive layers. In this case, steps for replacing the word-line-level spacer material layers with electrically conductive layers can be omitted.

Figure 3A:
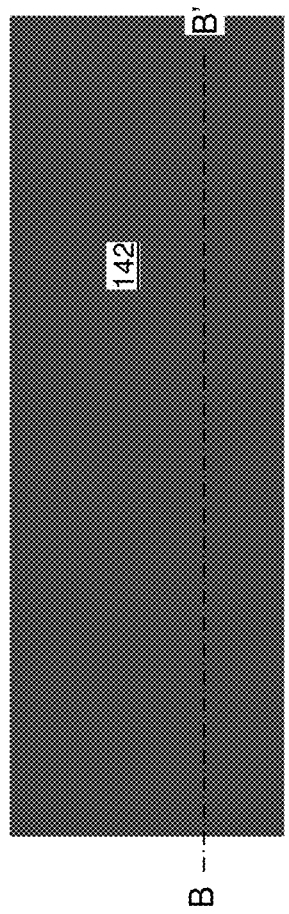
FIG. 3A is a horizontal cross-sectional view of the first exemplary structure after formation of drain-select-level insulating layers and drain-select-level sacrificial material layers according to the first embodiment of the present disclosure.
Figure 3B:
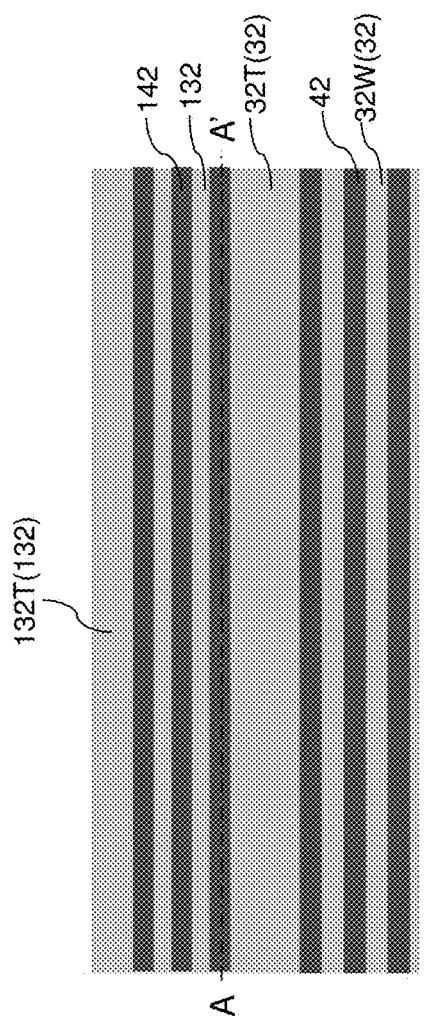
FIG. 3B is a vertical cross-sectional view of the first exemplary structure along the vertical plane B-B' of FIG. 3A. The horizontal plane B-B' is the plane of the horizontal cross-sectional view of FIG. 3A.

Referring to FIGS. 3A and 3B, drain-select-level sacrificial material layers 142 and drain-select-level insulating layers 132 can be formed over the alternating stack (32, 42). As used herein, a "drain-select-level" element refers to an element that is formed at, or adjacent to, any of the drain select levels, i.e., at any of the levels at which a drain select gate electrode is to be subsequently formed. The topmost layer among the drain-select-level insulating layers 132 is herein referred to as a topmost drain-select-level insulating layer 132T. The drain-select-level sacrificial material layers 142 are vertically spaced by the drain-select-level insulating layers 132. In one embodiment, the drain-select-level insulating layers 132 can include the same material as the insulating layers 32, and the drain-select-level sacrificial material layers 142 can include the same material as the word-line-level sacrificial material layers 42. In one embodiment, the drain-select-level insulating layers 132 and the insulating layers 32 can include undoped silicate glass or a doped silicate glass, and the drain-select-level sacrificial material layers 142 and the word-line-level sacrificial material layers 42 can include silicon nitride. The thickness of each of the drain-select-level insulating layers 132 and the drain-select-level sacrificial material layers 142 can be in a range from 20 nm to 50 nm, although lesser and greater thicknesses can also be employed. The topmost drain-select-level insulating layer 132T can have a thickness in a range from 40 nm to 200 nm, although lesser and greater thicknesses can also be employed. The set of all drain-select-level insulating layers 132 and all drain-select-level sacrificial material layers 142 is herein referred to as a drain-select-level alternating stack (132, 142).

Figure 4:
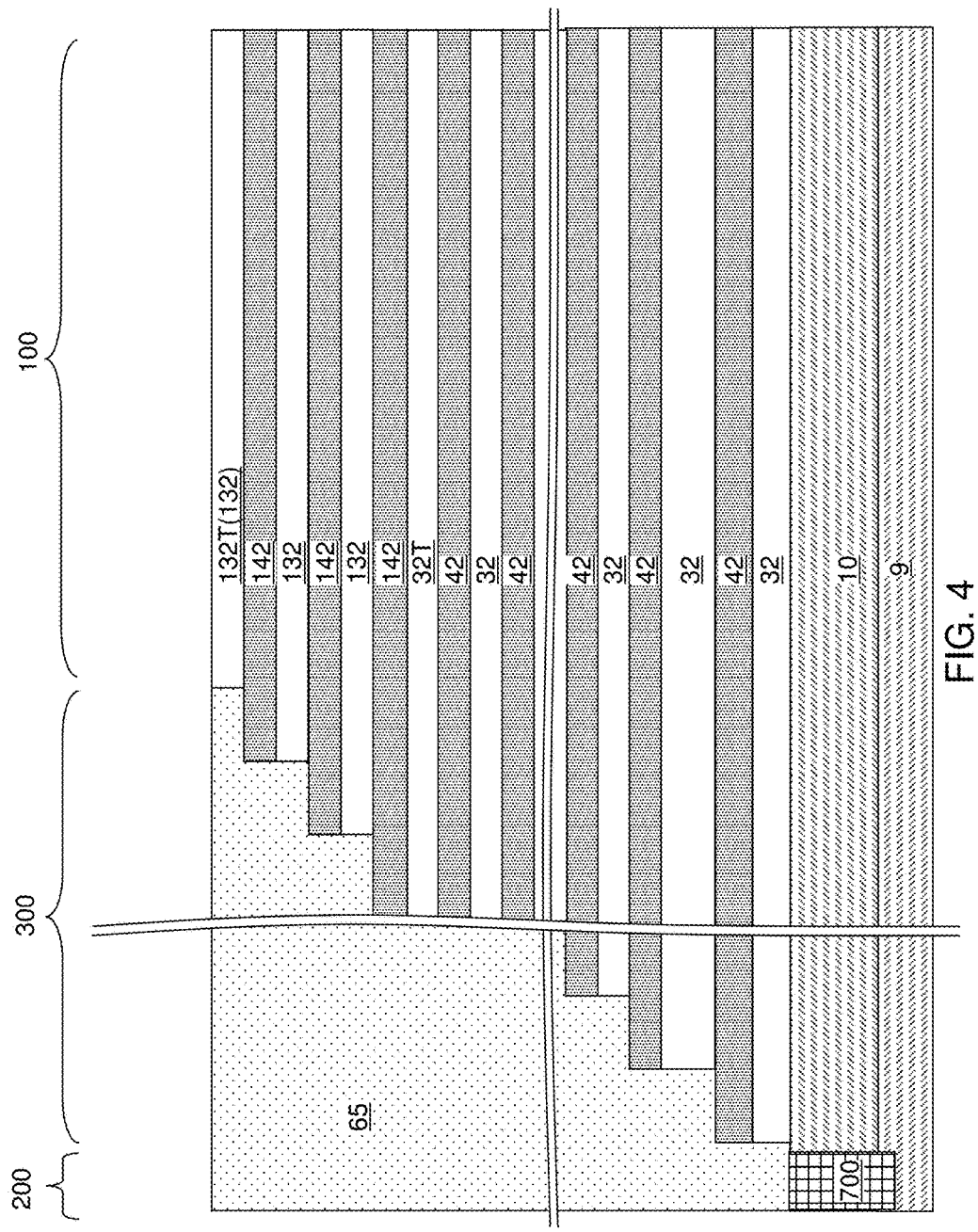
FIG. 4 is a vertical cross-sectional view of the first exemplary structure after formation of stepped terraces and a retro-stepped dielectric material portion according to the first embodiment of the present disclosure.

Referring to FIG. 4, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the drain-select-level alternating stack (132, 142) and the alternating stack (32, 42). Each word-line-level sacrificial material layer 42 other than a topmost word-line-level sacrificial material layer 42 within the alternating stack (32, 42) laterally extends farther than any overlying word-line-level sacrificial material layer 42 within the alternating stack (32, 42). Each drain-select-level sacrificial material layer 142 can have a lateral extent less than the topmost word-line-level sacrificial material layer 42. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
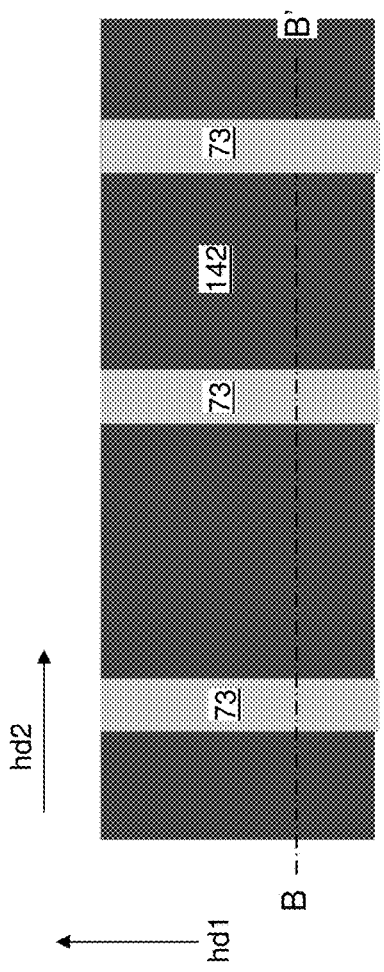
FIG. 5A is a horizontal cross-sectional view of the first exemplary structure after formation of drain-select-level sacrificial line structures according to the first embodiment of the present disclosure.
Figure 5B:
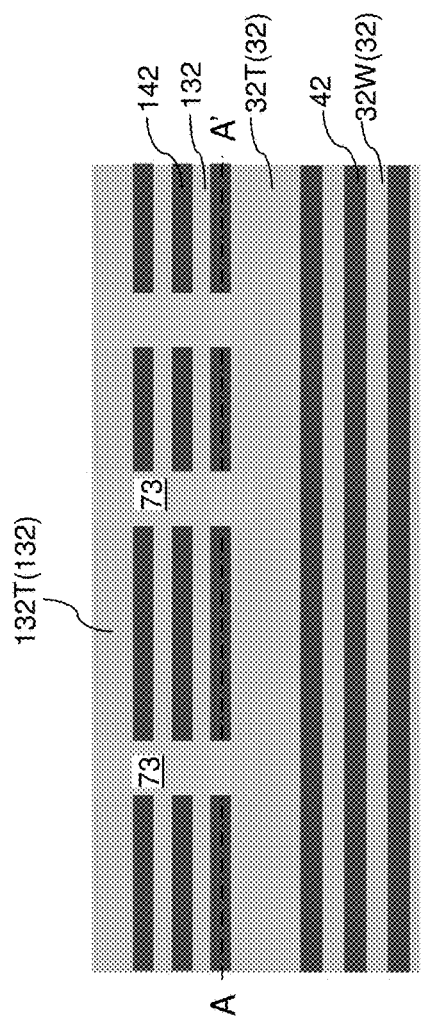
FIG. 5B is a vertical cross-sectional view of the first exemplary structure along the vertical plane B-B' of FIG. 5A. The horizontal plane B-B' is the plane of the horizontal cross-sectional view of FIG. 5A.

Referring to FIGS. 5A and 5B, drain-select-level sacrificial line structures 73 extending along a first horizontal direction hd1 can be formed. For example, line trenches laterally extending along the first horizontal direction hd1 and having a uniform width along a second horizontal direction hd2 that is perpendicular to the first horizontal direction hd1 can be formed through each of the drain-select-level sacrificial material layers 142. The line trenches can be filled with a sacrificial material such as amorphous silicon, polysilicon, a silicon-germanium alloy, a silicon-containing polymer, amorphous carbon, diamond-like carbon, or organosilicate glass. Excess portions of the sacrificial material can be removed from above the topmost drain-select-level insulating layer 132T by a planarization process that employs a recess etch and/or chemical mechanical planarization (CMP). The remaining portions of the sacrificial material constitute the drain-select-level sacrificial line structures 73. The width of each drain-select-level sacrificial line structure 73 is less than an inter-row pitch of rows of memory openings to be subsequently formed.

Figure 6A:
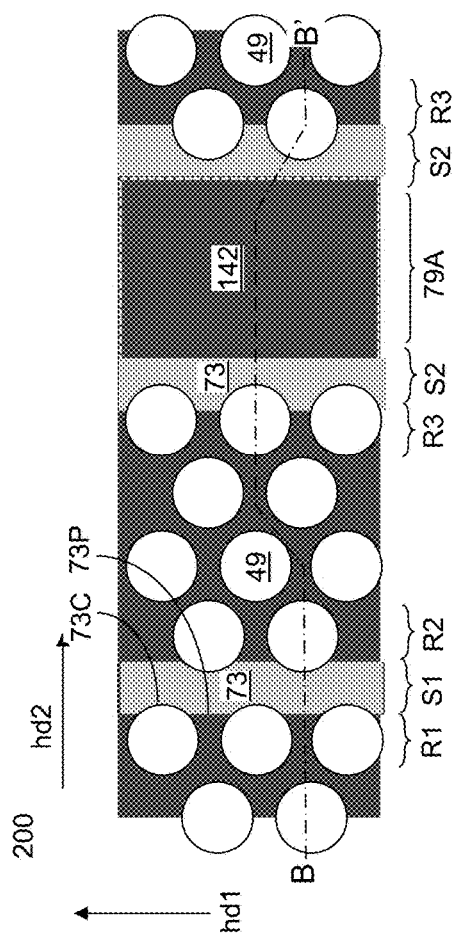
FIG. 6A is a horizontal cross-sectional view of the first exemplary structure after formation of memory openings according to the first embodiment of the present disclosure.
Figure 6B:
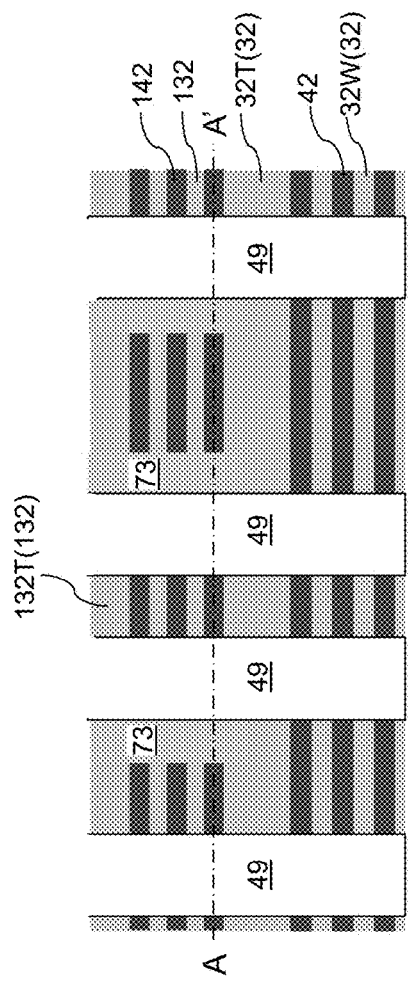
FIG. 6B is a vertical cross-sectional view of the first exemplary structure along the vertical plane B-B' of FIG. 6A. The horizontal plane B-B' is the plane of the horizontal cross-sectional view of FIG. 6A.

Referring to FIGS. 6A and 6B, multiple parallel rows of memory openings 49 are formed through the drain-select-level alternating stack (132, 142), the alternating stack (32, 42), and the drain-select-level sacrificial line structures 73. Memory openings 49 within each row are arranged along the first horizontal direction hd1, which is parallel to the lengthwise direction of the drain-select-level sacrificial line structures 73. The multiple parallel rows are laterally spaced apart along the second horizontal direction hd2. A pair of rows (R1, R2) of memory openings 49 can pass through each drain-select-level sacrificial line structure 73 within a first subset 51 of the drain-select-level sacrificial line structures 73. A respective row R1 or R2 of memory openings 49 passes through each lengthwise sidewall of each drain-select-level sacrificial line structure 73 within the first subset 51 of the drain-select-level sacrificial line structures 73. A single row R3 of memory openings 49 can pass through each drain-select-level sacrificial line structure 73 within a second subset S2 of the drain-select-level sacrificial line structures 73. A row R3 of memory openings 49 passes through one lengthwise sidewall of each drain-select-level sacrificial line structure 73 within the second subset of the drain-select-level sacrificial line structures 73, while the memory openings 49 do not pass through the opposite lengthwise sidewall of each drain-select-level sacrificial line structure 73 within the second subset S2 of the drain-select-level sacrificial line structures 73. In one embodiment, an area 79A laterally bounded by a pair of drain-select-level sacrificial line structures 73 within the second subset S2 of the drain-select-level sacrificial line structures 73 can be free of memory openings 49, and can be subsequently employed to form a backside trench therethrough.

Segments of each of the drain-select-level sacrificial line structures 73 are etched during formation of the multiple parallel rows of openings 49. Each of the drain-select-level sacrificial line structures 73 within the first subset 51 of the drain-select-level sacrificial line structures 73 can be patterned to include a respective pair of laterally alternating sequences of planar vertical sidewall segments 73P and concave vertical sidewall segments 73C during formation of the memory openings 49. Each of the drain-select-level sacrificial line structures 73 within the second subset S2 of the drain-select-level sacrificial line structures 73 can be patterned to include one laterally alternating sequence of planar vertical sidewall segments 73P and concave vertical sidewall segments 73C during formation of the memory openings 49. As used herein, a "planar vertical sidewall segment" refers to a segment of a vertical sidewall that has a horizontal cross-sectional shape having a zero curvature. As used herein, a "concave vertical sidewall segment" refers to a segment of a vertical sidewall that has a horizontal cross-sections shape having a concave shape. The memory openings can extend to a top surface of the semiconductor material layer 10.

Additional openings can be formed in the contact region 300 concurrently with formation of the memory openings 49. Such additional openings are herein referred to as support openings, which can be employed to form support pillar structures therein.

Figure 7A:
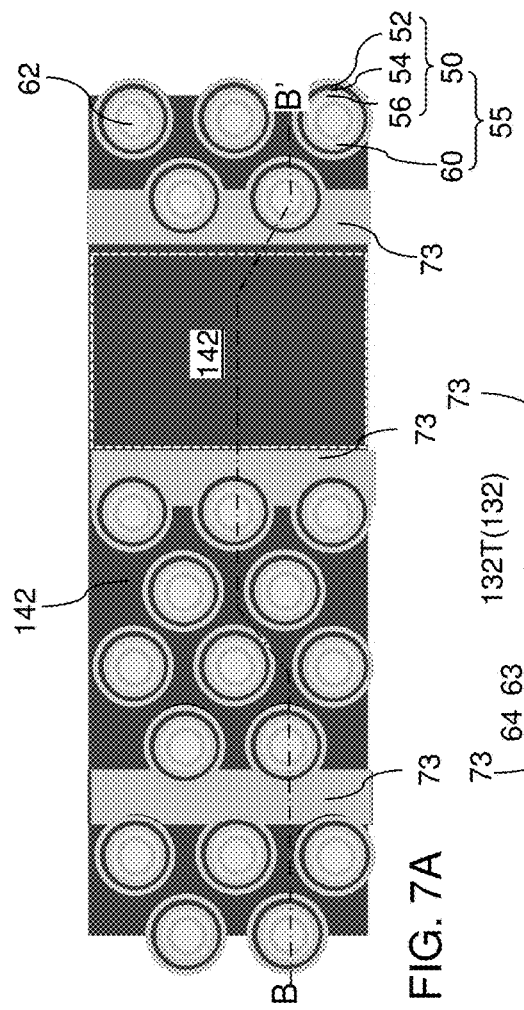
FIG. 7A is a horizontal cross-sectional view of the first exemplary structure after formation of memory stack structures according to the first embodiment of the present disclosure.
Figure 7B:
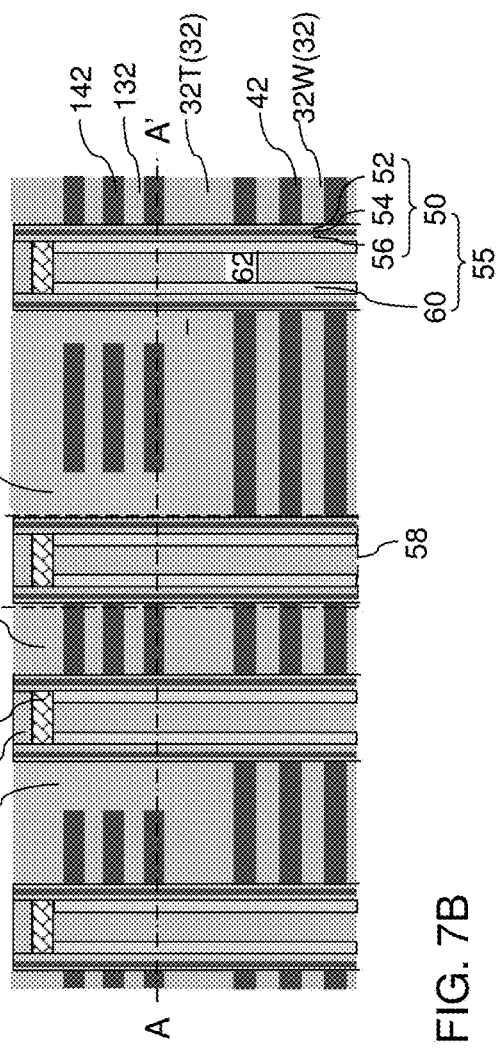
FIG. 7B is a vertical cross-sectional view of the first exemplary structure along the vertical plane B-B' of FIG. 7A. The horizontal plane B-B' is the plane of the horizontal cross-sectional view of FIG. 7A.

Referring to FIGS. 7A and 7B, memory opening fill structures 58 are formed in the memory openings 49. Each memory opening fill structure 58 can include, for example, a memory film 50, a vertical semiconductor channel 60, an optional dielectric core 62, a drain region 63, and a dielectric memory opening cap portion 64. Each memory film 50 can include a blocking dielectric 52, a charge storage layer 54, and a tunneling dielectric 56. The blocking dielectric 52 includes a dielectric material such as silicon oxide and/or a dielectric metal oxide (such as aluminum oxide). The charge storage layer 54 includes a dielectric charge storage material such as silicon nitride. The tunneling dielectric 56 includes a tunneling dielectric material such as an ONO stack.

The vertical semiconductor channel 60 may include a single semiconductor material layer or a plurality of semiconductor material layers, and may include a material such as polysilicon. The vertical semiconductor channel 60 can contact the semiconductor material layer 10 underlying the alternating stack (32, 42) through an opening in the memory film 50, which may be formed by an anisotropic etch that removes horizontal portions of conformally deposited dielectric material layers that include the various component layers within the memory film 50. Optionally, a cover material liner may be employed to protect the memory film 50 during the anisotropic etch process that forms the opening at the bottom of each memory film 50. The cover material liner may be a sacrificial material liner that is subsequently removed, or a semiconductor material liner that is incorporated into the vertical semiconductor channel 60. The vertical semiconductor channel 60 can have a doping of a first conductivity type, which may be p-type or n-type. The atomic concentration of dopants of the first conductivity type in the vertical semiconductor channel 60 may be in a range from $1.0 \times 10^{14}/cm^3$ to $1.0 \times 10^{18}/cm^3$, although lesser and greater atomic concentrations can also be employed.

In case the memory opening has a cylindrical cavity therein after formation of the vertical semiconductor channel 60, a dielectric material such as silicon oxide can be deposited in the cylindrical cavity to form a dielectric core 62. A drain region 63 including a semiconductor material (e.g., polysilicon or amorphous silicon) having a doping of a second conductivity type can be formed above the horizontal plane including the top surface of the topmost drain-select-level sacrificial material layer 142 and on an upper end of the vertical semiconductor channel 60. The second conductivity type is the opposite of the first conductivity type. The atomic concentration of dopants of the second conductivity type within the drain region 63 can be in a range from $5.0\times10^{19}/\text{cm}^3$ to $2.0\times10^{21}/\text{cm}^3$, although lesser and greater atomic concentrations can also be employed. A dielectric memory opening cap portion 64 is formed on top of the drain region 63. The top surface of the dielectric memory opening cap portion 64 can be coplanar with the top surface of the topmost drain-select-level insulating cap layer 132T.

Each contiguous combination of a memory film 50 and a vertical semiconductor channel 60 constitutes a memory stack structure 55. The memory stack structures 55 are formed in the multiple parallel rows of memory openings 49 through the alternating stack, the drain-select-level alternating stack (132, 142), and the drain-select-level sacrificial line structures 73.

Referring to FIGS. 8A and 8B, a photoresist layer (not shown) can be applied over the topmost drain-select-level insulating layer 132T, and can be lithographically patterned to form openings in areas 79A between a pair of drain-select-level sacrificial line structures 73 within the second subset S2 of the drain-select-level sacrificial line structures 73. The pattern in the photoresist layer can be transferred through the drain-select-level alternating stack (132, 142) and the alternating stack (32, 42) employing an anisotropic etch to form backside trenches 79. Each backside trench 79 can vertically extend from the top surface of the topmost drain-select-level insulating layer 132T at least to the top surface of the substrate (9, 10), and laterally extend through the memory array region 100 and the contact region 300.

In one embodiment, the backside trenches 79 can laterally extend along the first horizontal direction hd1 and can be laterally spaced apart among one another along the second horizontal direction hd2 that is perpendicular to the first horizontal direction. The memory stack structures 55 (included in the memory opening fill structures 58) can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of a backside trench 79 and a drain-select-level sacrificial line structure 73, or between a neighboring pair of drain-select-level sacrificial line structures 73. In one embodiment, the backside trenches 79 can include a source contact opening in which a source contact via structure can be subsequently formed. The photoresist layer can be removed, for example, by ashing. Sidewalls of the drain-select-level sacrificial line structures 73 within the second subset of the drain-select-level sacrificial line structures 73 can be physically exposed to the backside trenches 79.

Referring to FIGS. 9A and 9B, word-line-level backside recesses 43 can be formed by isotropically etching the word-line-level sacrificial material layers 42 employing an isotropic etchant. The etchant can selectively etch the second material of the word-line-level sacrificial material layers 42 with respect to the first material of the insulating layers 32. The etchant can be introduced into the backside trenches 79, for example, employing an etch process while remaining portions of the drain-select-level sacrificial line structures 73 protect the drain-select-level sacrificial material layers 142. Specifically, the combination of the topmost drain-select-level insulating layer 132T and the drain-select-level sacrificial line structures 73 prevent the etchant from accessing the drain-select-level sacrificial material layers 142.

Word-line-level backside recesses 43 are formed in volumes from which the word-line-level sacrificial material layers 42 are removed. Likewise, one or more source-select-level recesses (not shown) are formed below the word-line-level backside recesses 43. The removal of the second material of the word-line-level sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the word-line-level sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the word-line-level sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The memory opening fill structures 58, support pillar structures (not shown) formed in the support openings in the contact region 300, and the retro-stepped dielectric material portion 65 provide structural support while the word-line-level backside recesses 43 are present within volumes previously occupied by the word-line-level sacrificial material layers 42.

Each word-line-level backside recess 43 can be a laterally extending cavity having a lateral dimension that is greater than the vertical extent of the cavity. In other words, the lateral dimension of each word-line-level backside recess 43 can be greater than the height of the word-line-level backside recess 43. A plurality of word-line-level backside recesses 43 can be formed in the volumes from which the second material of the word-line-level sacrificial material layers 42 is removed. The memory openings in which the memory stack structures 55 are formed are herein referred to as front side openings or front side cavities in contrast with the word-line-level backside recesses 43. In one embodiment, the memory array region 100 comprises an array of monolithic three-dimensional NAND strings having a plurality of device levels disposed above the substrate (9, 10). In this case, each word-line-level backside recess 43 can define a space for receiving a respective word line of the array of monolithic three-dimensional NAND strings.

Each of the plurality of word-line-level backside recesses 43 can extend substantially parallel to the top surface of the substrate (9, 10), such as surface 7 of the substrate semiconductor layer 9. A word-line-level backside recess 43 can be vertically bounded by a top surface of an underlying insulating layer 32 and a bottom surface of an overlying insulating layer 32. In one embodiment, each word-line-level backside recess 43 can have a uniform height throughout.

Referring to FIGS. 10A and 10B, a backside blocking dielectric layer (not expressly illustrated) can be optionally formed at peripheral portions of the word-line-level backside recesses 43 and the backside trenches 79 by a conformal deposition process. The backside blocking dielectric layer, if present, comprises a dielectric material that functions as a control gate dielectric for the control gates to be subsequently formed in the word-line-level backside recesses 43. In case the blocking dielectric layer 52 is present within each memory opening, the backside blocking dielectric layer is optional. In case the blocking dielectric layer 52 is omitted, the backside blocking dielectric layer is present. For example, the backside blocking dielectric layer can include a dielectric metal oxide such as aluminum oxide.

At least one conductive material can be conformally deposited in the word-line-level backside recesses 43 and in the one or more source-select-level recesses (not shown) located below the word-line-level backside recesses 43. For example, a combination of a metallic barrier layer and a metal fill material can be deposited in the word-line-level backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited on the metallic barrier layer to fill remaining volumes of the word-line-level backside recesses 43. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal.

Excess portions of the deposited metallic material in the backside trenches 79 and over the topmost drain-select-level insulating layer 132T can be etched back, for example, by an isotropic wet etch, an anisotropic dry etch, or a combination thereof. Remaining portions of the deposited metallic material in the word-line-level backside recesses 43 comprise word-line-level electrically conductive layers 46 (e.g., word lines/control gate electrodes). Remaining portions of the deposited metallic material in the one or more source-select-level recesses (not shown) comprise source-select-level conductive layers (e.g., source select gate electrodes). Each word-line-level electrically conductive layer 46 can be a conductive line structure. Thus, the word-line-level sacrificial material layers 42 can be replaced with the word-line-level electrically conductive layers 46. Each word-line-level electrically conductive layer 46 can include a portion of the metallic barrier layer and a portion of the metallic fill material.

Referring to FIGS. 11A and 11B, a dielectric material such as undoped silicate glass or doped silicate glass can be deposited in the backside trenches 79. Excess portions of the deposited dielectric material can be removed from above the horizontal plane including the top surface of the topmost drain-select-level insulating layer 132T by a planarization process such as a recess etch process or a chemical mechanical planarization process. Each remaining portion of the dielectric material in the backside trenches comprises a dielectric divider structure 76, which can be a dielectric wall structure laterally extending along the first horizontal direction hd1 and vertically extending through an alternating stack of the insulating layers 32 and the word-line-level electrically conductive layers 46 and through the alternating stack of the drain-select-level insulating layers 132 and the drain-select-level sacrificial material layers 142. In one embodiment, the dielectric divider structure 76 can be formed in a tubular shape, for example, by deposition of a conformal dielectric material liner and an anisotropic etch process, and a conductive contact via structure (e.g., source electrode or local interconnect 81 shown in FIG. 44A) is may be formed within a cavity in the tubular dielectric divider structure 76. In this case, a source region (element 61 shown in FIG. 44A) may be formed in an upper portion of the semiconductor material layer 10 underlying the backside trench 79 and in contact with the conductive contact via structure.

In one embodiment, each dielectric divider structure 76 includes a pair of lengthwise sidewalls that laterally extend along the first horizontal direction hd1 and vertically extends through the alternating stack of the insulating layers 32 and the word-line-level electrically conductive layers 46 and through each level of the drain-select level sacrificial material layers 142.

Referring to FIGS. 12A and 12B, remaining portions of the drain-select-level sacrificial line structures 73 can be subsequently removed by a selective etch process that etches the material of the drain-select-level sacrificial line structures 73 selective to the materials of the dielectric memory opening cap portions 64, the topmost drain-select-level insulating layer 132T, and the dielectric divider structures 76. For example, if the drain-select-level sacrificial line structures 73 include amorphous silicon or polysilicon, a wet etch process employing hot trimethyl-2 hydroxyethyl ammonium hydroxide ("hot TMY"), tetramethyl ammonium hydroxide (TMAH), or ammonium hydroxide can be employed to remove the drain-select-level sacrificial line structures 73. Drain-select-level isolation trenches 71 can be formed in the volumes from which the drain-select-level sacrificial line structures 73 are removed. Thus, at this step in the process, the drain-select-level sacrificial line structures 73 are completely removed.

Referring to FIGS. 13A and 13B, the drain-select-level sacrificial material layers 142 are removed by a selective etch process that etches the material of the drain-select-level sacrificial material layers 142 without etching the materials of the drain-select-level insulating layers 132 or the dielectric divider structures 76 by providing an etchant through the drain-select-level isolation trenches 71. For example, if the drain-select-level sacrificial material layers 142 include silicon nitride and if the drain-select-level insulating layers 132 or the dielectric divider structures 76 include silicon oxide materials, the drain-select-level sacrificial material layers 142 can be removed by a wet etch process employing hot phosphoric acid. Drain-select-level backside recesses 143 are formed in volumes from which the drain-select-level sacrificial material layers 142 are removed through the drain-select-level isolation trenches 71.

Figures 14A, 14B:
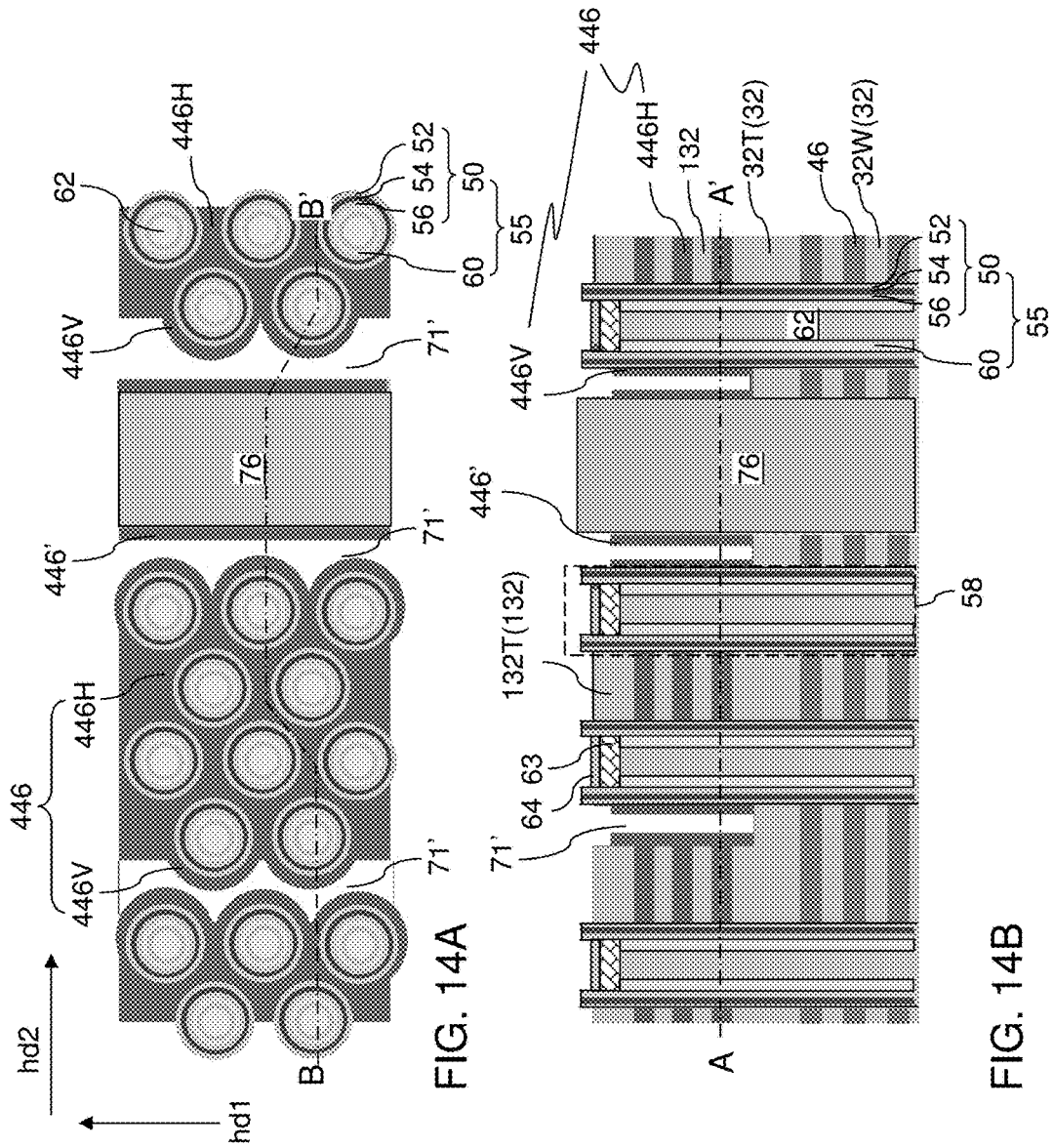
FIG. 14A is a horizontal cross-sectional view of the first exemplary structure after formation of strips of a drain-select-level electrically conductive layer according to the first embodiment of the present disclosure.
FIG. 14B is a vertical cross-sectional view of the first exemplary structure along the vertical plane B-B' of FIG. 14A. The horizontal plane B-B' is the plane of the horizontal cross-sectional view of FIG. 14A.

Referring to FIGS. 14A and 14B, at least one metallic fill material is deposited in the drain-select-level backside recesses 143 through the drain-select-level isolation trenches 71, and peripheral portions of the drain-select-level isolation trenches 71 by at least one conformal deposition process. The at least one metallic fill material can include, for example, a metallic barrier liner including a conducive metal nitride material (such as TiN, TaN, or WN) and/or a metal fill material such as tungsten, cobalt, molybdenum, and/or ruthenium. The thickness(es) of the at least one metallic material can be selected such that the drain-select-level isolation trenches 71 are not completely filled with the at least one metallic fill material.

An anisotropic etch process is performed to remove horizontal portions of the at least one metallic fill material from above the topmost drain-select-level insulating layer 132T and from the bottom portion of each drain-select-level isolation trench 71. Each remaining portion of the at least one metallic fill material filling the drain-select-level backside recesses 143 constitute a strip of a drain-select-level electrically conductive layer 446H. Each remaining vertical portion of the at least one metallic fill material adjoined to a respective set of drain-select-level electrically conductive layers 446H constitutes a vertical connection portion 446V. Each contiguous set of drain-select-level electrically conductive layers 446H and at least one vertical connection portion 446V which contacts and electrically connects the drain-select-level electrically conductive layers 446H to each other constitute a drain-select-level electrode 446. In one embodiment, a drain-select-level electrode 446 can include two vertical connection portions 446V adjoined to two or more, such as three to six drain-select-level electrically conductive layers 446H.

A drain-select-level cavity 71' that generally extends along the first horizontal direction hd1 can be located within each drain-select-level isolation trench 71. A vertical metallic spacer 446' can be formed on each sidewall of the dielectric divider structures 76 that laterally extend along the first horizontal direction hd1. Each drain-select-level electrically conductive layer 446H can be formed in multiple portions that are laterally spaced apart by the drain-select-level cavities 71'. Each drain-select-level electrically conductive layer 446H can be formed in volumes from which a respective drain-select-level sacrificial material layer 142 is removed.

Referring to FIGS. 15A-15D, a dielectric cap layer 80 is formed by depositing a dielectric material such as a silicon oxide material over the topmost drain-select-level insulating layer 132T and in the drain-select-level cavities 71'. Each portion of the dielectric cap layer 80 that fills a respective drain-select-level cavity 71' is herein referred to as a drain-select-level isolation structure 80S. Thus, the drain-select-level isolation structures 80S are formed within volumes from which the remaining portions of the drain-select-level sacrificial line structures 73 are removed.

Figure 15C:
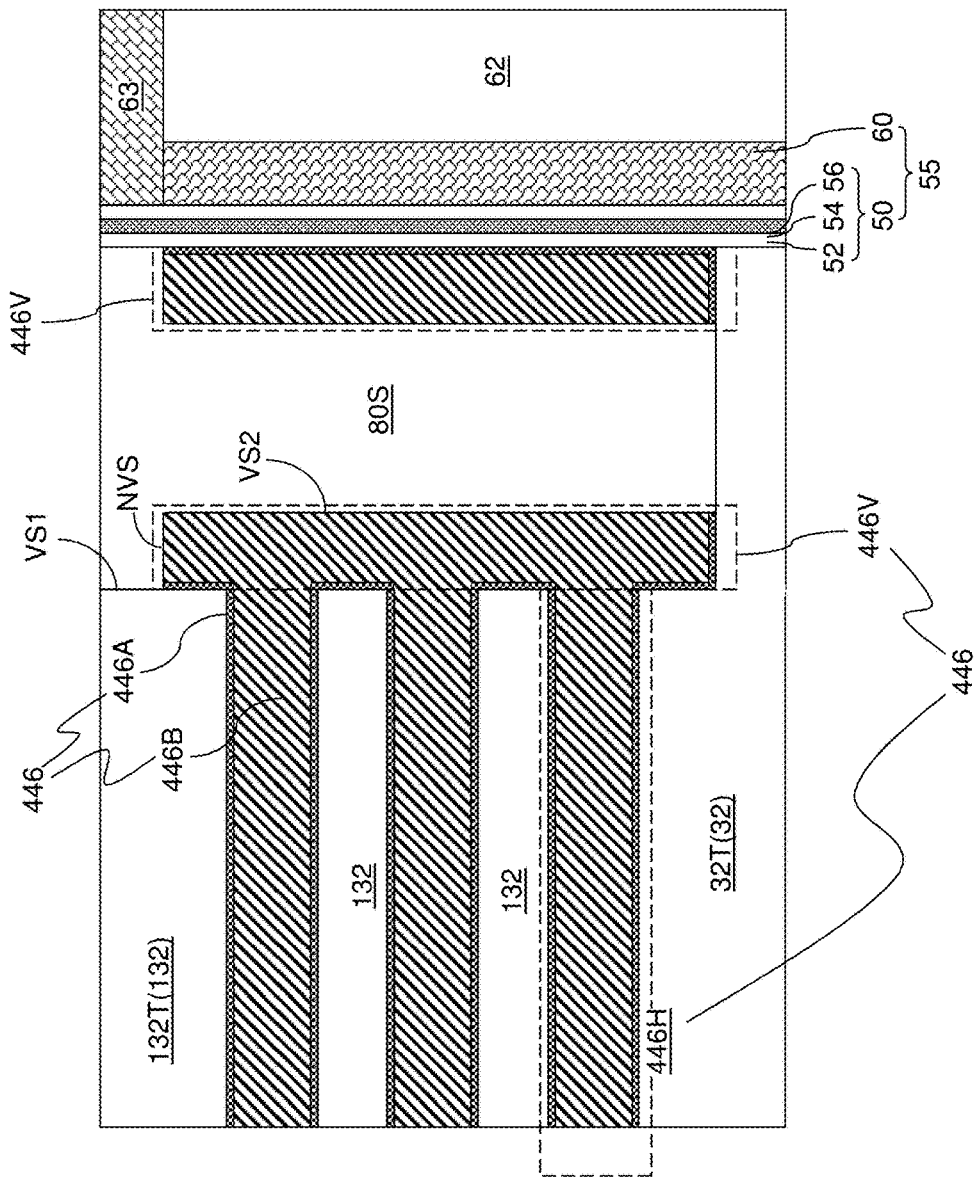
FIG. 15C is a magnified view of a region around a drain-select-level isolation structure in FIG. 15B.

As shown in FIG. 15C, each drain-select-level electrode 446 can include a first metallic barrier liner 446A that continuously extends from a bottommost surface of the drain-select-level electrode 446 to a topmost surface of the drain-select-level electrode 446. For example, the first metallic barrier liner 446A of each drain-select-level electrode 446 can continuously extend from a bottom surface of a vertical connection portion 446V that contacts a recessed horizontal surface of the topmost insulating layer 32T to a top surface of the vertical connection portion 446V that contacts a stepped surface of a drain-select-level isolation structure 80S.

Each drain-select-level electrode 446 can include a first metallic fill material portion 446B that consists essentially of an elemental metal or an intermetallic alloy. The first metallic fill material portion 446B can contact a non-vertical surface NVS (such as a horizontal stepped surface) of a drain-select-level isolation structure 80S, for example, at the topmost surface located at a top end of the vertical connection portion 446V. The non-vertical surface NVS adjoins a bottom edge of a first vertical surface VS1 of the drain-select-level isolation structure 80S and adjoins a top edge of a second vertical surface VS2 of the drain-select-level isolation structure 80S.

Figure 15D:
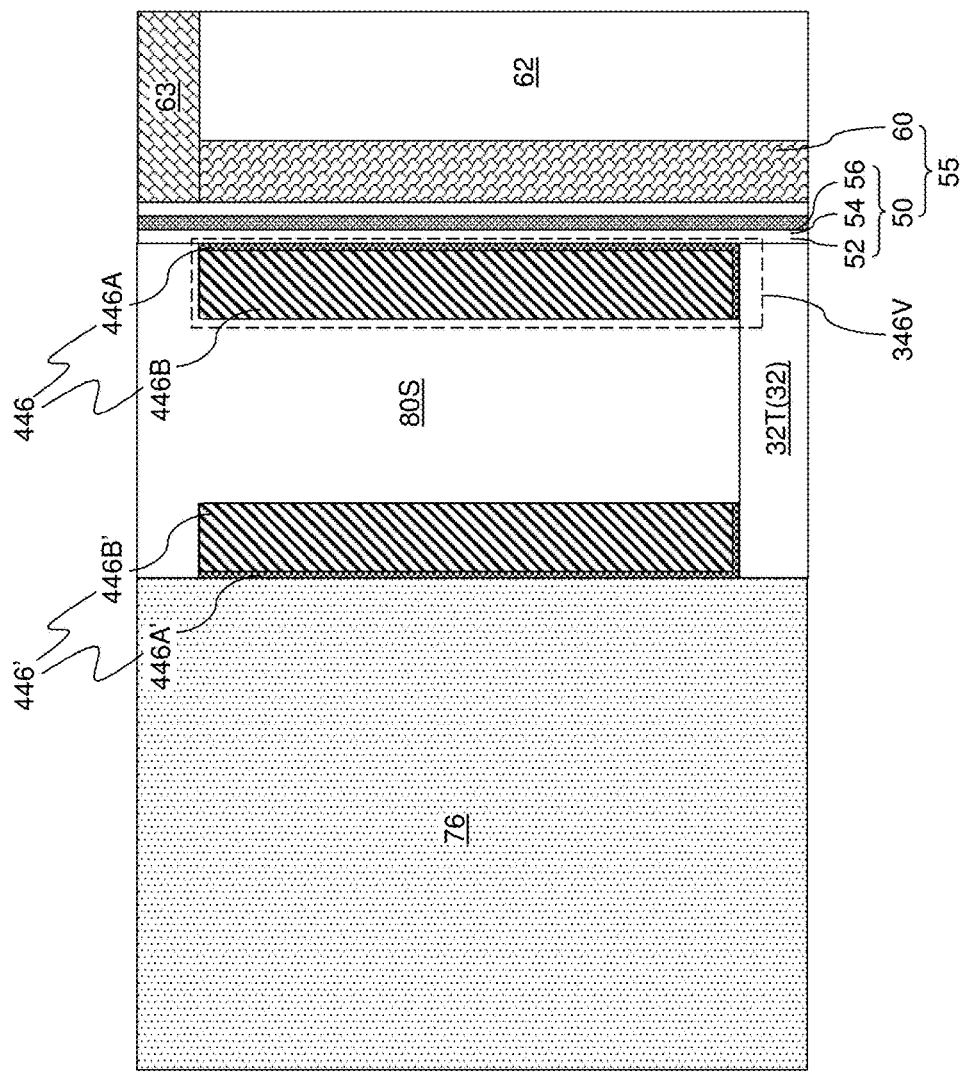
FIG. 15D is a magnified view of a region around the dielectric divider structure of FIG. 15B.

As shown in FIG. 15D, each vertical metallic spacer 446' can include a second metallic barrier liner 446A' having a same composition and thickness as a first metallic barrier liner 446A of the drain-select-level electrodes 446. Further, each vertical metallic spacer 446' can include a second metallic fill material portion 446B' having a same composition and lateral thickness as a portion of a first metallic fill material portion 446B within a vertical connection portion 446V of a drain-select-level electrode 446. Each vertical metallic spacer 446' contacts a sidewall of a dielectric divider structure 76 and a drain-select-level isolation structure 80S. Thus, each of the vertical metallic spacers 446' can comprise a respective second metallic barrier layer 446A' having a same composition and a same thickness as the first metallic barrier layers 446A, and can comprise a respective second metallic fill material portion 446B' having a same composition as the first metallic fill material portions 446B.

Figure 16A:
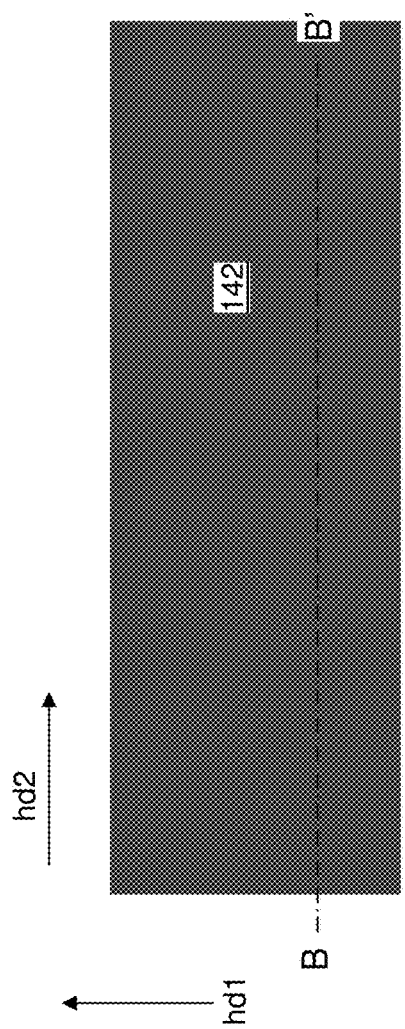
FIG. 16A is a horizontal cross-sectional view of a second exemplary structure after formation of an alternating stack of insulating layers and word-line-level sacrificial material layers, drain-select-level insulating layers, and drain-select-level sacrificial material layers according to a second embodiment of the present disclosure.
Figure 16B:
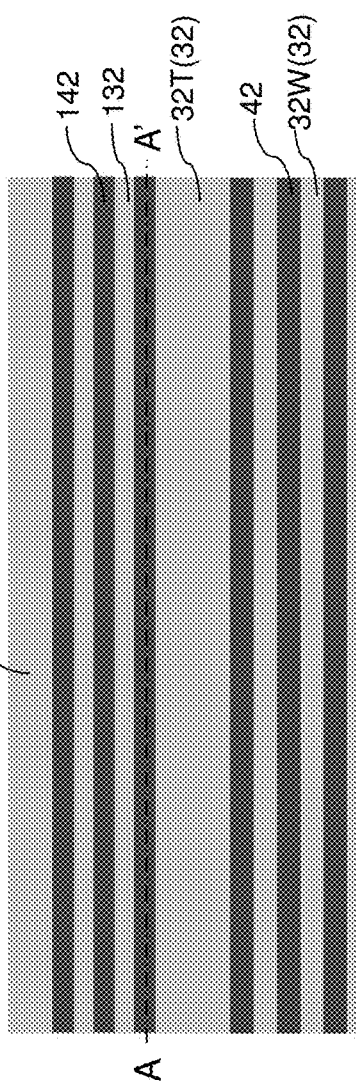
FIG. 16B is a vertical cross-sectional view of the second exemplary structure along the vertical plane B-B' of FIG. 16A. The horizontal plane B-B' is the plane of the horizontal cross-sectional view of FIG. 16A.

Referring to FIGS. 16A and 16B, a second exemplary structure according to a second embodiment of the present disclosure is illustrated at the processing steps of FIGS. 3A and 3B of the first embodiment. The second exemplary structure of FIGS. 16A and 16B can be the same as the first exemplary structure of FIGS. 3A and 3B.

Figure 17A:
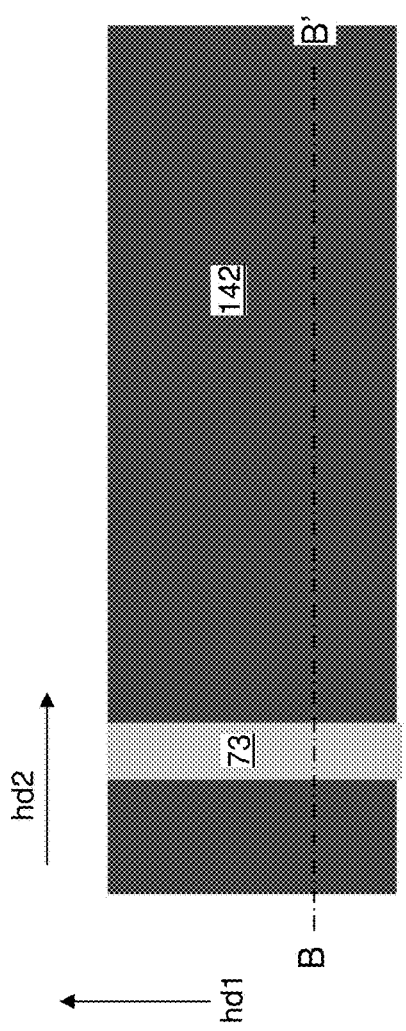
FIG. 17A is a horizontal cross-sectional view of the second exemplary structure after formation of drain-select-level sacrificial line structures according to the second embodiment of the present disclosure.
Figure 17B:
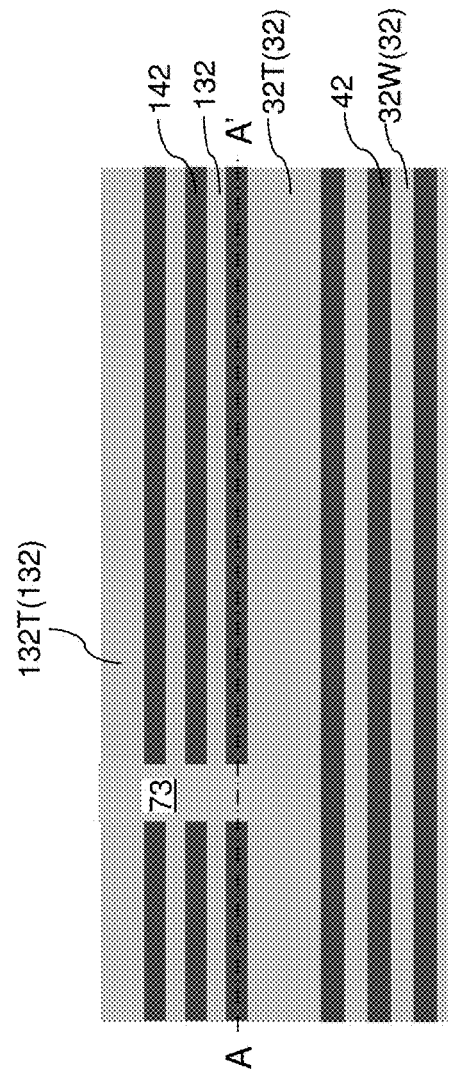
FIG. 17B is a vertical cross-sectional view of the second exemplary structure along the vertical plane B-B' of FIG. 17A. The horizontal plane B-B' is the plane of the horizontal cross-sectional view of FIG. 17A.

Referring to FIGS. 17A and 17B, the second exemplary structure is illustrated at the processing steps of FIGS. 5A and 5B. The processing steps of FIGS. 4, 5A, and 5B can be modified to form drain-select-level sacrificial line structures 73 only at locations of the first subset 51 of the drain-select-level sacrificial line structures 73 of the first exemplary structure without forming any drain-select-level sacrificial line structure 73 adjacent to area 79A at locations at which the second subset S2 of the drain-select-level sacrificial line structures 73. In other words, the pattern of the drain-select-level sacrificial line structures 73 in the second exemplary structure is modified from the pattern of the drain-select-level sacrificial line structures 73 such that only the pattern of the first subset S1 of the drain-select-level sacrificial line structures 73 in the first exemplary structure is present in the second exemplary structure.

Figure 18A:
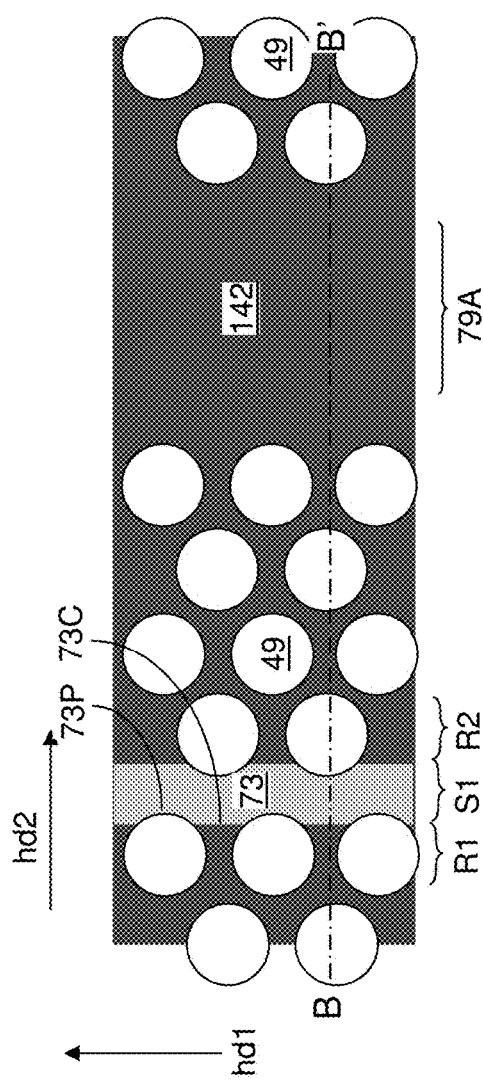
FIG. 18A is a horizontal cross-sectional view of the second exemplary structure after formation of memory openings according to the second embodiment of the present disclosure.
Figure 18B:
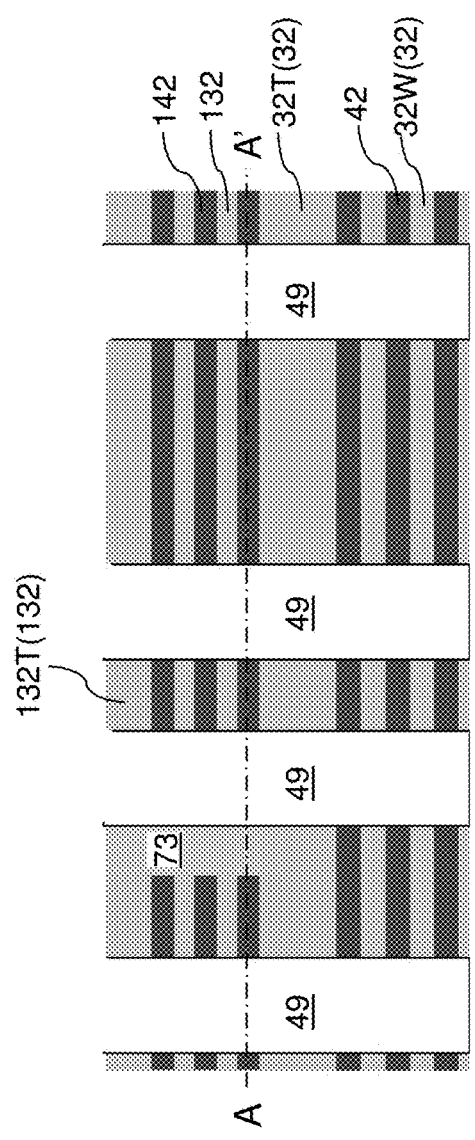
FIG. 18B is a vertical cross-sectional view of the second exemplary structure along the vertical plane B-B' of FIG. 18A. The horizontal plane B-B' is the plane of the horizontal cross-sectional view of FIG. 18A.

Referring to FIGS. 18A and 18B, multiple parallel rows of memory openings 49 are formed through the drain-select-level alternating stack (132, 142), the alternating stack (32 42), and the drain-select-level sacrificial line structures 73. Memory openings 49 within each row are arranged along the first horizontal direction hd1, which is parallel to the lengthwise direction of the drain-select-level sacrificial line structures 73. The multiple parallel rows are laterally spaced apart along the second horizontal direction hd2. A pair of rows (R1, R2) of memory openings 49 can pass through each drain-select-level sacrificial line structure 73. A respective row R1 or R2 of memory openings 49 passes through each lengthwise sidewall of each drain-select-level sacrificial line structure 73.

Segments of each of the drain-select-level sacrificial line structures 73 are etched during formation of the multiple parallel rows of openings 49. Each of the drain-select-level sacrificial line structures 73 can be patterned to include a respective pair of laterally alternating sequences of planar vertical sidewall segments 73P and concave vertical sidewall segments 73C during formation of the memory openings 49. The memory openings can extend to a top surface of the semiconductor material layer 10. Additional openings can be formed in the contact region 300 concurrently with formation of the memory openings 49. Such additional openings are herein referred to as support openings, which can be employed to form support pillar structures therein.

Referring to FIGS. 19A and 19B, the processing steps of FIGS. 7A and 7B can be performed on the second exemplary structure. Memory opening fill structures 58 are formed within each memory opening 49. Each memory opening fill structure 58 can include a memory film 50, a vertical semiconductor channel 60, an optional dielectric core 62, a drain region 63, and a dielectric memory opening cap portion 64. Each contiguous combination of a memory film 50 and a vertical semiconductor channel 60 constitutes a memory stack structure 55. The memory stack structures 55 are formed in the multiple parallel rows of memory openings 49 through the alternating stack, the drain-select-level alternating stack (132, 142), and the drain-select-level sacrificial line structures 73.

Referring to FIGS. 20A and 20B, a photoresist layer (not shown) can be applied over the topmost drain-select-level insulating layer 132T, and can be lithographically patterned to form openings in areas 79A. The pattern in the photoresist layer can be transferred through the drain-select-level alternating stack (132, 142) and the alternating stack (32, 42) employing an anisotropic etch to form backside trenches 79. Each backside trench 79 can vertically extend from the top surface of the topmost drain-select-level insulating layer 132T at least to the top surface of the substrate (9, 10), and laterally extend through the memory array region 100 and the contact region 300.

In one embodiment, the backside trenches 79 can laterally extend along the first horizontal direction hd1 and can be laterally spaced apart among one another along the second horizontal direction hd2 that is perpendicular to the first horizontal direction. The memory stack structures 55 (included in the memory opening fill structures 58) can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of a backside trench 79 and a drain-select-level sacrificial line structure 73, or between a neighboring pair of drain-select-level sacrificial line structures 73. In one embodiment, the backside trenches 79 can include a source contact opening in which a source contact via structure can be subsequently formed. The photoresist layer can be removed, for example, by ashing.

Referring to FIGS. 21A and 21B, word-line-level backside recesses 43, source-select-level backside recesses, and first drain-select-level backside recesses 143 can be formed concurrently (i.e., simultaneously within a same processing step) by isotropically etching the word-line-level sacrificial material layers 42 and first segments of each of the drain-select-level sacrificial material layers 142 that are physically exposed the backside trenches 79 employing an isotropic etch process. An isotropic etchant that selectively etches the materials of the word-line-level sacrificial material layers 42 and the drain-select-level sacrificial material layers 142 with respect to the materials of the insulating layers 32 and the drain-select-level insulating layers 132 can be employed in the isotropic etch process. The isotropic etchant can be introduced into the backside trenches 79, during the isotropic etch process while remaining portions of the drain-select-level sacrificial line structures 73 protect second segments (i.e., additional segments) of each of the drain-select-level sacrificial material layers 142. Specifically, the combination of the topmost drain-select-level insulating layer 132T and the drain-select-level sacrificial line structures 73 prevent the etchant from accessing the second segments of each of the drain-select-level sacrificial material layers 142. Thus, the drain-select-level sacrificial line structures 73 protect the second segments of drain-select-level sacrificial material layers 142 from the isotropic etchant.

Word-line-level backside recesses 43 are formed in volumes from which the word-line-level sacrificial material layers 42 are removed. First drain-select-level backside recesses 143 are formed in volumes from which the first segments of the drain-select-level sacrificial material layers 142 are removed. The removal of the materials of the word-line-level sacrificial material layers 42 and the first segments of the drain-select-level sacrificial material layers 142 can be selective to the first material of the insulating layers 32, the material of the drain-select-level isolation layers 132, the material of the retro-stepped dielectric material portion 65, the semiconductor material of the semiconductor material layer 10, and the material of the outermost layer of the memory films 50. In one embodiment, the word-line-level sacrificial material layers 42 and the drain-select-level sacrificial material layers 142 can include silicon nitride, and the materials of the insulating layers 32, the drain-select-level isolation layers 132, and the retro-stepped dielectric material portion 65 can be selected from silicon oxide and dielectric metal oxides. The same etch process can be employed as in the processing steps of FIGS. 9A and 9B of the first embodiment.

Each word-line-level backside recess 43 can be a laterally extending cavity having a lateral dimension that is greater than the vertical extent of the cavity. Each first drain-select-level backside recess 143 can be a laterally extending cavity having a lateral dimension that is greater than the vertical extent of the cavity. A plurality of word-line-level backside recesses 43 can be formed in the volumes from which the second material of the word-line-level sacrificial material layers 42 is removed. A plurality of first drain-select-level backside recesses 143 can be formed in the volumes from which the material of the drain-select-level sacrificial material layers 142 is removed. The memory openings in which the memory stack structures 55 are formed are herein referred to as front side openings or front side cavities in contrast with the word-line-level backside recesses 43. In one embodiment, the memory array region 100 comprises an array of monolithic three-dimensional NAND strings having a plurality of device levels disposed above the substrate (9, 10). In this case, each word-line-level backside recess 43 can define a space for receiving a respective word line of the array of monolithic three-dimensional NAND strings.

Referring to FIGS. 22A and 22B, a backside blocking dielectric layer (not expressly illustrated) can be optionally formed at peripheral portions of the word-line-level backside recesses 43, the first drain-select-level backside recesses 143, and the backside trenches 79 by a conformal deposition process. The backside blocking dielectric layer, if present, comprises a dielectric material that functions as a control gate dielectric for the control gates to be subsequently formed in the word-line-level backside recesses 43. In case the blocking dielectric layer 52 is present within each memory opening, the backside blocking dielectric layer is optional. In case the blocking dielectric layer 52 is omitted, the backside blocking dielectric layer is present. For example, the backside blocking dielectric layer can include a dielectric metal oxide such as aluminum oxide.

Word-line-level electrically conductive layers 46, source select gate electrodes, and first segments of drain-select level electrically conductive layers are formed in the word-linelevel backside recesses 43, the source-select-level recesses and in the first drain-select-level backside recesses 143 simultaneously. The first segments of drain-select-level electrically conductive layers are herein referred to as first drain-select-level electrically conductive layers 146.

For example, at least one conductive material can be conformally deposited in the word-line-level backside recesses 43 and the first drain-select-level backside recesses 143. For example, a combination of a metallic barrier layer and a metal fill material can be deposited in the word-line-level backside recesses 43 and the first drain-select-level backside recesses 143. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited on the metallic barrier layer to fill remaining volumes of the word-line-level backside recesses 43 and the first drain-select-level backside recesses 143. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal.

Excess portions of the deposited metallic material in the backside trenches 79 and over the topmost drain-select-level insulating layer 132T can be etched back, for example, by an isotropic wet etch, an anisotropic dry etch, or a combination thereof. Remaining portions of the deposited metallic material in the word-line-level backside recesses 43 comprise word-line-level electrically conductive layers 46. Remaining portions of the deposited metallic material in the first drain-select-level backside recesses 143 comprise first drain-select-level electrically conductive layers 146H. Each word-line-level electrically conductive layer 46 can be a conductive line structure. Thus, the word-line-level sacrificial material layers 42 can be replaced with the word-line-level electrically conductive layers 46. Each word-line-level electrically conductive layer 46 can include a portion of the metallic barrier layer and a portion of the metallic fill material. Each first drain-select-level electrically conductive layer 146H can be a conductive line structure. Thus, the first segments of the drain-select-level sacrificial material layers 142 can be replaced with the first drain-select-level electrically conductive layers 146H. Each first drain-select-level electrically conductive layer 146H can include a portion of the metallic barrier layer and a portion of the metallic fill material.

Referring to FIGS. 23A and 23B, the processing steps of FIGS. 11A and 11B can be performed to form a dielectric divider structure 76 within each backside trench 79. In one embodiment, each dielectric divider structure 76 can be a dielectric wall structure laterally extending along the first horizontal direction hd1 and vertically extending through an alternating stack of the insulating layers 32 and the word-line-level electrically conductive layers 46 and through the alternating stack of the drain-select-level insulating layers 132 and the first drain-select-level electrically conductive layers 146H. In one embodiment, the dielectric divider structure 76 can be formed in a tubular shape, for example, by deposition of a conformal dielectric material liner and an anisotropic etch process, and a conductive contact via structure may be formed within a cavity in the tubular dielectric divider structure 76. In this case, a source region (not shown) may be formed in an upper portion of the semiconductor material layer 10 underlying the backside trench 79.

In one embodiment, each dielectric divider structure 76 includes a pair of lengthwise sidewalls that laterally extend along the first horizontal direction hd1 and vertically extends through the alternating stack of the insulating layers 32 and the word-line-level electrically conductive layers 46 and through the levels of the first drain-select-level electrically conductive layers 146H that correspond to the levels of the drain-select level sacrificial material layers 142.

Referring to FIGS. 24A and 24B, remaining portions of the drain-select-level sacrificial line structures 73 can be subsequently removed by a selective etch process that etches the material of the drain-select-level sacrificial line structures 73 selective to the materials of the dielectric memory opening cap portions 64, the topmost drain-select-level insulating layer 132T, and the dielectric divider structures 76. For example, if the drain-select-level sacrificial line structures 73 include amorphous silicon or polysilicon, a wet etch process employing hot trimethyl-2 hydroxyethyl ammonium hydroxide ("hot TMY"), tetramethyl ammonium hydroxide (TMAH), or ammonium hydroxide can be employed to remove the drain-select-level sacrificial line structures 73. Drain-select-level isolation trenches 71 can be formed in the volumes from which the drain-select-level sacrificial line structures 73 are removed.

Referring to FIGS. 25A and 25B, the second segments (i.e., the remaining segments) of the drain-select-level sacrificial material layers 142 are removed by a selective etch process that etches the material of the second segments of the drain-select-level sacrificial material layers 142 without etching the materials of the drain-select-level insulating layers 132, the first drain-select-level electrically conductive layers 146H, or the dielectric divider structures 76. For example, if the drain-select-level sacrificial material layers 142 include silicon nitride and if the drain-select-level insulating layers 132 or the dielectric divider structures 76 include silicon oxide materials, the second segments of the drain-select-level sacrificial material layers 142 can be removed by a wet etch process employing hot phosphoric acid provided into the drain-select-level isolation trenches 71. Second drain-select-level backside recesses 243 are formed in volumes from which the second segments of the drain-select-level sacrificial material layers 142 are removed through the drain-select-level isolation trenches 71.

Referring to FIGS. 26A and 26B, at least one metallic fill material is deposited in the second drain-select-level backside recesses 243 through the drain-select-level isolation trenches 71, and peripheral portions of the drain-select-level isolation trenches 71 by at least one conformal deposition process. The at least one metallic fill material can include, for example, a metallic barrier liner including a conducive metal nitride material (such as TiN, TaN, or WN) and a metal fill material such as tungsten, cobalt, molybdenum, and/or ruthenium. The thickness(es) of the at least one metallic material can be selected such that the drain-select-level isolation trenches 71 are not completely filled with the at least one metallic fill material.

An anisotropic etch process is performed to remove horizontal portions of the at least one metallic fill material from above the topmost drain-select-level insulating layer 132T and from the bottom portion of each drain-select-level isolation trench 71. Each remaining portion of the at least one metallic fill material filling the second drain-select-level backside recesses 243 constitute a strip of a drain-select-level electrically conductive layer, which is herein referred to as a second drain-select-level isolation conductive layer 246H. Each remaining vertical portion of the at least one metallic fill material adjoined to a respective set of first drain-select-level electrically conductive layers 146H constitutes a first vertical connection portion 146V. Each contiguous set of a first vertical connection portion 146V and first drain-select-level electrically conductive layers 146H constitute a first drain-select-level electrode 146. Each remaining vertical portion of the at least one metallic fill material adjoined to a respective set of second drain-select-level electrically conductive layers 246H constitutes a second vertical connection portion 246V. Each contiguous set of at least one second vertical connection portion 246V and second drain-select-level electrically conductive layers 246H constitute a second drain-select-level electrode 246. In one embodiment, a second drain-select-level electrode 246 can include two second vertical connection portions 246V adjoined to two or more second drain-select-level electrically conductive layers 246H.

A drain-select-level cavity 71' that generally extends along the first horizontal direction hd1 can be located within each drain-select-level isolation trench 71. Each first drain-select-level electrically conductive layer 146 can contact a sidewall of a respective one of the dielectric divider structures 76 that laterally extend along the first horizontal direction hd1. Each second drain-select-level electrically conductive layer 246H can be formed in volumes from which a second segment of a drain-select-level sacrificial material layer 142 is removed.

Referring to FIGS. 27A-27E, a dielectric cap layer 80 is formed by depositing a dielectric material such as a silicon oxide material over the topmost drain-select-level insulating layer 132T and in the drain-select-level cavities 71'. Each portion of the dielectric cap layer 80 that fills a respective drain-select-level cavity 71' is herein referred to as a drain-select-level isolation structure 80S. Thus, the drain-select-level isolation structures 80S are formed within volumes from which the remaining portions of the drain-select-level sacrificial line structures 73 are removed.

Each first drain-select-level electrode 146 can include multiple first metallic barrier liners 146A located between a neighboring pair of drain-select-level insulating layers 132 or between a bottommost drain-select-level insulating layer 132 and a topmost insulating layer 32. Each first drain-select-level electrode 146 can include multiple first metallic fill material portions 146B that consists essentially of an elemental metal or an intermetallic alloy. Each first metallic fill material portion 146B can be embedded within a respective one of the first metallic barrier liners 146A. Each first metallic barrier liner 146A and each first metallic fill material portion 146B can contact a sidewall of a respective one of the dielectric divider structures 76.

Each first drain-select-level electrode 146 includes a first metallic barrier liner 146A that continuously extends from a bottommost surface of the first drain-select-level electrode 146 to a topmost surface of the first drain-select-level electrode 146. For example, the first metallic barrier liner 146A of each first drain-select-level electrode 146 can continuously extend from a bottom surface of a first vertical connection portion 146V that contacts a recessed horizontal surface of the topmost insulating layer 32T to a top surface of the first vertical connection portion 146V that contacts a stepped surface of a drain-select-level isolation structure 80S.

Each first drain-select-level electrode 146 can include a first metallic fill material portion 146B that consists essentially of an elemental metal or an intermetallic alloy. The first metallic fill material portion 146B can contact a non-vertical surface NVS (such as a stepped surface) of a drain-select-level isolation structure 80S, for example, at the topmost surface located at a top end of the first vertical connection portion 146V. The non-vertical surface NVS adjoins a bottom edge of a first vertical surface VS1 of the drain-select-level isolation structure 80S and adjoins a top edge of a second vertical surface VS2 of the drain-select-level isolation structure 80S.

Each second drain-select-level electrode 246 includes a second metallic barrier liner 246A that continuously extends from a bottommost surface of the second drain-select-level electrode 246 to a topmost surface of the second drain-select-level electrode 246. For example, the second metallic barrier liner 246A of each second drain-select-level electrode 246 can continuously extend from a bottom surface of a second vertical connection portion 246V that contacts a recessed horizontal surface of the topmost insulating layer 32T to a top surface of the second vertical connection portion 246V that contacts a stepped surface of a drain-select-level isolation structure 80S.

Each second drain-select-level electrode 246 can include a second metallic fill material portion 246B that consists essentially of an elemental metal or an intermetallic alloy. The second metallic fill material portion 246B can contact a non-vertical surface NVS (such as a stepped surface) of a drain-select-level isolation structure 80S, for example, at the topmost surface located at a top end of the second vertical connection portion 246V. The non-vertical surface NVS adjoins a bottom edge of a first vertical surface VS1 of the drain-select-level isolation structure 80S and adjoins a top edge of a second vertical surface VS2 of the drain-select-level isolation structure 80S.

The second metallic barrier layer 246A is deposited in a different deposition step than the first metallic barrier layer 146A. As such, the second metallic barrier layer 246A can differ from the first metallic barrier layer 146A by thickness and/or by material composition. For example, the second metallic barrier layer 246A and the first metallic barrier layer 146A can include titanium nitride in which the atomic ratio of titanium atoms to nitrogen atoms are different, or one includes titanium nitride and the other includes tantalum or tungsten nitride.

Referring to all drawings of the first embodiment and the second embodiment, each of the first and second exemplary structures can include a three-dimensional memory device. The three-dimensional memory device can include: an alternating stack of insulating layers 32 (i.e., word-line-level insulating layers) and word-line-level electrically conductive layers 46 located over a substrate (9, 10); a plurality of multi-level drain select electrodes{446, (146, 246)}, each comprising a respective vertical connection portion {446V, (146V, 246V)} contacting and electrically connected to a respective set of drain-select-level electrically conductive layers {446H, (146H, 246H)} that are vertically spaced apart among one another and located over the alternating stack (32, 46); memory stack structures 55 comprising a respective vertical semiconductor channel 60 and a respective memory film 50, wherein each memory film 50 has a respective sidewall that extends through the alternating stack (32, 46) and each level of the multi-level drain select electrodes {446, (146, 246)}; and a first drain-select-level isolation structure 80S overlying the alternating stack (32, 46), laterally extending along a first horizontal direction hd1 and located between a neighboring pair of the multi-level drain select electrodes {446, (146, 246)}, and including a pair of sidewalls that include a respective set of concave vertical sidewall segments, wherein at least one multi-level drain select electrode (446, 246) of the plurality of multi-level drain select electrodes {446, (146, 246)} contacts a sidewall of the first drain-select-level isolation structure 80S.

In one embodiment, at least one multi-level drain select electrode (446, 246) of the plurality of multi-level drain select electrodes {446, (146, 246)} comprises a metallic barrier layer (446A, 146A, 246A) and a metallic fill material portion (446B, 146B, 246B).

In one embodiment, an upper portion of some of the memory stack structures 55 is surrounded by a respective one of the plurality of multi-level drain select electrodes {446, (146, 246)}. In one embodiment, each vertical connection portion {446V, (146V, 246V)} of the multi-level drain select electrodes {446, (146, 246)} comprises a sidewall including concave vertical sidewall segments located between a pair of the memory stack structures 55. Each sidewall may include a laterally alternating sequence of concave vertical metallic sidewall segments and planar vertical metallic sidewall segments, or a set of concave vertical metallic sidewalls segments that are adjoined among one another.

In one embodiment, a dielectric divider structure 76 including a pair of straight sidewalls that laterally extend along the first horizontal direction hd1 and vertically extending through the alternating stack (32, 46) can be provided. In one embodiment, the dielectric divider 76 structure is laterally spaced from the drain-select-level isolation structures 80S.

In one embodiment, a vertical metallic spacer 446' can contact a sidewall of the dielectric divider structure 76 and a second drain-select-level isolation structure 80S laterally spaced from the first drain-select-level isolation structure 80S.

In one embodiment, the vertical metallic spacer 446' comprises an additional metallic barrier layer 446A' having a same composition and a same thickness as the metallic barrier layer 446A of the multi-level drain select electrode 446 and comprises an additional metallic fill material portion 446B' having a same composition as the metallic fill material portion 446B of the multi-level drain select electrode 446.

In one embodiment, the second drain-select-level isolation structure 80S overlies the alternating stack (32, 42), laterally extends along a first horizontal direction hd1, and includes a sidewall including a set of concave vertical sidewall segments on one side and a vertical sidewall that laterally extends along the first horizontal direction hd1 and contacts the vertical metallic spacer 446' on another side. In one embodiment, the dielectric divider structure 76 contacts sidewalls of a pair of multi-level drain select electrodes {446, (146, 246)} of the plurality of the multi-level drain select electrodes {446, (146, 246)}.

Figure 27C:
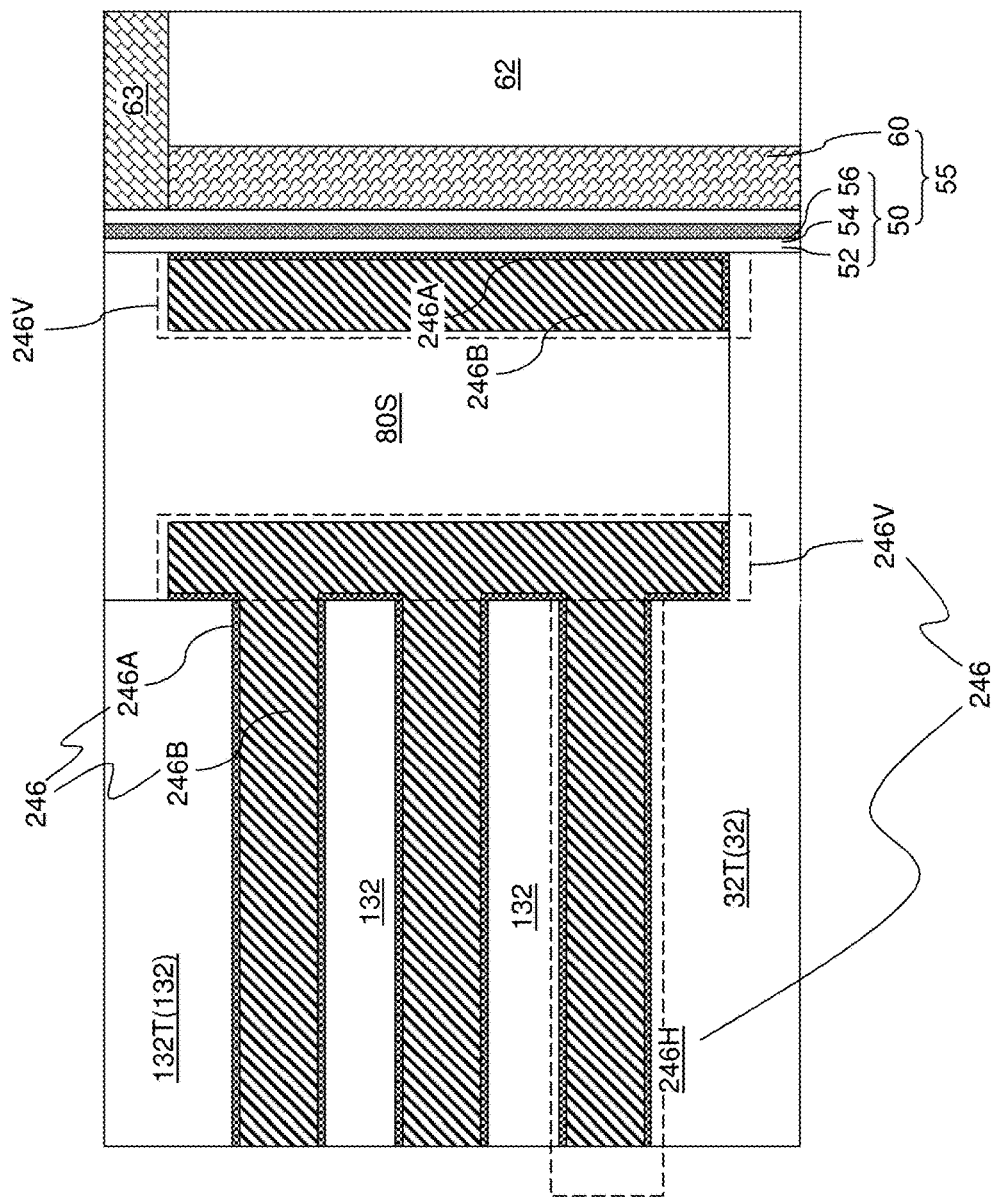
FIG. 27C is a magnified view of a region around a second drain-select-level isolation structure in FIG. 27B.
Figure 27D:
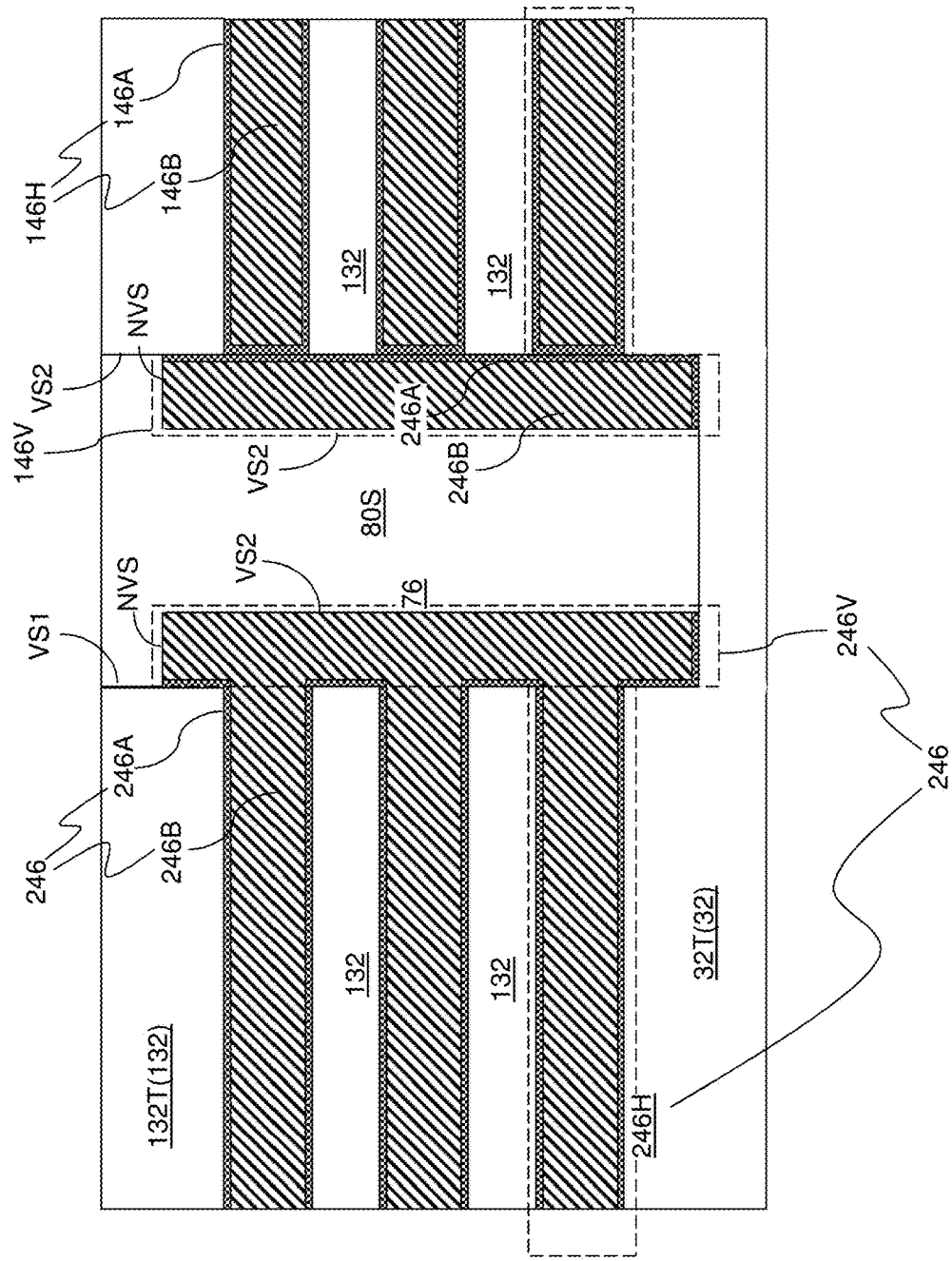
FIG. 27D is a magnified view of another region around the second drain-select-level isolation structure of FIG. 27B.
Figure 27E:
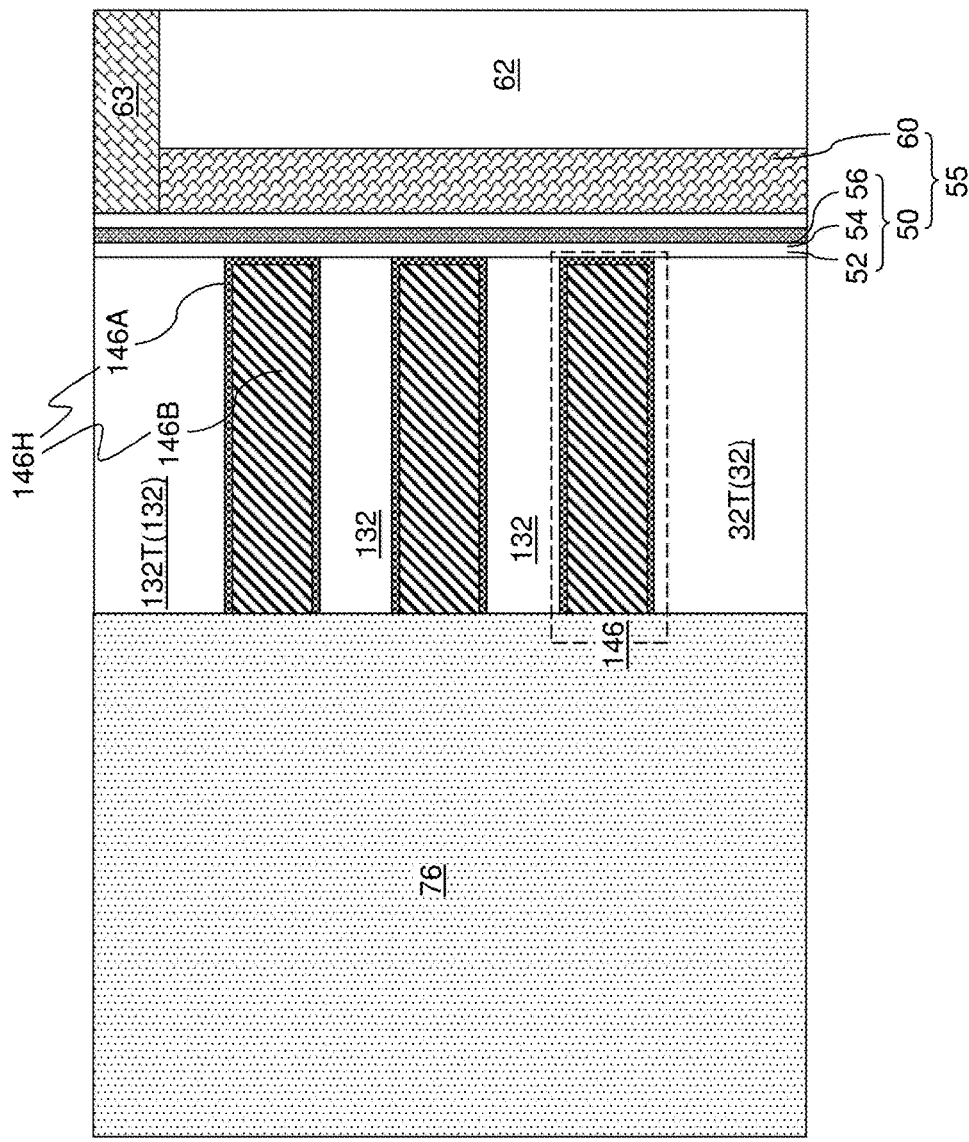
FIG. 27E is a magnified view of a region around the dielectric divider structure of FIG. 27B.

In the second embodiment, the second multi-level drain select electrode 246 of the plurality of multi-level drain select electrodes (146, 246) contacts a sidewall of the first drain-select-level isolation structure 80S. In this embodiment, the first multi-level drain select electrode 146 is referred as an "additional" multi-level drain select electrode 146 to indicate that it is present in addition to the second multi-level drain select electrode 246. Each drain-select-level electrically conductive layer 146H within the additional multi-level drain select electrode 146 of the plurality of multi-level drain select electrodes (146, 246) comprises a first metallic barrier layer 146A and a first metallic fill material portion 146B that contact the dielectric divider structure 76 and does not contact the first drain-select-level isolation structure 80S. In the second embodiment, a vertical connection portion 146V of the additional multi-level drain select electrode 146 comprises a second metallic barrier layer 246A contacting sidewalls of each drain-select-level electrically conductive layer 146H within the additional multi-level drain select electrode 146; and a second metallic fill material portion 246B which is laterally spaced from the first metallic fill material portions 146B of the drain-select-level electrically conductive layers 146H of the additional multi-level drain select electrode 146 by the first metallic barrier layers 146A and the second metallic barrier layer 246A, as shown in FIG. 27D.

In one embodiment, the three-dimensional memory device can comprise at least one feature selected from: a first feature that the second metallic barrier layer 246A differs from the first metallic barrier layers 146A of the drain-select-level electrically conductive layers 146H of the additional multi-level drain select electrode 146 by thickness or by material composition; and/or a second feature that the second metallic fill material portion 246B differs from the first metallic fill material portions 146B of the drain-select-level electrically conductive layers 146H of the additional multi-level drain select electrode 146 by material composition.

Figure 28A:
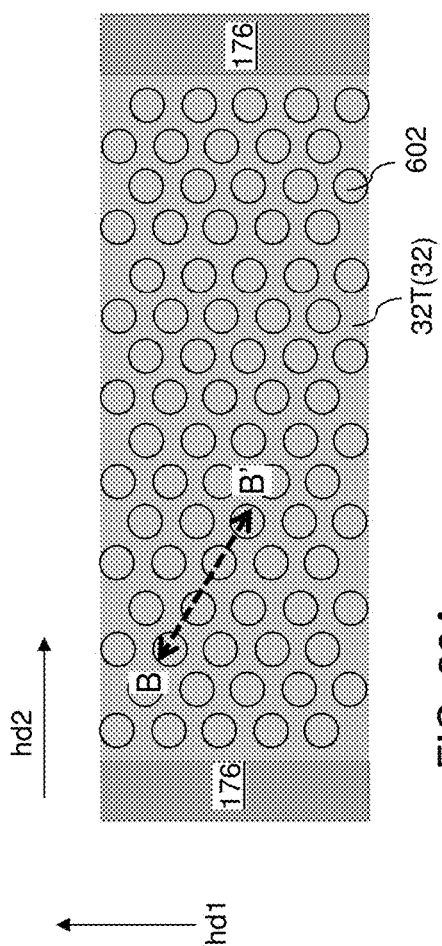
FIG. 28A is a horizontal cross-sectional view of a third exemplary structure after formation of an alternating stack of insulating layers and word-line-level sacrificial material layers and lower memory opening fill portions according to a third embodiment of the present disclosure.
Figure 28B:
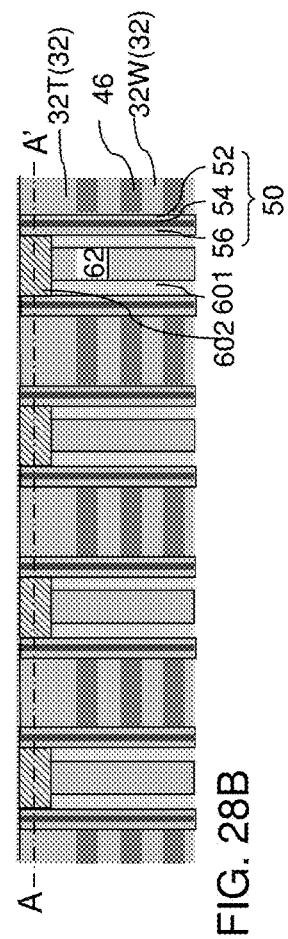
FIG. 28B is a vertical cross-sectional view of the third exemplary structure along the vertical plane B-B' of FIG. 28A. The horizontal plane B-B' is the plane of the horizontal cross-sectional view of FIG. 28A.

Referring to FIGS. 28A and 28B, a third exemplary structure can be derived from the first exemplary structure of FIG. 2 by omitting the processing steps of FIGS. 3A and 3B, performing the processing steps of FIG. 4, omitting the processing steps of FIGS. 5A and 5B, and performing the processing steps of FIGS. 6A, 6B, 7A, and 7B. Thus, an alternating stack of insulating layers 32 and word-line-level spacer material layers 42 is formed over a substrate (9, 10) without forming the drain-select-level layers (132, 142) of the first and second embodiments at this step. The word-line-level spacer material layers can be formed as, or can be subsequently replaced with, word-line-level electrically conductive layers 46.

Word-line-level memory openings extending through the alternating stack (32, 42) are formed at the processing steps of the third embodiment that correspond to the processing steps of FIGS. 6A and 6B of the first embodiment. Word-line-level memory opening fill structures (50, 601, 62, 602) (which are also referred to as lower memory opening fill structures) are formed in the word-line-level memory openings at the processing steps of the third embodiment that correspond to the processing steps of FIGS. 7A and 7B of the first embodiment. The word-line-level memory opening fill structures (50, 601, 62, 602) can be formed in rows that laterally extend along the first horizontal direction hd1. Adjacent rows of word-line-level memory opening fill structures (50, 601, 62, 602) are laterally spaced apart along the second horizontal direction hd2.

Specifically, a memory film 50 can be formed within each word-line-level memory opening. Each component of the memory film 50 of the third embodiment can have the same composition and thickness as the corresponding component of the memory film 50 of the first and second embodiments. A word-line-level semiconductor channel portion 601 is formed in the third embodiment in lieu of a vertical semiconductor channel 60 of the first and second embodiments. The word-line-level semiconductor channel portion 601 can have the same composition and thickness as the vertical semiconductor channel 60 of the first and second embodiments. The dielectric core 62 of the third embodiment can be the same as the dielectric core 62 of the first and second embodiments. A connection channel portion 602 having a doping of the first conductivity type can be formed in lieu of a drain region 63 of the first and second embodiments at the processing step that correspond to the processing steps of FIGS. 7A and 7B that form the drain regions 63. In this case, the connection channel portion 602 can have the same type of doping as the word-line-level semiconductor channel portion 60. The atomic concentration of dopants of the first conductivity type in the word-line-level semiconductor channel portion 601 may be in a range from $1.0 \times 10^{14}/cm^3$ to $1.0 \times 10^{18}/cm^3$, although lesser and greater atomic concentrations can also be employed. The atomic concentration of dopants of the first conductivity type in the connection channel portion 602 may be in a range from $1.0 \times 10^{18}/cm^3$ to $2.0 \times 10^{21}/cm^3$, although lesser and greater atomic concentrations can also be employed. The top surface of the topmost insulating layer 32T can be employed as a planarization surface during planarization processes. Formation of the dielectric memory opening cap portions 64 can be omitted. Thus, the top surfaces of the connection channel portions 602 can be coplanar with the top surface of the topmost insulating layer 32T.

In one embodiment, the word-line-level spacer material layers are formed as word-line-level sacrificial material layers 42 and are subsequently replaced with the word-line-level electrically conductive layers 46 by forming backside trenches 79 and word-line-level backside recesses 43, and by depositing at least one conductive material in the word-line-level backside recesses 43 as in the first and second embodiments. In this case, the word-line-level backside recesses 43 can be formed by isotropically etching the word-line-level sacrificial material layers 42 employing an isotropic etchant provided into the backside trench 79. The word-line-level electrically conductive layers 46 are formed in the word-line-level backside recesses 43.

A dielectric divider structure 176 can be formed within each backside trench 79 by filling the backside trenches 79 with a dielectric material. The dielectric divider structure 176 can include a pair of lengthwise sidewalls that laterally extend along a first horizontal direction hd1 and can vertically extends-through an alternating stack of the insulating layers (i.e., the word-line-level insulating layers) 32 and the word-line-level electrically conductive layers 46. In this case, a top surface of the dielectric divider structure can be coplanar with the top surface of the topmost insulating layer 32T.

Figure 29A:
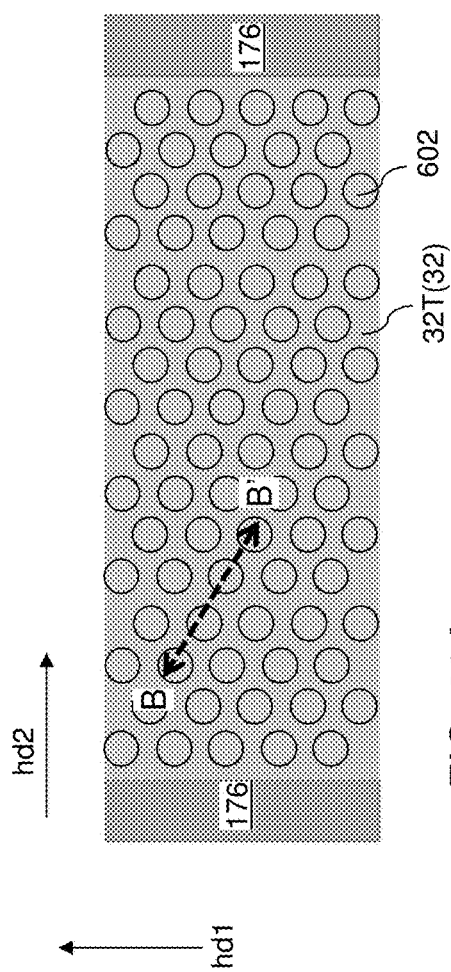
FIG. 29A is a horizontal cross-sectional view of a third exemplary structure after formation of an insulating cap layer and a dielectric etch stop material layer according to a third embodiment of the present disclosure.
Figure 29B:
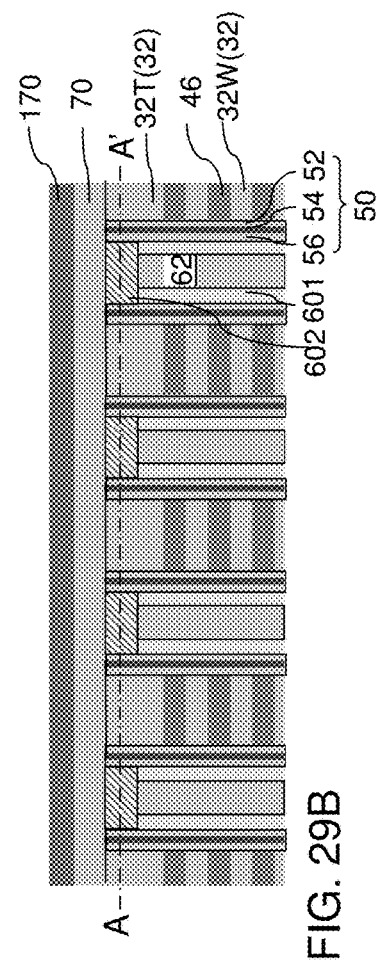
FIG. 29B is a vertical cross-sectional view of the third exemplary structure along the vertical plane B-B' of FIG. 29A. The horizontal plane B-B' is the plane of the horizontal cross-sectional view of FIG. 29A.

Referring to FIGS. 29A and 29B, an insulating cap layer 70 and a dielectric etch stop material layer 170 may be optionally formed above the alternating stack (32, 46) and the word-line-level memory opening fill structures (50, 601, 62, 602). The insulating cap layer 70 can include a dielectric material such as undoped silicate glass or a doped silicate glass. The dielectric etch stop material layer 170 includes a material, such as aluminum oxide, that is different from the material of the insulating cap layer 70. The dielectric etch stop material layer 170 can function as an etch stop layer during a subsequent anisotropic etch process that forms drain-select-level memory openings. The thickness of the insulating cap layer 70 can be in a range from 20 nm to 200 nm, although lesser and greater thicknesses can also be employed. The thickness of the dielectric etch stop material layer 170 can be in a range from 10 nm to 100 nm, although lesser and greater thicknesses can also be employed.

Referring to FIGS. 30A and 30B, an alternating stack of drain-select-level insulating layers 132 and drain-select-level sacrificial material layers 242 can be formed over the dielectric etch stop material layer 170, which overlies the dielectric divider structures. The drain-select-level sacrificial material layers 242 are spaced apart by the drain-select-level insulating layers 132. The drain-select-level insulating layers 132 includes a dielectric material such as undoped silicate glass or a doped silicate glass. The drain-select-level sacrificial material layers 242 include a sacrificial material that can be removed selective to the drain-select-level insulating layers 132. For example, the drain-select-level sacrificial material layers 242 can include a semiconductor material such as amorphous silicon, polysilicon, or a silicon-germanium alloy. The drain-select-level insulating layers 132 and the drain-select-level sacrificial material layers 242 can be deposited by an alternating sequence of chemical vapor deposition processes that sequentially deposits each layer within the alternating stack of the drain-select-level insulating layers 132 and the drain-select-level sacrificial material layers 242. The thickness of each layer within the alternating stack of the drain-select-level insulating layers 132 and the drain-select-level sacrificial material layers 242 may be in a range from 20 nm to 50 nm, although lesser and greater thicknesses can also be employed. The topmost drain-select-level insulating layer 132T may have a thickness in a range from 40 nm to 200 nm, although lesser and greater thicknesses can also be employed.

Figure 31A:
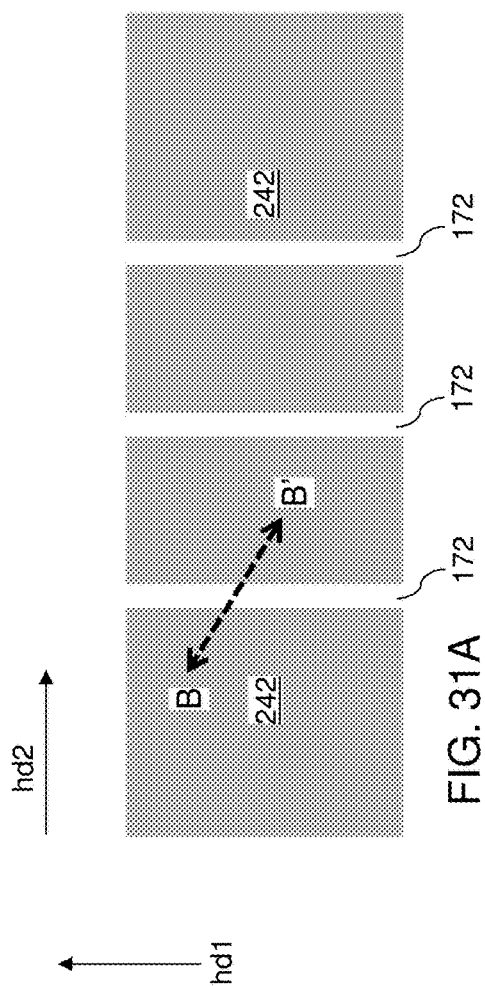
FIG. 31A is a horizontal cross-sectional view of the third exemplary structure after formation of drain-select-level line trenches according to the third embodiment of the present disclosure.
Figure 31B:
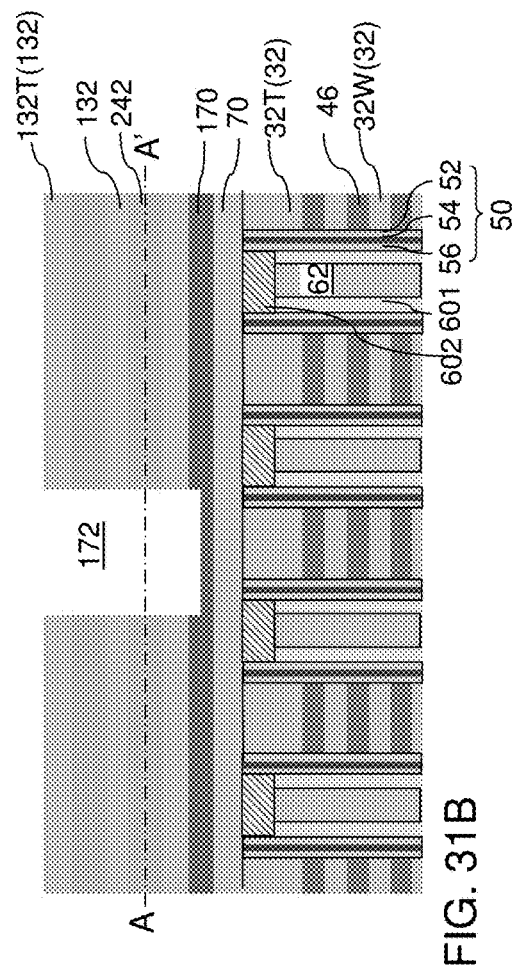
FIG. 31B is a vertical cross-sectional view of the third exemplary structure along the vertical plane B-B' of FIG. 31A. The horizontal plane B-B' is the plane of the horizontal cross-sectional view of FIG. 31A.

Referring to FIGS. 31A and 31B, drain-select-level line trenches 172 can be formed through the alternating stack of the drain-select-level insulating layers 132 and the drain-select-level sacrificial material layers 242. For example, an etch mask such as a patterned photoresist layer can be formed over the topmost drain-select-level insulating layer 132T. The dielectric etch stop material layer 170 can be employed as an etch stop layer during an anisotropic etch process employed to form the drain-select-level line trenches 172. The etch mask layer can be subsequently removed, for example, by ashing. The drain-select-level line trenches 172 can laterally extend along a first horizontal direction hd1. In one embodiment, the drain-select-level line trenches 172 can be formed such that each drain-select-level line trench 172 partially overlaps in area with a neighboring pair of rows of word-line-level memory opening fill structures (50, 601, 62, 602) that laterally extend along the first horizontal direction hd1 in a plan view, i.e., in a see-through view along a direction perpendicular to the top surface of the substrate (9, 10).

Referring to FIGS. 32A and 32B, a sacrificial material is deposited in the drain-select-level line trenches 172 to form drain-select-level sacrificial line structures 173. The sacrificial material of the drain-select-level sacrificial line structures 173 can be the same as, or can be different from, the sacrificial material of the drain-select-level sacrificial material layers 242. In one embodiment, the drain-select-level sacrificial line structures 173 can include the same material as the sacrificial material of the drain-select-level sacrificial material layers 242. In another embodiment, the drain-select-level sacrificial line structures 173 can include a sacrificial material that is different from the sacrificial material of the drain-select-level sacrificial material layers 242.

In an illustrative example, the drain-select-level sacrificial line structures 173 can include silicon nitride, and the sacrificial material of the drain-select-level sacrificial material layers 242 can include a semiconductor material such as amorphous silicon, polysilicon, or a silicon-germanium alloy. Each drain-select-level sacrificial line structure 173 vertically extends through each of the drain-select-level sacrificial material layers 242 and the drain-select-level insulating layers 132.

Figure 33A:
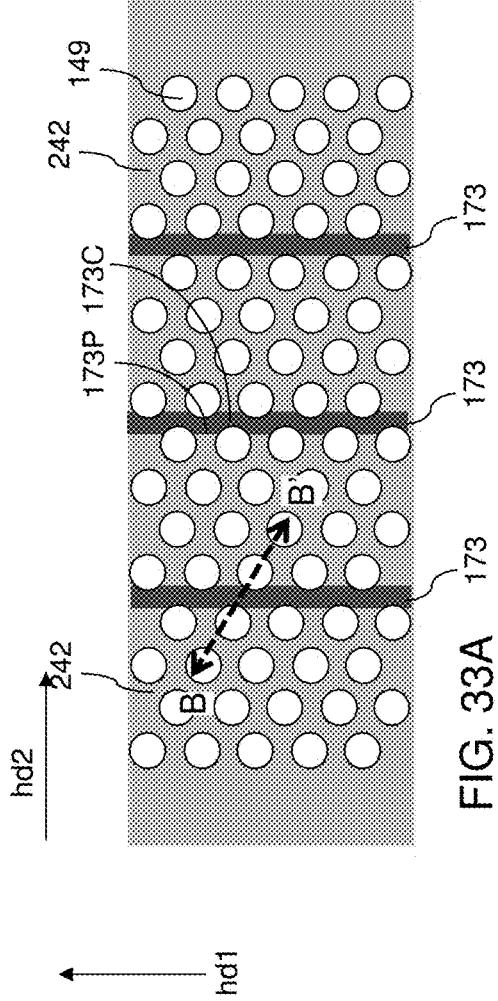
FIG. 33A is a horizontal cross-sectional view of the third exemplary structure after formation of upper memory openings according to the third embodiment of the present disclosure.
Figure 33B:
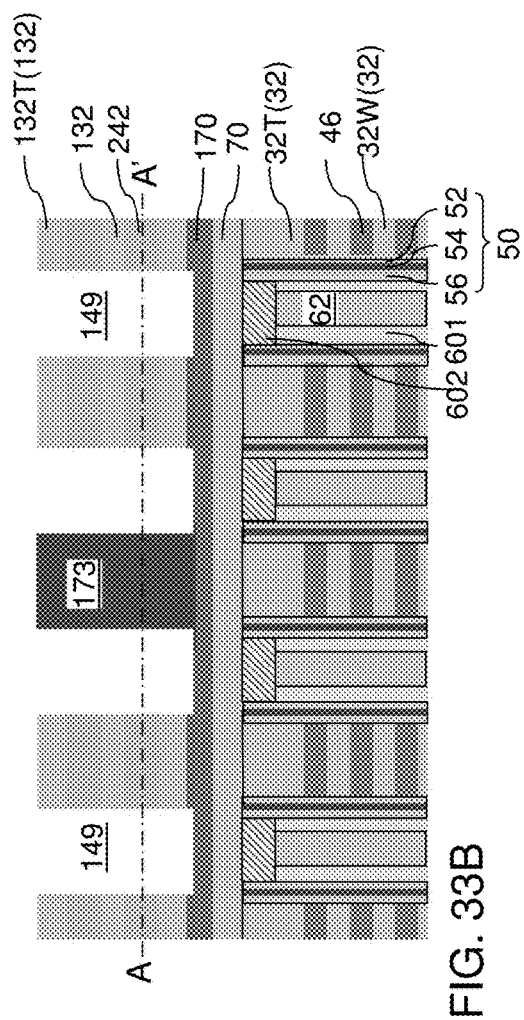
FIG. 33B is a vertical cross-sectional view of the third exemplary structure along the vertical plane B-B' of FIG. 33A. The horizontal plane B-B' is the plane of the horizontal cross-sectional view of FIG. 33A.

Referring to FIGS. 33A and 33B, a photoresist layer (not shown) can be applied over the topmost drain-select-level insulating layer 132T, and can be lithographically patterned to form opening having the same pattern as the word-line-level memory opening fill structures (50, 601, 62, 602), i.e., the pattern of the word-line-level memory openings. In one embodiment, the same lithographic mask previously employed to lithographically expose a photoresist layer that functions as an etch mask for patterning the word-line-level memory openings can be employed again at this processing step to pattern the photoresist layer. The pattern of the openings in the photoresist layer can be transferred through the drain-select-level alternating stack (132, 242) and the drain-select-level sacrificial line structure 173 to form opening therethrough, which are herein referred to as drain-select-level memory openings 149. Each drain-select-level opening 149 (which are also referred to as upper memory openings herein) overlies, and has an areal overlap with in a plan view, with an underlying one of the word-line-level memory opening fill structures (50, 601, 62, 602).

The drain-select-level openings 149 can be formed through peripheral portions of the drain-select-level sacrificial line structures 173. Multiple parallel rows of drain-select-level openings 149 can be arranged along the first horizontal direction hd1 through the drain-select-level spacer material layers 242 and the drain-select-level sacrificial line structures 173. The first horizontal direction hd1 is parallel to a lengthwise direction of the drain-select-level sacrificial line structures 173. Segments of each of the drain-select-level sacrificial line structures 173 are etched during formation of the multiple parallel rows of drain-select-level openings 149. In one embodiment, each of the drain-select-level sacrificial line structures 173 can be patterned to include a respective pair of laterally alternating sequences of planar vertical sidewall segments 173P and concave vertical sidewall segments 173C during formation of the drain-select-level openings 149.

Referring to FIGS. 34A and 34B, a gate dielectric layer can be subsequently formed by conformal deposition of a gate dielectric material such as silicon oxide and/or a dielectric metal oxide. The gate dielectric layer is herein referred to as a drain-select-level gate dielectric layer 150L. The thickness of the drain-select-level gate dielectric layer 150L can be in a range from 1 nm to 10 nm, although lesser and greater thicknesses can also be employed. A cover material layer 613L can be deposited over the drain-select-level gate dielectric layer 150L by a conformal deposition process. The cover material layer 613L can include a sacrificial material such as amorphous carbon or a non-sacrificial material such as a doped semiconductor material, such as polysilicon or amorphous silicon, which has a doping of the first conductivity type and is subsequently incorporated into a drain-select-level semiconductor channel portion. The thickness of the cover material layer 613L can be in a range from 1 nm to 20 nm, although lesser and greater thicknesses can also be employed.

Referring to FIGS. 35A and 35B, the drain-select-level openings 149 are vertically extended through the etch stop dielectric layer 170 and the insulating cap layer 70 by an anisotropic etch process. The anisotropic etch process removes horizontal portions of the cover material layer 613L and the drain-select-level gate dielectric layer 150L. Each remaining portion of the cover material layer 613L forms a cover material spacer 613, which can have a tubular shape. A top surface of a connection channel portion 602 is physically exposed at the bottom of each drain-select-level openings 149 as vertically extended by the anisotropic etch process. A patterned portion of the drain-select-level gate dielectric layer 150L is present at an upper periphery of each drain-select-level opening 149, which is herein referred to as a drain-select-level gate dielectric 150. The cover material spacer 613 within each drain-select-level opening 149 may be subsequently removed in case the cover material spacer 613 includes a sacrificial material, or may remain on an inner sidewall of a drain-select-level gate dielectric 150 in case the cover material spacer 613 includes a semiconductor material such as polysilicon or amorphous silicon.

Referring to FIGS. 36A and 36B, a doped semiconductor material having a doping of the first conductivity type can be deposited at a periphery of the unfilled volume of each drain-select-level opening 149. The atomic concentration of dopants of the first conductivity type in the doped semiconductor material may be in a range from $1.0 \times 10^{14}/cm^3$ to $1.0 \times 10^{18}/cm^3$, although lesser and greater atomic concentrations can also be employed. In case the drain-select-level openings 149 are not completely filled with the doped semiconductor material, a dielectric material such as silicon oxide may be deposited to fill unfilled volumes of the drain-select-level openings 149. The dielectric material can be vertically recessed below the horizontal plane including the top surface of the topmost drain-select-level insulating layer 132T by a recess etch process. Each remaining portion of the dielectric material forms a drain-select-level dielectric core 162.

A doped semiconductor material having a doping of the second conductivity type is formed in the recesses overlying the drain-select-level dielectric cores 162. The doped semiconductor material having a doping of the second conductivity type may be formed by deposition of a semiconductor material having a doping of a second conductivity type, or may be formed by deposition of an undoped semiconductor material and by ion implantation of dopants of the second conductivity type. Excess portions of the doped semiconductor material having a doping of the first conductivity type and the doped semiconductor material having a doping of the second conductivity type can be removed from above the horizontal plane including the top surface of the topmost drain-select-level insulating layer 132T by a planarization process, which can employ a recess etch and/or chemical mechanical planarization process. Each remaining portion of the doped semiconductor material having a doping of the first conductivity type constitutes a drain-select-level semiconductor channel portion 603. Each remaining portion of the doped semiconductor material having a doping of the second conductivity type constitutes a drain region 63. Atomic concentration of dopants of the second conductivity type in the drain regions 63 can be in a range from $5.0 \times 10^{19}/cm^3$ to $2.0 \times 10^{21}/cm^3$, although lesser and greater atomic concentrations can also be employed.

The set of all components that fill a drain-select-level opening 149 is herein referred to as a drain-select-level structure (150, 603, 162, 63). Each drain-select-level structure (150, 603, 162, 63) includes a gate dielectric, i.e., a drain-select-level gate dielectric 150, and a drain-select-level semiconductor channel portion 603. Each drain-selectlevel structure (150, 603, 162, 63) is formed on each of the memory stack structures 55 through portions of the drain-select-level sacrificial material layers 242. A subset of the drain-select-level structures (150, 603, 162, 63) is formed directly on the drain-select-level sacrificial line structures 173. The drain-select-level structures (150, 603, 162, 63) can contact convex sidewalls of the drain-select-level sacrificial line structures 173 upon formation of the drain-select-level structures (150, 603, 162, 63).

Each contiguous set of a word-line-level semiconductor channel portion 601, a connection channel portion 602, and a drain-select-level semiconductor channel portion 603 constitutes a vertical semiconductor channel 60. Each contiguous set of a vertical semiconductor channel 60 and a memory film 50 constitutes a memory stack structure 55 including a vertical stack of memory elements configured to store electrical charges therein. The memory stack structures 55 can be formed in the multiple parallel rows of openings, each of which includes a stack of a word-line-level opening and a drain-select-level opening. The memory stack structures 55 extend through the alternating stack (32, 46) of the insulating layers 32 and the word-line-level electrically conductive layers 46, the drain-select-level sacrificial material layers 242, and the drain-select-level sacrificial line structures 173. Each of the drain-select-level sacrificial line structures 173 can be patterned to include a respective pair of laterally alternating sequences of planar vertical sidewall segments and concave vertical sidewall segments during formation of the memory stack structures 55.

Figure 37A:
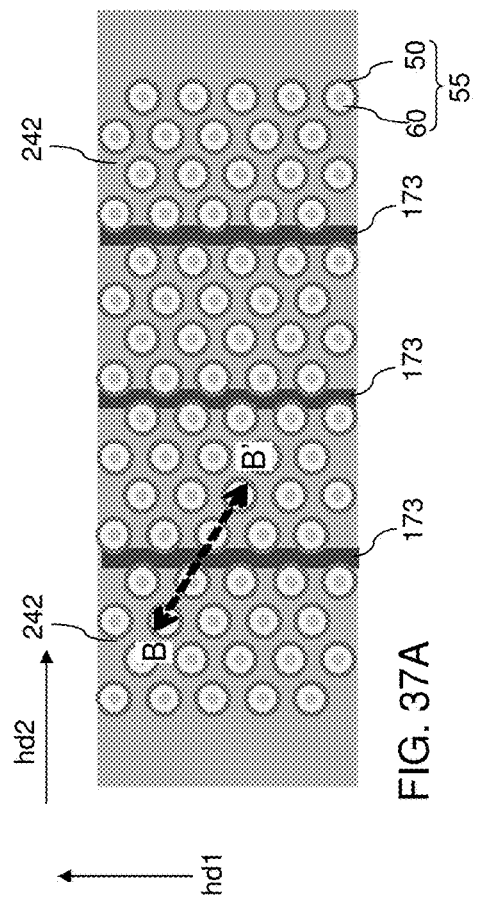
FIG. 37A is a horizontal cross-sectional view of the third exemplary structure after formation of a first dielectric cap layer according to the third embodiment of the present disclosure.
Figure 37B:
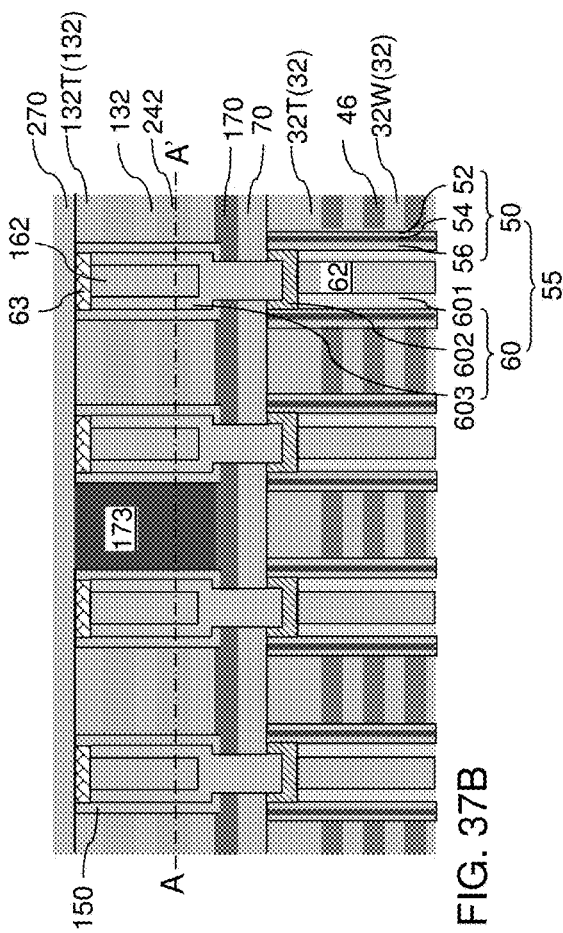
FIG. 37B is a vertical cross-sectional view of the third exemplary structure along the vertical plane B-B' of FIG. 37A. The horizontal plane B-B' is the plane of the horizontal cross-sectional view of FIG. 37A.

Referring to FIGS. 37A and 37B, a first dielectric cap layer 270 can be formed over the drain-select-level alternating stack (132, 242) and the drain-select-level structures (150, 603, 162, 63). The first dielectric cap layer 270 can include a dielectric material such as silicon oxide, and can have a thickness in a range from 20 nm to 200 nm, although lesser and greater thicknesses can also be employed.

Figure 38A:
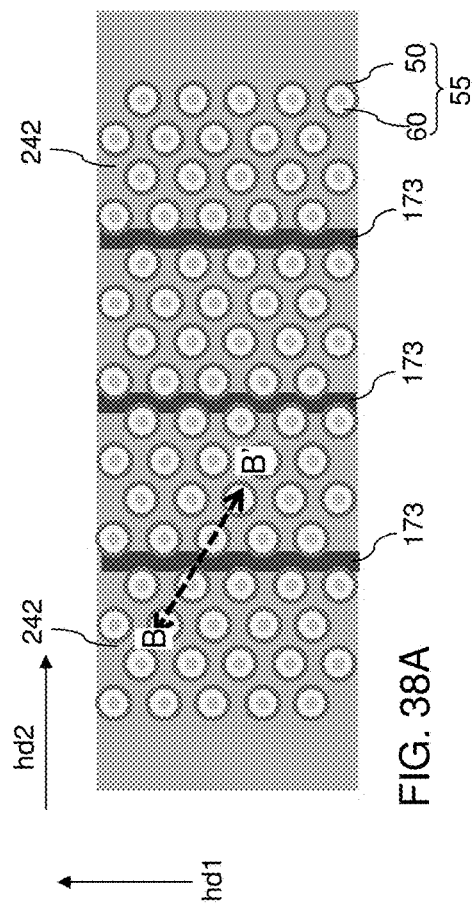
FIG. 38A is a horizontal cross-sectional view of the third exemplary structure after formation of openings through the first dielectric cap layer according to the third embodiment of the present disclosure.
Figure 38B:
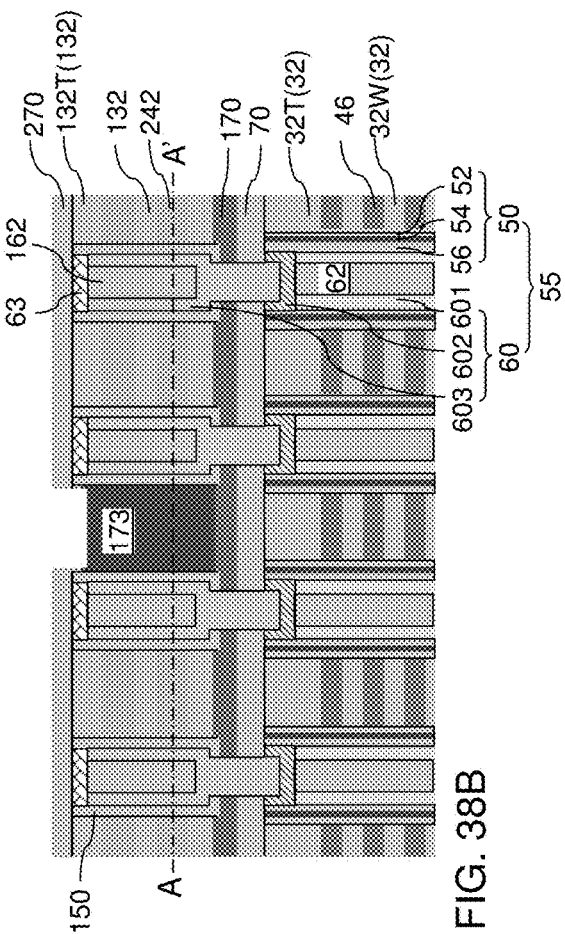
FIG. 38B is a vertical cross-sectional view of the third exemplary structure along the vertical plane B-B' of FIG. 38A. The horizontal plane B-B' is the plane of the horizontal cross-sectional view of FIG. 38A.

Referring to FIGS. 38A and 38B, a photoresist layer (not shown) can be applied over the first dielectric cap layer 270, and can be lithographically patterned to form openings in areas that overlie the drain-select-level sacrificial line structures 173. In one embodiment, the photoresist layer may be patterned to form openings outside the areas of the drain regions 63 so that the drain regions 63 are not physically exposed after formation of openings through the photoresist layer. An etch process such as an anisotropic etch process can be performed to transfer the pattern of the openings in the photoresist layer through the first dielectric cap layer 270. Openings are formed through the first dielectric cap layer 270, and the top surface of each drain-select-level sacrificial line structure 173 can be physically exposed within the openings through the first dielectric cap layer 270.

Figure 39A:
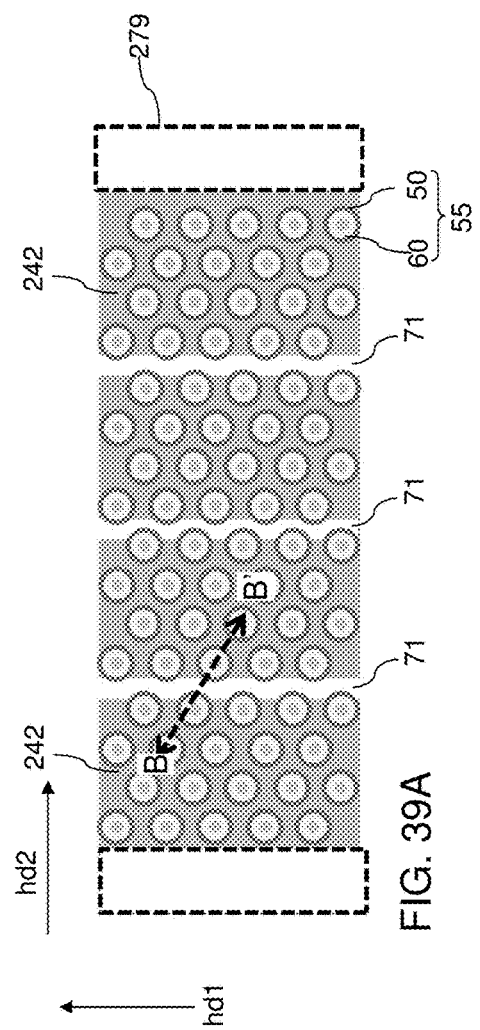
FIG. 39A is a horizontal cross-sectional view of the third exemplary structure after formation of drain-select-level divider trenches and drain-select-level isolation trenches according to the third embodiment of the present disclosure.
Figure 39B:
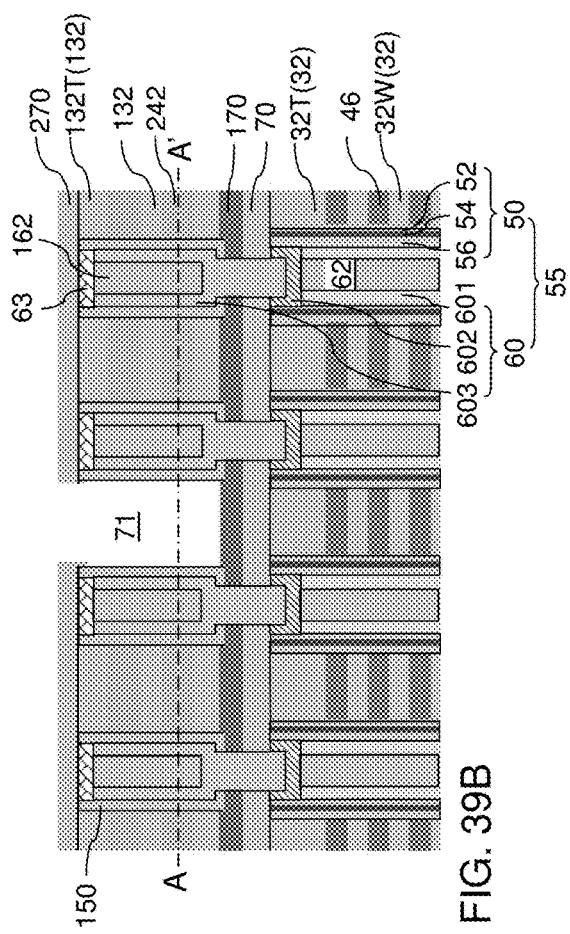
FIG. 39B is a vertical cross-sectional view of the third exemplary structure along the vertical plane B-B' of FIG. 38A. The horizontal plane B-B' is the plane of the horizontal cross-sectional view of FIG. 38A.

Referring to FIGS. 39A and 39B, the drain-select-level sacrificial line structure 173 can be removed selective to the drain-select-level insulating layers 132 by an isotropic etch process. For example, if the drain-select-level sacrificial line structure 173 includes silicon nitride and if the drain-select-level insulating layers 132 include silicon oxide, a wet etch process employing hot phosphoric acid may be performed to remove the drain-select-level sacrificial line structure 173 without removing the drain-select-level insulating layers 132. Drain-select-level isolation trenches 71 can be formed in volumes from which the drain-select-level sacrificial line structure 173 are removed.

A photoresist layer (not shown) can be applied over the third exemplary structure after, or prior to, removal of the drain-select-level sacrificial line structures 173. Rectangular openings having an areal overlap with a respective one of the dielectric divider structures 176 can be formed in the photoresist layer by lithographic exposure and development. The pattern in the photoresist layer can be transferred through the alternating stack of the drain-select-level insulating layers 132 and drain-select-level sacrificial material layers 242 employing an anisotropic etch process to form drain-select-level divider trenches 279. The etch stop dielectric layer 170 can be employed as an etch stop structure during the anisotropic etch process. Each drain-select-level divider trench 279 can have a pair of lengthwise sidewalls that laterally extend along the first horizontal direction hd1. In one embodiment, at least 50%, which can be at least 80%, of the area of each drain-select-level divider trench 279 can have an areal overlap with an underlying dielectric divider structure 176. The photoresist layer can be subsequently removed, for example, by ashing.

Figure 40A:
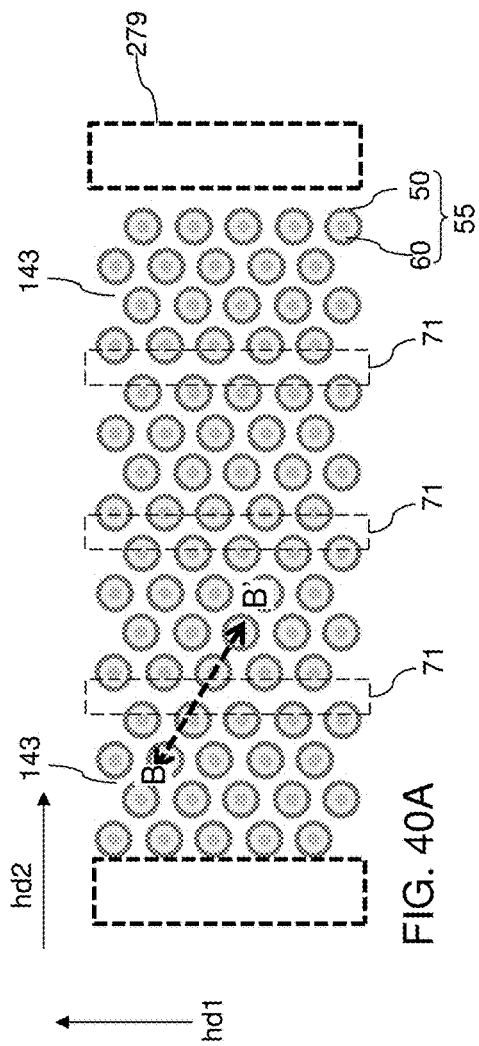
FIG. 40A is a horizontal cross-sectional view of the third exemplary structure after formation of drain-select-level backside recesses by removal of the drain-select-level sacrificial material layers and according to the third embodiment of the present disclosure.
Figure 40B:
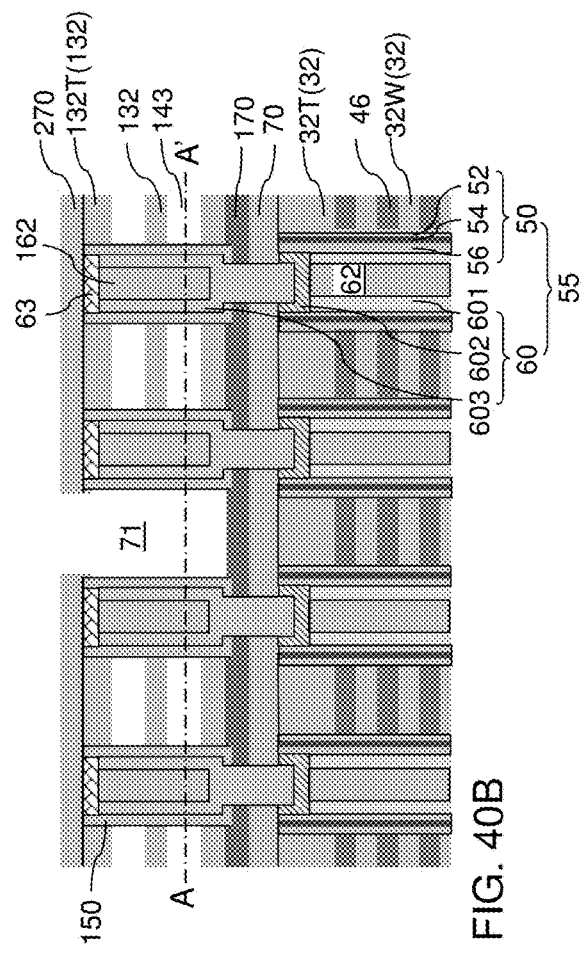
FIG. 40B is a vertical cross-sectional view of the third exemplary structure along the vertical plane B-B' of FIG. 40A. The horizontal plane B-B' is the plane of the horizontal cross-sectional view of FIG. 40A.

Referring to FIGS. 40A and 40B, the drain-select-level sacrificial material layers 242 are removed by a selective etch process that etches the material of the drain-select-level sacrificial material layers 242 without etching the materials of the drain-select-level insulating layers 132, the first dielectric cap layer 270, or the dielectric etch stop material layer 170. For example, if the drain-select-level sacrificial material layers 242 include amorphous silicon and if the drain-select-level insulating layers 132 and the first dielectric cap layer 270 include silicon oxide materials, the drain-select-level sacrificial material layers 242 can be removed by a wet etch process employing hot trimethyl-2 hydroxyethyl ammonium hydroxide ("hot TMY"), tetramethyl ammonium hydroxide (TMAH), or ammonium hydroxide provided into the drain-select-level isolation trenches 71 and the drain-select-level divider trenches 279. Drain-select-level backside recesses 143 are formed in volumes from which the drain-select-level sacrificial material layers 242 are removed through the drain-select-level isolation trenches 71 and the drain-select-level divider trenches 279. The drain-select-level backside recesses 143 can be adjoined to a neighboring pair of trenches of the plurality of the drain-select-level isolation trenches 71 and the drain-select-level divider trenches 279.

Figure 41A:
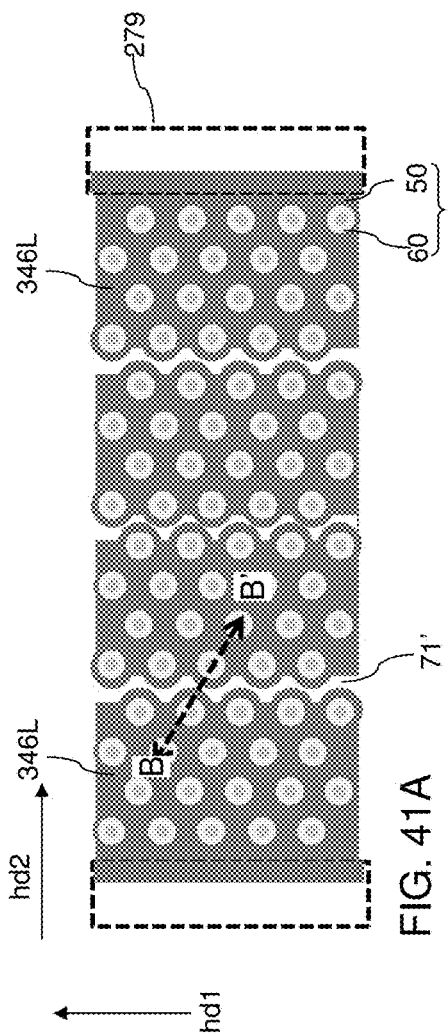
FIG. 41A is a horizontal cross-sectional view of the third exemplary structure after deposition of a conductive material in the drain-select-level backside recesses according to the third embodiment of the present disclosure.
Figure 41B:
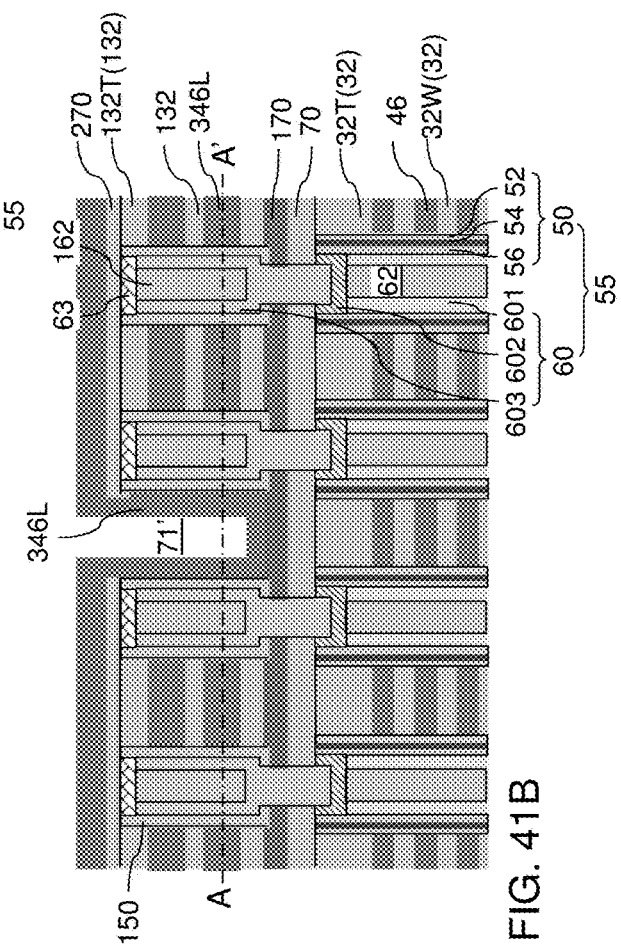
FIG. 41B is a vertical cross-sectional view of the third exemplary structure along the vertical plane B-B' of FIG. 41A. The horizontal plane B-B' is the plane of the horizontal cross-sectional view of FIG. 41A.

Referring to FIGS. 41A and 41B, at least one metallic fill material can be simultaneously deposited in the drain-select-level backside recesses 143 through the drain-select-level isolation trenches 71 and the drain-select-level divider trenches 279, and peripheral portions of the drain-select-level isolation trenches 71 and the drain-select-level divider trenches 279 by at least one conformal deposition process. The at least one metallic fill material can include, for example, a metallic barrier liner including a conducive metal nitride material (such as TiN, TaN, or WN) and a metal fill material such as tungsten, cobalt, molybdenum, and/or ruthenium. The thickness(es) of the at least one metallic material can be selected such that the drain-select-level isolation trenches 71 and the drain-select-level divider trenches 279 are not completely filled with the at least one metallic fill material. A continuous conductive material layer 346L can be formed within each of the drain-select-level backside recesses 143, at peripheral regions of the drain-select-level isolation trenches 71 and the drain-select-level divider trenches 279, and over the first dielectric cap layer 270. A drain-select-level cavity 71' can be formed within the unfilled volume of each drain-select-level isolation trench 71.

Referring to FIGS. 42A and 42B, an anisotropic etch process is performed to remove horizontal portions of the continuous conductive material layer 346L from above the first dielectric cap layer 270 and from the bottom regions of the drain-select-level isolation trenches 71 and the drain-select-level divider trenches 279. Each remaining portion of the at least one metallic fill material filling the drain-select-level backside recesses 143 constitute a drain-select-level electrically conductive layer 346H. Each remaining vertical portion of the at least one metallic fill material adjoined to a respective set of drain-select-level electrically conductive layers 346H constitutes a vertical connection portion 346V.

Each drain-select-level electrode 346 can be a multi-level drain select electrode 346 including multiple drain-select-level electrically conductive layer 346H located at multiple drain select levels. Each multi-level drain select electrode 346 can include a respective vertical connection portion 346V contacting and electrically connected to a respective set of drain-select-level electrically conductive layers 346H located within volumes of the drain-select-level backside recesses. The vertical connection portion 346V can be located within a drain-select-level isolation trench 71. Each contiguous set of at least one vertical connection portion 346V and drain-select-level electrically conductive layers 346H constitute a multi-level drain-select-level electrode 346. In one embodiment, a multi-level drain-select-level electrode 346 can include two vertical connection portions 346V adjoined to two or more drain-select-level electrically conductive layers 346H.

A drain-select-level cavity 71' that generally extends along the first horizontal direction hd1 can be located within each drain-select-level isolation trench 71. Each drain-select-level electrically conductive layer 346H at a drain select level can be formed in multiple portions that are laterally spaced apart by the drain-select-level cavities 71' and unfilled portions of the drain-select-level divider trenches 279. Each drain-select-level electrically conductive layer 346H can be formed in volumes from which a respective drain-select-level sacrificial material layer 242 is removed.

Referring to FIGS. 43A-43F, a second dielectric material can be deposited over the first dielectric cap layer 270 and in the drain-select-level cavities 71' and unfilled portions of the drain-select-level divider trenches 279 to form a second dielectric cap layer 280. Each portion of the second dielectric cap layer 280 that fills a respective drain-select-level cavity 71' is herein referred to as a drain-select-level isolation structure 280S. Thus, the drain-select-level isolation structures 280S are formed within volumes from which the remaining portions of the drain-select-level sacrificial line structures 73 are removed. Each portion of the second dielectric cap layer 280 that fills a remaining volume of a respective drain-select-level divider trenches 279 is herein referred to as a drain-select-level divider structure 276. Thus, the drain-select-level divider structures 276 are formed within volumes at the levels of the drain-select-level insulating layers 132 and the drain-select-level electrically conductive layers 346H over a respective one of the dielectric divider structures 176.

A drain-select-level isolation structure 280S is formed within each remaining volume of the drain-select-level isolation trenches 71 after formation of the multi-level drain select electrodes 346. A drain-select-level divider structure 276 can laterally contact a pair of multi-level drain select electrodes 346 of the plurality of the multi-level drain select electrodes 346, and can be formed above a respective dielectric divider structure 176 within an area having at least partial overlap with the area of the dielectric divider structure 176.

In one embodiment, each drain-select-level electrode 346 can include a metallic barrier liner 346A that continuously extends from a bottommost surface of the drain-select-level electrode 346 to a topmost surface of the drain-select-level electrode 346. For example, the metallic barrier liner 346A of each drain-select-level electrode 346 can continuously extend from a bottom surface of a vertical connection portion 346V that contacts a recessed horizontal surface of the topmost insulating layer 32T to a top surface of the vertical connection portion 346V that contacts a stepped surface of a drain-select-level isolation structure 280S.

Each drain-select-level electrode 346 can include a metallic fill material portion 346B that consists essentially of an elemental metal or an intermetallic alloy. The metallic fill material portion 346B can contact a non-vertical surface NVS (such as a horizontal stepped surface) of a drain-select-level isolation structure 280S, for example, at the topmost surface located at a top end of the vertical connection portion 346V. The non-vertical surface NVS adjoins a bottom edge of a vertical surface VS1 of the drain-select-level isolation structure 280S and adjoins a top edge of a vertical surface VS2 of the drain-select-level isolation structure 280S.

Referring to all drawings of the third exemplary structure, the third exemplary structure can include a three-dimensional memory device. The three-dimensional memory device can include: an alternating stack of insulating layers 32 and word-line-level electrically conductive layers 46 located over a substrate (9, 10); a plurality of multi-level drain select electrodes 346 comprising a respective vertical connection portion 346V contacting and electrically connected to a respective set of drain-select-level electrically conductive layers 346H that are vertically spaced apart among one another and located over the alternating stack (32, 46); memory stack structures 55 comprising a respective vertical semiconductor channel 60 laterally surrounded by a respective memory film 50 extending through the alternating stack (32, 46), and laterally surrounded by a respective gate dielectric 150 extending through a respective one of the multi-level drain select electrodes 346; and a drain-select-level isolation structure 280S overlying the alternating stack (32, 46), laterally extending along a first horizontal direction hd1 and located between a neighboring pair of the multi-level drain select electrodes 346, and including a pair of sidewalls that include a respective set of concave vertical sidewall segments, wherein each of the multi-level drain select electrodes 346 contacts a sidewall of a subset of the gate dielectrics 150.

In one embodiment, the upper portion of each of the memory stack structures 55 containing an upper portion of the semiconductor channel 60 and the gate dielectric 150 is completely surrounded by a respective one of the plurality of multi-level drain select electrodes 346.

In one embodiment, each vertical semiconductor channel 60 comprises: a word-line-level semiconductor channel portion 601 vertically extending through each of the word-line-level electrically conductive layers 46; and a drain-select-level semiconductor channel portion 603 vertically extending through each level of the drain-select-level electrically conductive layers 346H and electrically connected to an upper portion of the word-line-level semiconductor channel portion 601. In one embodiment, each vertical semiconductor channel 60 comprises a connection channel portion 602 contacting a top end of the word-line-level semiconductor channel portion 601 and a bottom end of the drain-select-level semiconductor channel portion 603 and laterally surrounded by a respective one of the memory films 50.

In one embodiment, the three-dimensional memory device comprises: an insulating cap layer 70 located over the alternating stack (32, 46) and underlying the multi-level drain select electrodes 346; and an etch stop dielectric layer 170 comprising a material different from the insulating cap layer, overlying the insulating cap layer 70 and underlying the multi-level drain select electrodes 346, wherein the drain-select-level semiconductor channel portion 603 vertically extends through the insulating cap layer 70 and the etch stop dielectric layer 170.

In one embodiment, each multi-level drain select electrode 346 comprises a metallic barrier layer 346A and a metallic fill material portion 346B. The metallic barrier layer 346A contacts a subset of the gate dielectrics 150. In one embodiment, each vertical connection portion 346V of the multi-level drain select electrodes 346 comprises a sidewall including concave vertical sidewall segments. The concave vertical sidewall segments may be adjoined to each another, or may be adjoined through planar vertical sidewall segments.

In one embodiment, each vertical connection portion 346V of the multi-level drain select electrodes 346 has a greater vertical extent than a vertical distance between a horizontal plane including a topmost surface of the drain-select-level electrically conductive layers 346H and a horizontal plane including a bottommost surface of the drain-select-level electrically conductive layers 346H.

Figure 43C:
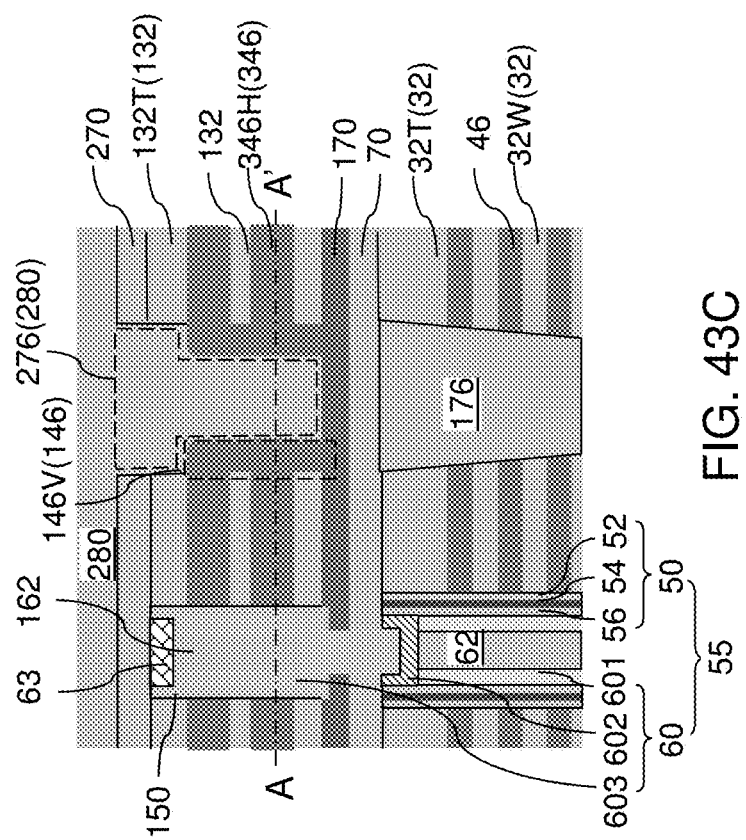
FIG. 43C is a vertical cross-sectional view of the third exemplary structure along the vertical plane C-C' of FIG. 43A.
Figure 43D:
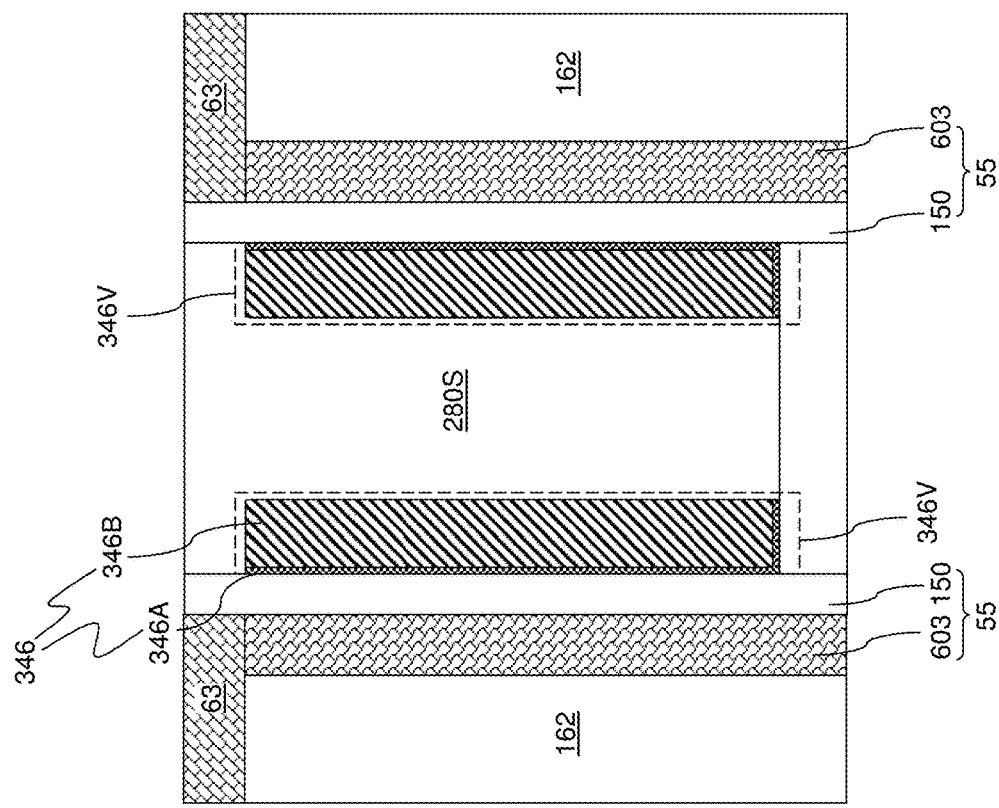
FIG. 43D is a magnified view of a region of the vertical cross-sectional view of FIG. 43B.

In one embodiment, the vertical connection portions 346V of the multi-level drain select electrodes 346 contact first areas of sidewalls of a subset of the gate dielectrics 150 (as illustrated in FIG. 43D); and the drain-select-level electrically conductive layers 346H contact second areas of the sidewalls of the subset of the gate dielectrics 150 (as illustrated in FIG. 43F).

In one embodiment, each of the vertical connection portions 346V comprises: a laterally alternating sequence of planar vertical inner sidewall segments (that contact sidewalls of the drain-select-level insulating layers 132) and concave vertical inner sidewall segments that contact a respective gate dielectric 150; and a laterally alternating sequence of planar vertical outer sidewall segments and convex vertical outer sidewall segments that contact a sidewall of the respective one of the drain-select-level isolation structures 280S.

In one embodiment, the three-dimensional memory device comprises drain-select-level insulating layers 132 located between each vertically neighboring pair of the plurality of the drain-select-level electrically conductive layers 346H.

Figure 43E:
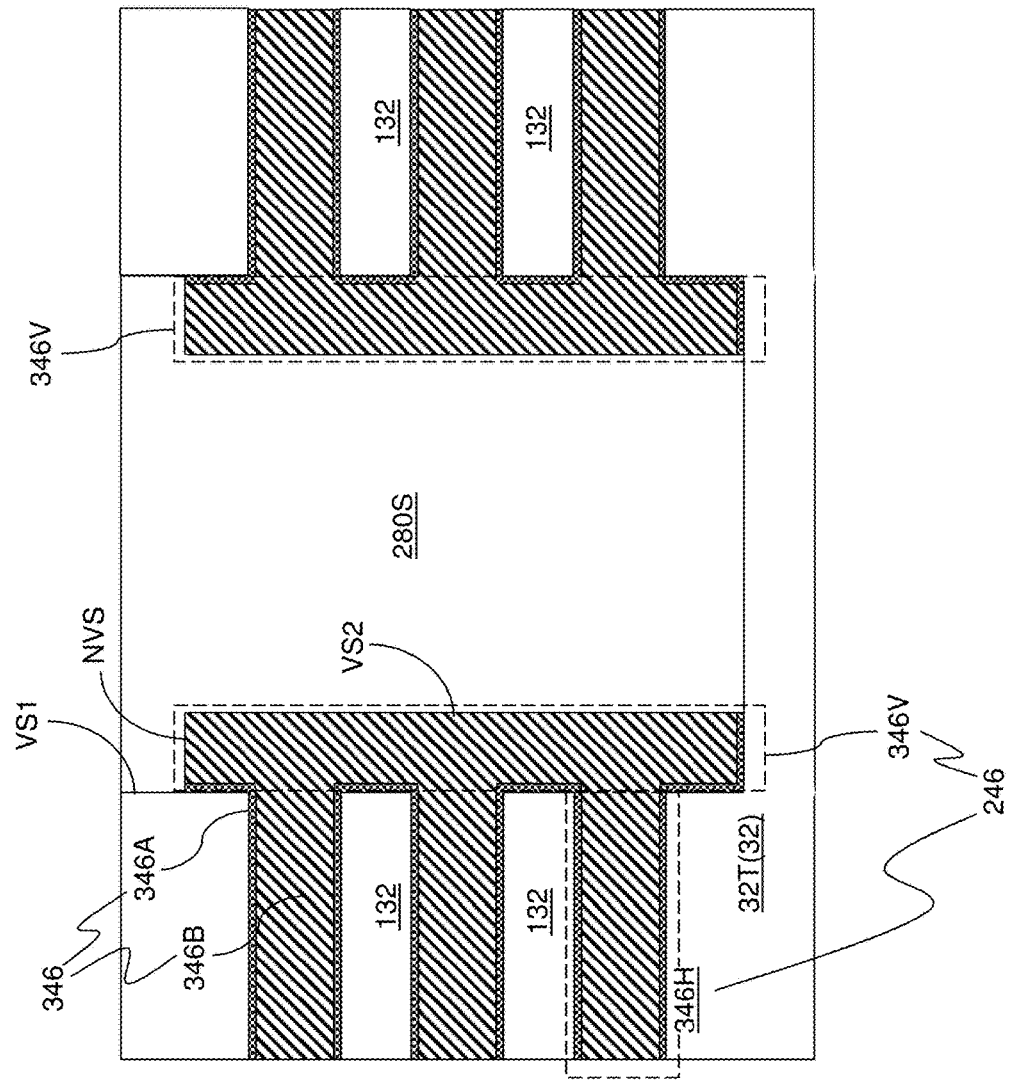
FIG. 43E is a vertical cross-sectional view of the third exemplary structure along the vertical plane E-E' of FIG. 43A.

In one embodiment, the metallic fill material portion 346B contacts a non-vertical surface NVS of the drain-select-level isolation structure 280S, wherein the non-vertical surface NVS adjoins a bottom edge of a first vertical surface VS1 of the drain-select-level isolation structure 280S and adjoins a top edge of a second vertical surface VS2 of the drain-select-level isolation structure 280S, as illustrated in FIG. 43E.

Figure 44A:
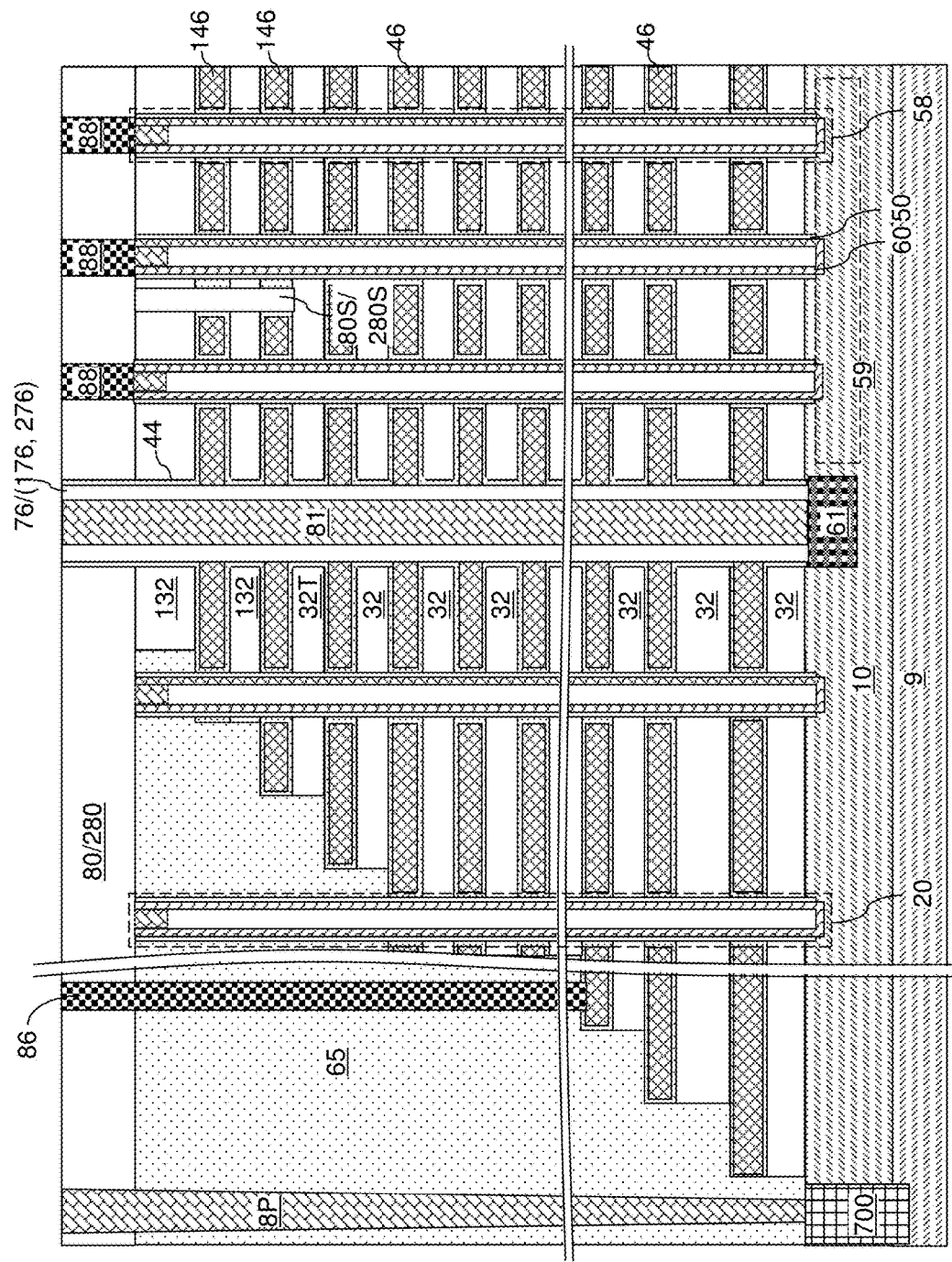
FIG. 44A is a vertical cross-sectional view of a configuration for the first, second, and third exemplary structures for providing electrical contacts to various components therein.
Figure 44B:
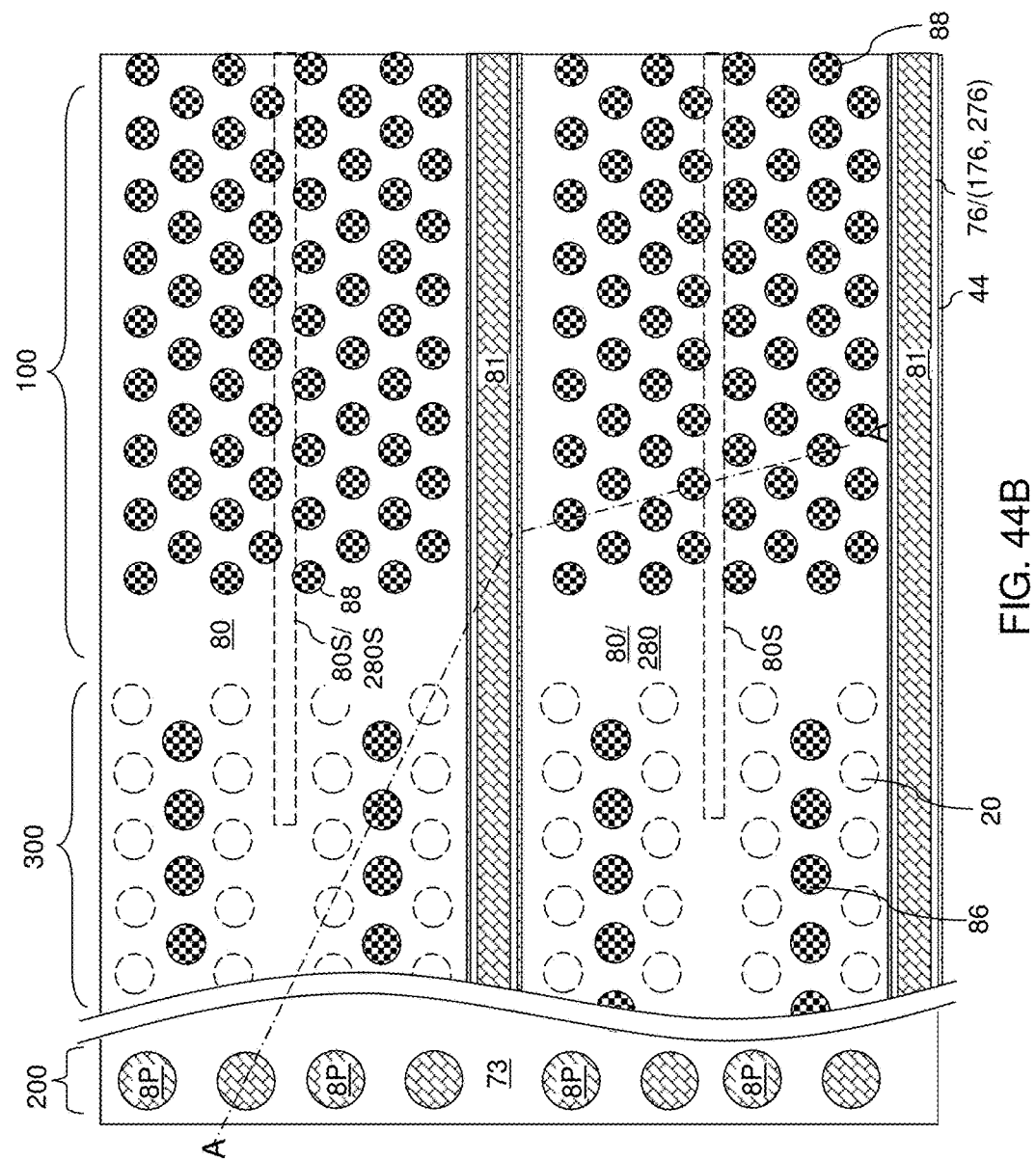
FIG. 44B is a see-through top-down view of the exemplary structure of FIG. 44A.

Referring to FIGS. 44A and 44B, each of the first, second, and third exemplary structures illustrated in FIGS. 15A-15D, 27A-27E, and 43A-43F can be suitably wired by forming various contact via structures and additional interconnect-level dielectric material layers. For example, drain contact via structures 88 are formed on a top surface of a respective one of the drain regions 63. Staircase-region contact via structures 86 are formed in the staircase-region contact via cavities and on a top surface of a respective one of the various electrically conductive layers (46, 146, 246, 346, 446). The staircase-region contact via structures 86 can include drain select level contact via structures that contact the multi-level drain select electrodes (146, 246, 346, 446). Further, the staircase-region contact via structures 86 can include word line contact via structures that contact the word-line-level electrically conductive layers 46 that function as word lines for the memory stack structures 55. Peripheral-region contact via structures 8P can be formed in the peripheral device region 200. In one embodiment, a source region 61 may be formed underneath each backside trench 79 prior to formation of the dielectric divider structures 76. In this case, a surface portion of the semiconductor material layer 10 can function as a horizontal semiconductor channel 59. The dielectric divider structures 76 can be formed in a tubular configuration, and a source contact via structure 81 can be formed within each dielectric divider structure 76. Support pillar structures 20 including a same set of structural components as a memory opening fill structure 58 can be formed in the contact region 300. The support pillar structures 20 are electrically inactive components that provide structural support while word-line-level backside recesses 43 are present.

Figure 45:
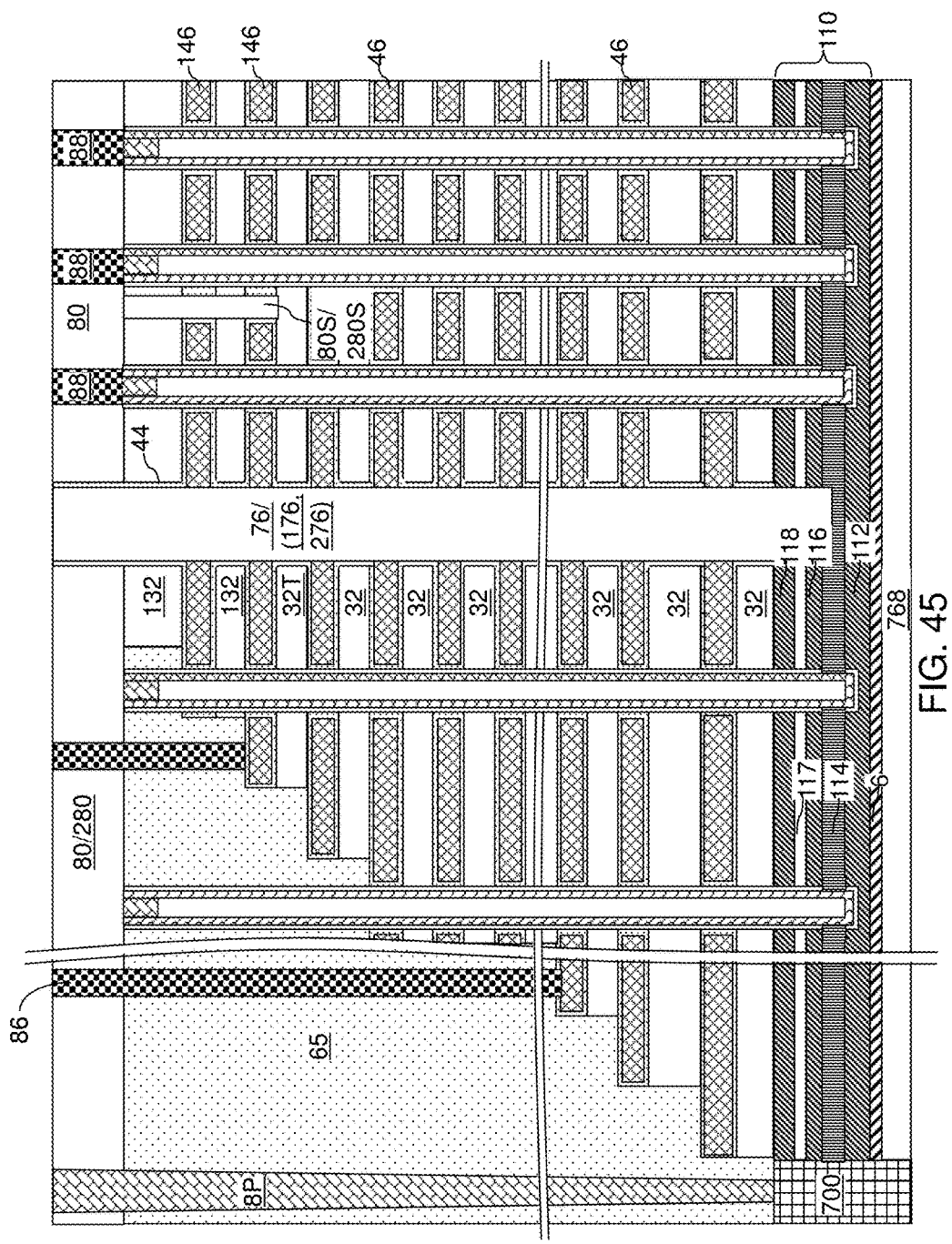
FIG. 45 is a vertical cross-sectional view of another configuration for the first, second, and third exemplary structures for providing electrical contacts to various components therein.

Referring to FIG. 45, an alternative configuration of the first, second, and third exemplary structures is illustrated, which includes a stack of a planar insulating spacer layer 768, a planar conductive material layer 6 (which can comprise a metallic plate), and source-level material layers 110 in lieu of a semiconductor material layer 10. In this case, buried source strap connections are formed between the vertical semiconductor channels 60 and a source contact layer 114 within the source-level material layers 110. In one embodiment, the source-level material layers 110 can include, from bottom to top, a lower source-level material layer 112, the source contact layer 114, an upper source-level material layer 116, a source-level insulating layer 117, and an optional source-select-level conductive layer 118. In this case, the source contact layer 114 can function as a source region for the vertical semiconductor channels 60.

Each of the exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of a word-line-level electrically conductive layer 46) in a first device level of the array of monolithic three-dimensional NAND strings can be located over another memory cell (as embodied as another portion of the charge storage layer 54 at a level of another word-line-level electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The word-line-level electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion of each of the plurality of semiconductor channels (59, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and word-line-level electrically conductive layers located over a substrate;
   a plurality of multi-level drain side select gate electrodes, each comprising a respective vertical connection portion and a respective set of drain-side-select-level electrically conductive layers that are vertically spaced apart among one another and are located over the alternating stack, wherein the respective vertical connection portion contacts, and is electrically connected, to the respective set of drain-side-select-level electrically conductive layers;
   memory stack structures comprising a respective vertical semiconductor channel and a respective memory film, wherein each memory film has a respective sidewall that extends through the alternating stack and each level of the plurality of multi-level drain side select gate electrodes; and
   a first drain-side-select-level isolation structure overlying the alternating stack, laterally extending along a first horizontal direction and located between a neighboring pair of the plurality of multi-level drain side select gate electrodes, and including a pair of sidewalls that include a respective set of concave vertical sidewall segments,
   wherein:
      at least one multi-level drain side select gate electrode of the plurality of multi-level drain side select gate electrodes contacts a sidewall of the first drain-side-select-level isolation structure; the multi-level drain side select gate electrode comprises a metallic barrier layer and a metallic fill material portion;
      an upper portion of some of the memory stack structures is surrounded by a respective one of the plurality of multi-level drain side select gate electrodes;
      each vertical connection portion of the multi-level drain side select gate electrodes comprises a sidewall including concave vertical sidewall segments located between a pair of the memory stack structures;
      the three-dimensional memory device comprises a dielectric divider structure including a pair of straight sidewalls that laterally extend along the first horizontal direction and vertically extending through the alternating stack;
      the dielectric divider structure is laterally spaced from the first drain-side-select-level isolation structures; and
      the three-dimensional memory device comprises a vertical metallic spacer contacting a sidewall of the dielectric divider structure and a second drain-side-select-level isolation structure laterally spaced from the first drain-side-select-level isolation structure.

2. The three-dimensional memory device of claim 1, wherein the vertical metallic spacer comprises:
   an additional metallic barrier layer having a same composition and a same thickness as the metallic barrier layer of the plurality of multi-level drain side select gate electrodes; and
   an additional metallic fill material portion having a same composition as the metallic fill material portion of the plurality of multi-level drain side select gate electrodes.

3. The three-dimensional memory device of claim 1, wherein the second drain-side-select-level isolation structure overlies the alternating stack, laterally extends along a first horizontal direction, and includes a sidewall including a set of concave vertical sidewall segments on one side and a vertical sidewall that laterally extends along the first horizontal direction and contacts the vertical metallic spacer on another side.

* * * * *